(12) United States Patent
Tanaka

(10) Patent No.: US 12,066,731 B2
(45) Date of Patent: Aug. 20, 2024

(54) THIN FILM TRANSISTOR

(71) Applicant: Mikuni Electron Corporation, Saitama (JP)

(72) Inventor: Sakae Tanaka, Saitama (JP)

(73) Assignee: MIKUNI ELECTRON CORPORATION, Saitama (JP)

( * ) Notice: Subject to any disclaimer, the term of this patent is extended or adjusted under 35 U.S.C. 154(b) by 0 days.

(21) Appl. No.: 18/299,101

(22) Filed: Apr. 12, 2023

(65) Prior Publication Data

US 2023/0251540 A1  Aug. 10, 2023

Related U.S. Application Data

(63) Continuation of application No. 17/163,939, filed on Feb. 1, 2021, now Pat. No. 11,630,360.

(30) Foreign Application Priority Data

Feb. 5, 2020 (JP) .................................. 2020-018120

(51) Int. Cl.
  *G02F 1/1368* (2006.01)
  *G02F 1/1339* (2006.01)
  (Continued)

(52) U.S. Cl.
  CPC .......... *G02F 1/1368* (2013.01); *G02F 1/1339* (2013.01); *G02F 1/134309* (2013.01);
  (Continued)

(58) Field of Classification Search
  CPC ................. G02F 1/1368; G02F 1/1339; G02F 1/134309; G02F 1/1345; H01L 27/1225; H01L 27/1244; H01L 29/7869
  (Continued)

(56) References Cited

U.S. PATENT DOCUMENTS

| | | |
|---|---|---|
| 5,245,450 A | 9/1993 | Ukai et al. |
| 6,037,718 A | 3/2000 | Nagami |
| | (Continued) | |

FOREIGN PATENT DOCUMENTS

| | | |
|---|---|---|
| CN | 101165906 A | 4/2008 |
| CN | 101336491 A | 12/2008 |
| | (Continued) | |

OTHER PUBLICATIONS

Japanese Notice of Allowance issued in Japanese Patent Application No. 2022-190674 dated Aug. 29, 2023.

(Continued)

*Primary Examiner* — Charles S Chang
(74) *Attorney, Agent, or Firm* — PEARNE & GORDON LLP

(57) ABSTRACT

A liquid crystal display device includes a transistor, a pixel electrode, and a common electrode. The transistor includes a first gate electrode on a first substrate, a second gate electrode having a region overlapping the first gate electrode, an oxide semiconductor layer between the first gate electrode and the second gate electrode, a first insulating layer between the first gate electrode and the oxide semiconductor layer, a second insulating layer between the oxide semiconductor layer and the second gate electrode, and a first oxide conductive layer and a second oxide conductive layer disposed between the first insulating layer and the oxide semiconductor layer and disposed with the first gate electrode and the second gate electrode sandwiched from both sides. The pixel electrode is disposed between the first and the second insulating layer; the common electrode is disposed a region overlapping with the pixel electrode and on the second insulating layer.

16 Claims, 78 Drawing Sheets

(51) Int. Cl.
  *G02F 1/1343* (2006.01)
  *G02F 1/1345* (2006.01)
  *H01L 27/12* (2006.01)
  *H01L 29/786* (2006.01)

(52) U.S. Cl.
  CPC ........ *G02F 1/13439* (2013.01); *G02F 1/1345* (2013.01); *H01L 27/1225* (2013.01); *H01L 27/1244* (2013.01); *H01L 29/78648* (2013.01); *H01L 29/7869* (2013.01)

(58) Field of Classification Search
  USPC .................................................... 349/42–46
  See application file for complete search history.

(56) References Cited

U.S. PATENT DOCUMENTS

| | | | |
|---|---|---|---|
| 6,730,970 | B1 | 5/2004 | Katoh et al. |
| 8,344,387 | B2 | 1/2013 | Akimoto et al. |
| 8,421,068 | B2 | 4/2013 | Yamazaki et al. |
| 8,427,607 | B2 | 4/2013 | Lee et al. |
| 8,598,610 | B2 | 12/2013 | Oda |
| 8,816,380 | B2 | 8/2014 | Oda |
| 9,899,420 | B2 | 2/2018 | Yamazaki et al. |
| 10,020,374 | B2 | 7/2018 | Sone et al. |
| 10,074,709 | B1 | 9/2018 | Tanaka |
| 10,141,343 | B2 | 11/2018 | Ito et al. |
| 10,141,384 | B2 | 11/2018 | Takata |
| 10,158,005 | B2 | 12/2018 | Akimoto et al. |
| 10,326,008 | B2 | 6/2019 | Kimura |
| 10,388,520 | B2 | 8/2019 | Yamazaki et al. |
| 10,418,384 | B2 | 9/2019 | Yamazaki et al. |
| 10,615,233 | B2 | 4/2020 | Muccini et al. |
| 11,233,132 | B2 | 1/2022 | Kimura |
| 11,239,449 | B2 | 2/2022 | Tanaka |
| 2001/0002857 | A1 | 6/2001 | Shimada et al. |
| 2002/0020875 | A1 | 2/2002 | Arao et al. |
| 2002/0089616 | A1 | 7/2002 | Hashimoto et al. |
| 2002/0093600 | A1 | 7/2002 | Chol |
| 2002/0149722 | A1 | 10/2002 | Anno et al. |
| 2002/0167280 | A1 | 11/2002 | Hayashi et al. |
| 2003/0137242 | A1 | 7/2003 | Seki |
| 2003/0184699 | A1 | 10/2003 | Matsumoto et al. |
| 2003/0197666 | A1 | 10/2003 | Akimoto et al. |
| 2004/0095168 | A1 | 5/2004 | Miyazawa |
| 2004/0222429 | A1 | 11/2004 | Yamazaki et al. |
| 2004/0227891 | A1 | 11/2004 | Hirota |
| 2005/0018114 | A1 | 1/2005 | Park et al. |
| 2005/0199880 | A1 | 9/2005 | Hoffman et al. |
| 2007/0069202 | A1 | 3/2007 | Choi et al. |
| 2007/0126671 | A1 | 6/2007 | Naoaki |
| 2007/0269936 | A1 | 11/2007 | Tanaka et al. |
| 2008/0122341 | A1 | 5/2008 | Orita et al. |
| 2009/0135105 | A1 | 5/2009 | Nakamura et al. |
| 2009/0140955 | A1 | 6/2009 | Nakamura et al. |
| 2009/0179195 | A1 | 7/2009 | Obata et al. |
| 2009/0179208 | A1 | 7/2009 | Obata et al. |
| 2009/0189161 | A1 | 7/2009 | Honda |
| 2009/0206332 | A1 | 8/2009 | Son et al. |
| 2009/0315043 | A1 | 12/2009 | Nakamura et al. |
| 2010/0102313 | A1 | 4/2010 | Miyairi et al. |
| 2010/0193782 | A1 | 8/2010 | Sakata |
| 2010/0200851 | A1 | 8/2010 | Oikawa et al. |
| 2010/0224878 | A1 | 9/2010 | Kimura |
| 2010/0224880 | A1 | 9/2010 | Kimura |
| 2010/0244020 | A1 | 9/2010 | Sakata et al. |
| 2010/0244031 | A1 | 9/2010 | Akimoto et al. |
| 2010/0244710 | A1 | 9/2010 | Obata et al. |
| 2010/0279474 | A1 | 11/2010 | Akimoto et al. |
| 2010/0301383 | A1 | 12/2010 | Shitagaki et al. |
| 2011/0024740 | A1 | 2/2011 | Yamazaki et al. |
| 2011/0031492 | A1 | 2/2011 | Yamazaki et al. |
| 2011/0031496 | A1 | 2/2011 | Yamazaki et al. |
| 2011/0090417 | A1 | 4/2011 | Kim et al. |
| 2011/0108835 | A1 | 5/2011 | Kim et al. |
| 2011/0127521 | A1 | 6/2011 | Yamazaki |
| 2011/0133178 | A1 | 6/2011 | Yamazaki et al. |
| 2011/0141076 | A1 | 6/2011 | Fukuhara et al. |
| 2011/0147738 | A1 | 6/2011 | Yamazaki et al. |
| 2011/0181349 | A1* | 7/2011 | Yamazaki ............. H01L 29/045 257/43 |
| 2011/0212570 | A1 | 9/2011 | Yamazaki et al. |
| 2011/0240987 | A1 | 10/2011 | Lee et al. |
| 2011/0240994 | A1 | 10/2011 | Yamazaki |
| 2011/0248258 | A1 | 10/2011 | Kim et al. |
| 2012/0007083 | A1 | 1/2012 | You et al. |
| 2012/0112200 | A1 | 5/2012 | Nagano |
| 2012/0138922 | A1 | 6/2012 | Yamazaki et al. |
| 2012/0146062 | A1 | 6/2012 | Oda |
| 2012/0146713 | A1 | 6/2012 | Kim et al. |
| 2012/0248451 | A1 | 10/2012 | Sone et al. |
| 2012/0313903 | A1 | 12/2012 | Pyon et al. |
| 2013/0001602 | A1 | 1/2013 | Park et al. |
| 2013/0240842 | A1 | 9/2013 | Rinzler et al. |
| 2013/0270552 | A1 | 10/2013 | Yamazaki et al. |
| 2013/0328045 | A1 | 12/2013 | Takata et al. |
| 2014/0111406 | A1 | 4/2014 | Wang et al. |
| 2014/0340608 | A1 | 11/2014 | Yamazaki et al. |
| 2015/0137103 | A1 | 5/2015 | Hosono et al. |
| 2015/0153599 | A1 | 6/2015 | Yamazaki et al. |
| 2015/0179802 | A1 | 6/2015 | Kim et al. |
| 2015/0221678 | A1 | 8/2015 | Yamazaki et al. |
| 2015/0228799 | A1 | 8/2015 | Koezuka et al. |
| 2016/0056214 | A1 | 2/2016 | Pyo et al. |
| 2016/0155858 | A1 | 6/2016 | Yoo et al. |
| 2016/0155980 | A1 | 6/2016 | Lee et al. |
| 2016/0218324 | A1 | 7/2016 | Kim et al. |
| 2016/0284854 | A1 | 9/2016 | Okazaki et al. |
| 2016/0285027 | A1 | 9/2016 | Hosono et al. |
| 2016/0300950 | A1 | 10/2016 | Lee et al. |
| 2016/0329388 | A1 | 11/2016 | Yokota et al. |
| 2016/0343868 | A1 | 11/2016 | Koezuka et al. |
| 2017/0098782 | A1 | 4/2017 | Choi et al. |
| 2017/0117705 | A1 | 4/2017 | Sekine et al. |
| 2017/0176826 | A1 | 6/2017 | Tsuda et al. |
| 2017/0186984 | A1 | 6/2017 | Hosono et al. |
| 2018/0122833 | A1 | 5/2018 | Lee et al. |
| 2018/0166585 | A1 | 6/2018 | Takechi |
| 2018/0301472 | A1 | 10/2018 | Matsukizono |
| 2019/0013333 | A1 | 1/2019 | Inoue et al. |
| 2020/0089064 | A1 | 3/2020 | Morinaga et al. |
| 2020/0098933 | A1* | 3/2020 | Tanaka ................... H01L 29/24 |
| 2020/0373430 | A1 | 11/2020 | Shima et al. |
| 2021/0012728 | A1 | 1/2021 | Shan |

FOREIGN PATENT DOCUMENTS

| | | |
|---|---|---|
| CN | 101847661 A | 9/2010 |
| CN | 101997007 A | 3/2011 |
| CN | 102782858 A | 11/2012 |
| CN | 105762196 A | 7/2016 |
| CN | 109637493 A | 4/2019 |
| CN | 110875437 A | 3/2020 |
| EP | 2634812 A1 | 9/2013 |
| EP | 3410490 A3 | 2/2019 |
| EP | 3618136 A2 | 3/2020 |
| JP | H09-152625 A | 6/1997 |
| JP | H09-269508 A | 10/1997 |
| JP | 2909266 B2 | 6/1999 |
| JP | H11-212493 A | 8/1999 |
| JP | 2001-144298 A | 5/2001 |
| JP | 2001-291583 A | 10/2001 |
| JP | 2002-033331 A | 1/2002 |
| JP | 2002-303877 A | 10/2002 |
| JP | 2002-311424 A | 10/2002 |
| JP | 2002-343578 A | 11/2002 |
| JP | 2003-005203 A | 1/2003 |
| JP | 2003-108034 A | 4/2003 |
| JP | 2003-295207 A | 10/2003 |
| JP | 2004-145300 A | 5/2004 |
| JP | 2004-341465 A | 12/2004 |
| JP | 2005-004193 A | 1/2005 |
| JP | 2005-338653 A | 12/2005 |
| JP | 2006-165529 A | 6/2006 |

(56) References Cited

FOREIGN PATENT DOCUMENTS

| | | |
|---|---|---|
| JP | 2007-053286 A | 3/2007 |
| JP | 2007-095685 A | 4/2007 |
| JP | 2007-149922 A | 6/2007 |
| JP | 2007-157871 A | 6/2007 |
| JP | 2007-310334 A | 11/2007 |
| JP | 2008-066385 A | 3/2008 |
| JP | 2008-084655 A | 4/2008 |
| JP | 2009-075613 A | 4/2009 |
| JP | 2009-175563 A | 8/2009 |
| JP | 2010-040552 A | 2/2010 |
| JP | 2010-050165 A | 3/2010 |
| JP | 2010-153842 A | 7/2010 |
| JP | 2010-206187 A | 9/2010 |
| JP | 2010-232645 A | 10/2010 |
| JP | 2010-232651 A | 10/2010 |
| JP | 2010-232652 A | 10/2010 |
| JP | 2010-251731 A | 11/2010 |
| JP | 2010-283338 A | 12/2010 |
| JP | 2011-049550 A | 3/2011 |
| JP | 2011-128442 A | 6/2011 |
| JP | 2011-146694 A | 7/2011 |
| JP | 2011-199273 A | 10/2011 |
| JP | 2011-223004 A | 11/2011 |
| JP | 2012-146764 A | 8/2012 |
| JP | 2012-191131 A | 10/2012 |
| JP | 2014-505324 A | 2/2014 |
| JP | 2014-154382 A | 8/2014 |
| JP | 2014-218706 A | 11/2014 |
| JP | 2015-143396 A | 8/2015 |
| JP | 2015-179822 A | 10/2015 |
| JP | 2015-228515 A | 12/2015 |
| JP | 2016-181695 A | 10/2016 |
| JP | 2016-213052 A | 12/2016 |
| JP | 2016-219801 A | 12/2016 |
| JP | 2017-005064 A | 1/2017 |
| JP | 2017-057288 A | 3/2017 |
| JP | 2017-084868 A | 5/2017 |
| JP | 2017-116622 A | 6/2017 |
| JP | 2017-168860 A | 9/2017 |
| JP | 2017-537350 A | 12/2017 |
| JP | 2018-098364 A | 6/2018 |
| JP | 2018-133144 A | 8/2018 |
| JP | 2018-206822 A | 12/2018 |
| JP | 2019-016659 A | 1/2019 |
| JP | 2019-149561 A | 9/2019 |
| JP | 2020-035942 A | 3/2020 |
| KR | 10-2006-0003633 A | 1/2006 |
| KR | 10-2011-0015373 A | 2/2011 |
| KR | 10-2011-0041139 A | 4/2011 |
| KR | 10-2013-0037569 A | 4/2013 |
| KR | 10-2014-0081662 A | 7/2014 |
| KR | 10-2016-0120394 A | 10/2016 |
| KR | 10-2017-0021903 A | 2/2017 |
| TW | 201545360 A | 12/2015 |
| TW | 201630181 A | 8/2016 |
| TW | 201639213 A | 11/2016 |
| TW | 201714313 A | 4/2017 |
| WO | 2005/071764 A1 | 8/2005 |
| WO | 2007/043697 A1 | 4/2007 |
| WO | 2007/043704 A1 | 4/2007 |
| WO | 2015/098458 A1 | 7/2015 |
| WO | 2016/043234 A1 | 3/2016 |
| WO | 2016/195039 A1 | 12/2016 |
| WO | 2019/043510 A1 | 3/2019 |

OTHER PUBLICATIONS

Extended European search report issued in European Patent Application No. 21827868.7 dated Sep. 5, 2023.
Hee Yeon Kim et al., "Transparent InP Quantum Dot Light-Emitting Diodes with ZrO2 Electron Transport Layer and Indium Zinc Oxide Top Electrode", Advanced Functional Materials, Wiley-VCH Verlag GmbH & Co. Kgaa, DE, vol. 26, No. 20, Apr. 6, 2016, pp. 3454-3461, XP072413443.
Japanese Office Action issued in Japanese Patent Application No. 2020-018120 dated Sep. 5, 2023.
Chinese Office Action issued in Chinese Patent Application No. 201810479338.8 dated Apr. 1, 2023.
Japanese Office Action issued in Japanese Patent Application No. 2022-532499 dated Jul. 4, 2023.
International Search Report issued in Patent Application No. PCT/JP2021/023638 dated Sep. 14, 2021.
Written Opinion issued in Patent Application No. PCT/JP2021/023638 dated Sep. 14, 2021.
Partial European Search Report for Application No. 18173345.2 dated Oct. 2, 2018.
Extended European Search Report for Application No. 18173345.2 dated Jan. 14, 2019.
Extended European Search Report for 19186679.7 dated Feb. 11, 2020.
Extended European Search Report for 19199145.4 dated Feb. 14, 2020.
Extended European Search Report for 19213814.7 dated May 29, 2020.
Extended European search report issued in European Patent Application No. 21154269.1 dated Jul. 15, 2021.
Extended European search report issued in European Patent Application No. 22161095.9 dated May 9, 2022.
Hosono et al., "Transparent Amorphous Oxide Semiconductors for Organic Electronics: Application to Inverted OLEDs", Proceedings of the National Academy of Sciences, vol. 114, No. 2, Dec. 27, 2016, pp. 233-238.
Gyujeong Lee et al, "Vertical organic light-emitting transistor showing a high current on/off ratio through dielectric encapsulation for the effective charge pathway", Journal of Applied Physics, Jan. 12, 2017, vol. 121, p. 024502-(1-8).
Japanese Office Action issued in Japanese Patent Application No. 2019-029934 dated Aug. 2, 2022.
Japanese Office Action issued in Japanese Patent Application No. 2018-162568 dated Aug. 23, 2022.
Japanese Office Action issued in Japanese Patent Application No. 2018-180487 dated Sep. 6, 2022.
Taiwanese Office Action issued in Taiwanese Patent Application No. 111131731 dated Sep. 1, 2022.
U.S. Office action for U.S. Appl. No. 16/206,744 dated Mar. 5, 2020.
Office Action issued on Oct. 14, 2020 for the U.S. Appl. No. 16/206,744.
US Office Action issued in U.S. Appl. No. 16/206,744 dated Apr. 23, 2021.
US Office Action issued in U.S. Appl. No. 16/577,044 dated Jun. 24, 2021.
US Office Action issued in U.S. Appl. No. 16/860,160 dated Mar. 3, 2021.
Notice of Allowance mailed on Sep. 30, 2020 for the U.S. Appl. No. 16/678,229.
Notice of Allowance mailed on Jan. 19, 2021 for the corresponding to Japanese application No. 2017-107278.
Notice of Allowance mailed on Nov. 8, 2022 for the corresponding to Korean application No. KR10-2018-0057002.
Extended European Search Report issued on Mar. 2, 2023 for EP application No. 22212464.6.
Notice of Allowance mailed on Nov. 29, 2022 for the U.S. Appl. No. 17/543,793.
Taiwanese Office Action issued in Taiwanese Patent Application No. 112116069 dated May 29, 2023.
Korean Office Action issued in Korean Patent Application No. 10-2023-0014691 dated Sep. 27, 2023.
US Notice of Allowance issued in U.S. Appl. No. 18/190,208 dated Oct. 25, 2023.
Korean Office Action issued in Korean Patent Application No. 10-2022-7042390 dated Jan. 18, 2024.
European Office Action issued in European Patent Application No. 19186679.7 dated Jan. 24, 2024.
Japanese Office Action issued in Japanese Patent Application No. 2023-035885 dated Nov. 21, 2023.

(56) References Cited

OTHER PUBLICATIONS

Extended European Search Report issued for European application No. 23191776.6 dated Nov. 28, 2023.
Woo Jae Jang et al., "Low Resistive High-Work-Function Gate Electrode for Transparent a-IGZO TFTs", IEEE Transactions on Electron Devices, IEEE, USA, vol. 64, No. 1, Jan. 1, 2017, pp. 164-169, XP011637544 ISSN: 0018-9383, DOI:10.1109/TED.2016.2631567 [retrieved on Dec. 26, 2016].
Chinese Office Action issued in Chinese Patent Application No. 201911056626.3 dated Mar. 12, 2024.
Japanese Notice of Allowance issued in Japanese Patent Application No. 2023-035885 dated May 28, 2024.
Office Action issued on Jun. 11, 2024 for Chinese application No. 201910651062.1.

* cited by examiner

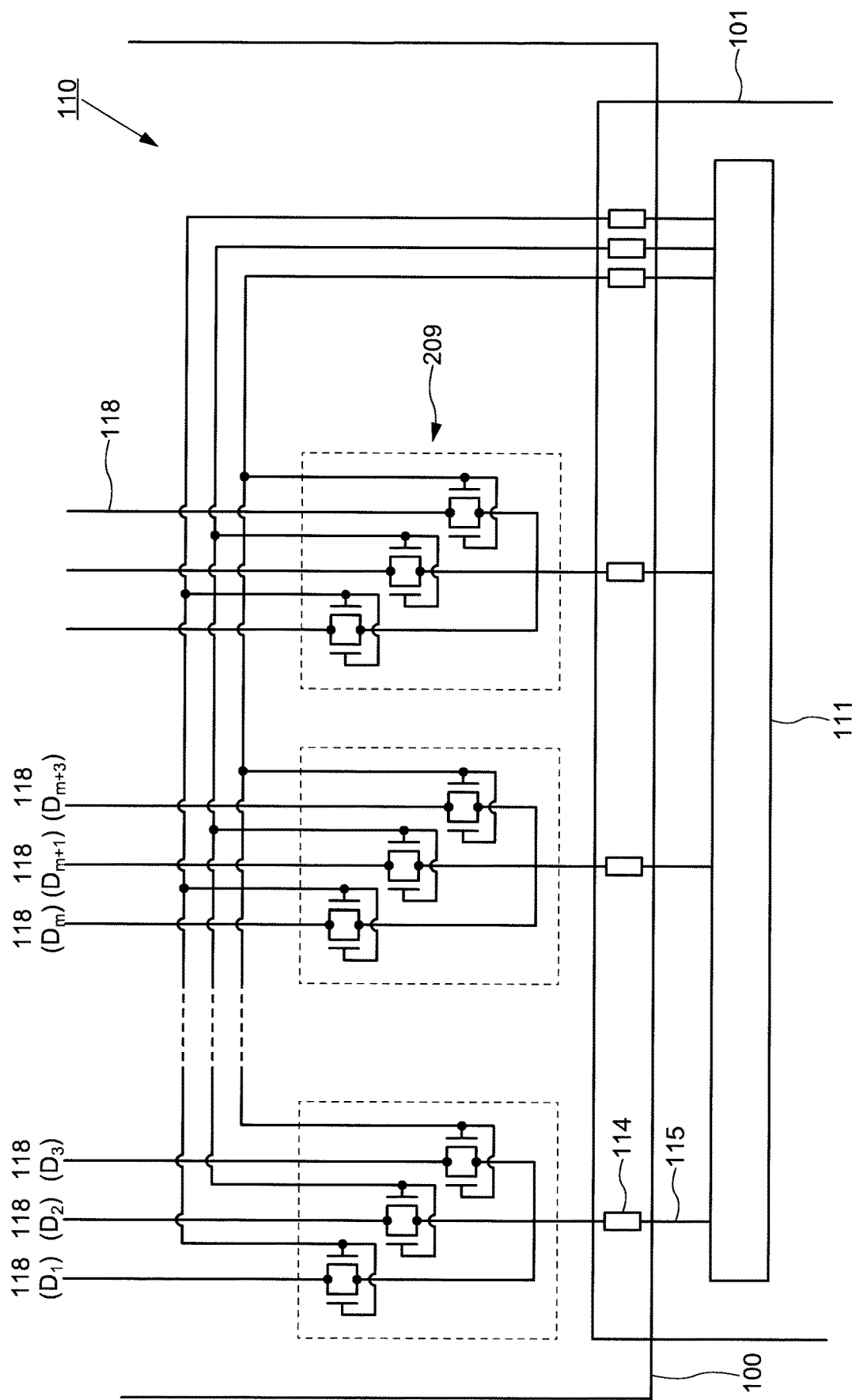

THIN FILM TRANSISTOR

CROSS-REFERENCE TO RELATED APPLICATIONS

This is a continuation of U.S. patent application Ser. No. 17/163,939 filed on Feb. 1, 2021, which claims the benefit of priority from the prior Japanese Patent Application No. 2020-018120, filed on Feb. 5, 2020, the entire contents of which are incorporated herein by reference.

FIELD

An embodiment of the present invention relates to a pixel structure of a liquid crystal display device.

BACKGROUND

In-Plane Switching mode active-matrix liquid crystal display is disclosed in which the video signal lines are covered with a transparent insulator has a dielectric constant of 3.3 or less, and a common electrode is provided to shield the video signal lines with a transparent conductive film (for example, Japanese Unexamined Patent Application Publication No. 2004-341465).

The liquid crystal display device is provided with a shield common electrode for shielding an electric field generated from a signal line. However, when the shield electrodes are laminated, the layer structure is complicated, and the aperture ratio of the pixel is lowered. On the other hand, when the layer structure is simplified, the electric field of the signal line acts on a liquid crystal layer, thereby lowering the long-term reliability.

SUMMARY

A liquid crystal display device in an embodiment according to the present invention includes a transistor, a pixel electrode, and a common electrode. The transistor includes a first gate electrode on a first substrate, a second gate electrode having a region overlapping the first gate electrode, an oxide semiconductor layer between the first gate electrode and the second gate electrode, a first insulating layer between the first gate electrode and the oxide semiconductor layer, a second insulating layer between the oxide semiconductor layer and the second gate electrode, and a first oxide conductive layer and a second oxide conductive layer disposed between the first insulating layer and the oxide semiconductor layer and disposed with the first gate electrode and the second gate electrode sandwiched from both sides. The pixel electrode is disposed between the first insulating layer and the second insulating layer; and the common electrode is disposed a region overlapping with the pixel electrode and on the second insulating layer. The pixel electrode is continuous from the second oxide conductive layer, and the first gate electrode and the second gate electrode are electrically connected by a first contact hole through the first insulating layer and the second insulating layer in a region outside the oxide semiconductor layer.

A liquid crystal display device in an embodiment according to the present invention includes a transistor, a pixel electrode, and a common electrode. The transistor includes a first gate electrode on a first substrate, a second gate electrode having a region overlapping the first gate electrode, an oxide semiconductor layer between the first gate electrode and the second gate electrode, a first insulating layer between the first gate electrode and the oxide semiconductor layer, a second insulating layer between the oxide semiconductor layer and the second gate electrode, and a first oxide conductive layer and a second oxide conductive layer disposed between the first insulating layer and the oxide semiconductor layer and disposed with the first gate electrode and the second gate electrode sandwiched from both sides. The pixel electrode is disposed between the first insulating layer and the second insulating layer. The pixel electrode is electrically connected to the second oxide conductive layer, and the first gate electrode is electrically connected to the second gate electrode by a first contact hole through the first insulating layer and the second insulating layer in a region outside the oxide semiconductor layer.

A liquid crystal display device in an embodiment according to the present invention includes a transistor, a first pixel electrode, and a second pixel electrode. The transistor includes a first gate electrode on a first substrate, a second gate electrode having a region overlapping the first gate electrode, an oxide semiconductor layer between the first gate electrode and the second gate electrode, a first insulating layer between the first gate electrode and the oxide semiconductor layer, a second insulating layer between the oxide semiconductor layer and the second gate electrode, and a first oxide conductive layer and a second oxide conductive layer disposed between the first insulating layer and the oxide semiconductor layer and disposed with the first gate electrode and the second gate electrode sandwiched from both sides. The first pixel electrode is disposed between the first substrate and the first insulating layer. The first pixel electrode and the second pixel electrode are electrically connected to a wiring extending from the second oxide conductive layer, and the first gate electrode is electrically connected to the second gate electrode by a first contact hole through the first insulating layer and the second insulating layer in a region outside the oxide semiconductor layer.

BRIEF DESCRIPTION OF DRAWINGS

FIG. 3 shows an example of a data signal line drive circuit of a liquid crystal display device according to an embodiment of the present invention;

DESCRIPTION OF EMBODIMENTS

Figure 1:
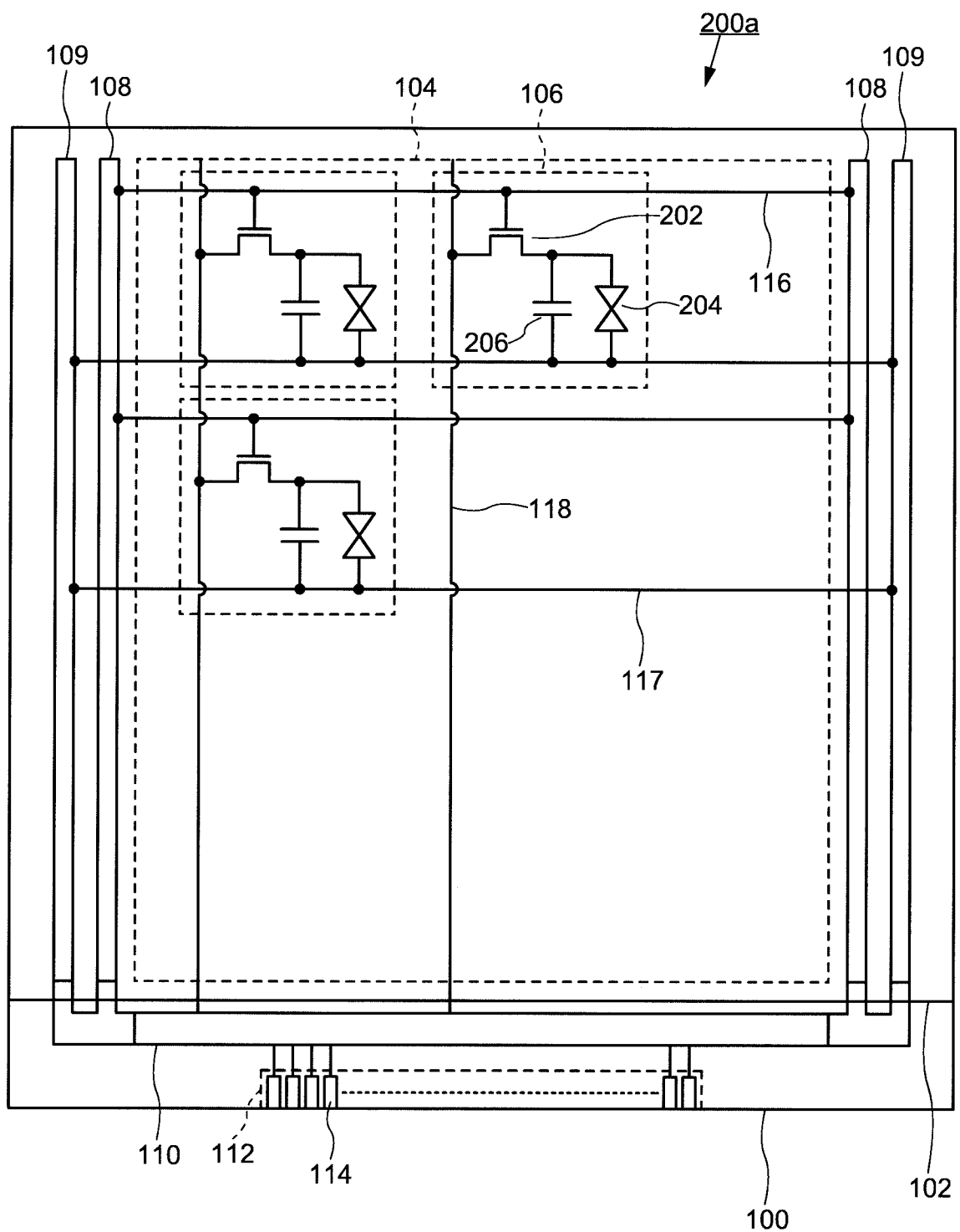
FIG. 1 shows a configuration of a liquid crystal display device according to an embodiment of the present invention.

Hereinafter, embodiments of the present invention will be described with reference to the drawings and the like. The present invention may be carried out in various embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely examples and do not limit the present invention in any way. In the specification and the drawings, components that are substantially the same as those described or shown previously bear the identical reference signs thereto (or the identical reference signs followed by letters "a", "b" or the like), and detailed descriptions thereof may be omitted. The terms "first", "second" and the like used for elements are merely provided for distinguishing the elements and do not have any other significance unless otherwise specified.

In the specification and the claims, an expression that a component is "on" another component encompasses a case where such a component is in contact with another component and also a case where such a component is above or below another component, namely, a case where still another component is provided between such a component and another component, unless otherwise specified.

1. Structure of Liquid Crystal Display Device

A circuit configuration of a liquid crystal display device according to an embodiment of the present invention will be described. In the following description, the circuit configuration applicable to the FFS (Fringe Field Switching) mode and the IPS (In Plane Switching) mode, and the circuit configuration applicable to the PSVA (Polymer Stabilized Vertical Alignment) mode are exemplified.

1-1. FFS Mode and the IPS Mode Liquid Crystal Display Device

FIG. 1 shows a configuration of the FFS mode and the IPS mode liquid crystal display device 200a according to an embodiment of the present invention. The liquid crystal display device 200a has a structure in which a liquid crystal layer (not shown in FIG. 1) is provided between a first substrate 100 and a second substrate 102 which are arranged oppositely to each other, and is provided with a display part 104 for displaying an image by using an electro-optical effect of the liquid crystal. A display part 104 is provided with at least one pixel 106, a scanning signal line 116, a common signal line 117, and a data signal line 118. At least one pixel 106 comprises a plurality of pixels. The plurality of pixels 106 are appropriately arranged on the display part 104. The plurality of pixels 106 are arranged to correspond to, for example, a stripe arrangement, a mosaic arrangement, a delta arrangement, and a Pen-Tile arrangement.

A scanning signal line drive circuit 108, a common signal line drive circuit 109, and a data signal line drive circuit 110 may be appropriately arranged in a region outside the display part 104 of the liquid crystal display device 200a. A scanning signal line 116 arranged in the display part 104 is connected to the scanning signal line drive circuit 108, a common signal line 117 is connected to the common signal line drive circuit 109, and a data signal line 118 is connected to the data signal line drive circuit 110. The scanning signal line drive circuit 108 outputs scanning signals to the scanning signal line 116, the common signal line drive circuit 109 outputs at least one common signal to the common signal line 117, and the data signal line drive circuit 110 outputs video signals to the data signal line 118.

The liquid crystal display device 200a includes an input terminal part 112 provided at an end portion of the first substrate 100. The input terminal part 112 includes at least one terminal electrode 114. At least one terminal electrode 114 comprises a plurality of terminal electrodes 114. The plurality of terminal electrodes 114 are appropriately arranged on the input terminal part 112. The input terminal part 112 is a connection part to an external circuit, and functions as a part to which a flexible printed circuit board (not shown) is connected.

FIG. 1 also shows an equivalent circuit of the pixel 106. The pixel 106 includes a transistor 202, a liquid crystal element 204, and a retention capacitor element 206. The transistor 202 has a control terminal so called as a gate and input/output terminals so called as a source and a drain. The transistor 202 arranged in a pixel 106, and has a gate (control terminal), a first input/output terminal which one of the source and the drain, and a second input/output terminal which other of the source and the drain. The gate (control terminal) is electrically connected to the scanning signal line 116, the first input/output terminal is electrically connected to the data signal line 118, and the second input/output terminal is electrically connected to the liquid crystal element 204 and the retention capacitor element 206. The liquid crystal element 204 and the retention capacitor element 206 are electrically connected to the common signal line 117.

The ON state and OFF state of the transistor 202 are controlled by a scanning signal inputted from the scanning signal line 116 through the gate (control terminal). When the transistor 202 is ON state, a video signal is input from the data signal line 118 to the pixel 106. When the video signal is input to the pixel 106, a voltage based on the data signal is applied to the liquid crystal element 204, and the retention capacitor element 206 is charged with the voltage based on the data signal. The liquid crystal element 204 includes a pair of electrodes and a liquid crystal layer. In the liquid crystal element 204, one electrode (also referred to as pixel electrodes) is electrically connected to the transistor 202, and the other electrode (common electrode) is electrically connected to the common signal line 117. In the liquid crystal element 204, the orientation of the liquid crystal molecules is controlled by the voltage based on the video signal and the voltage applied to the common signal line 117. The liquid crystal display device 200a has a function of displaying an image on the display part 104 by individually controlling the alignment of the liquid crystals in the plurality of pixels 106.

Figure 2:
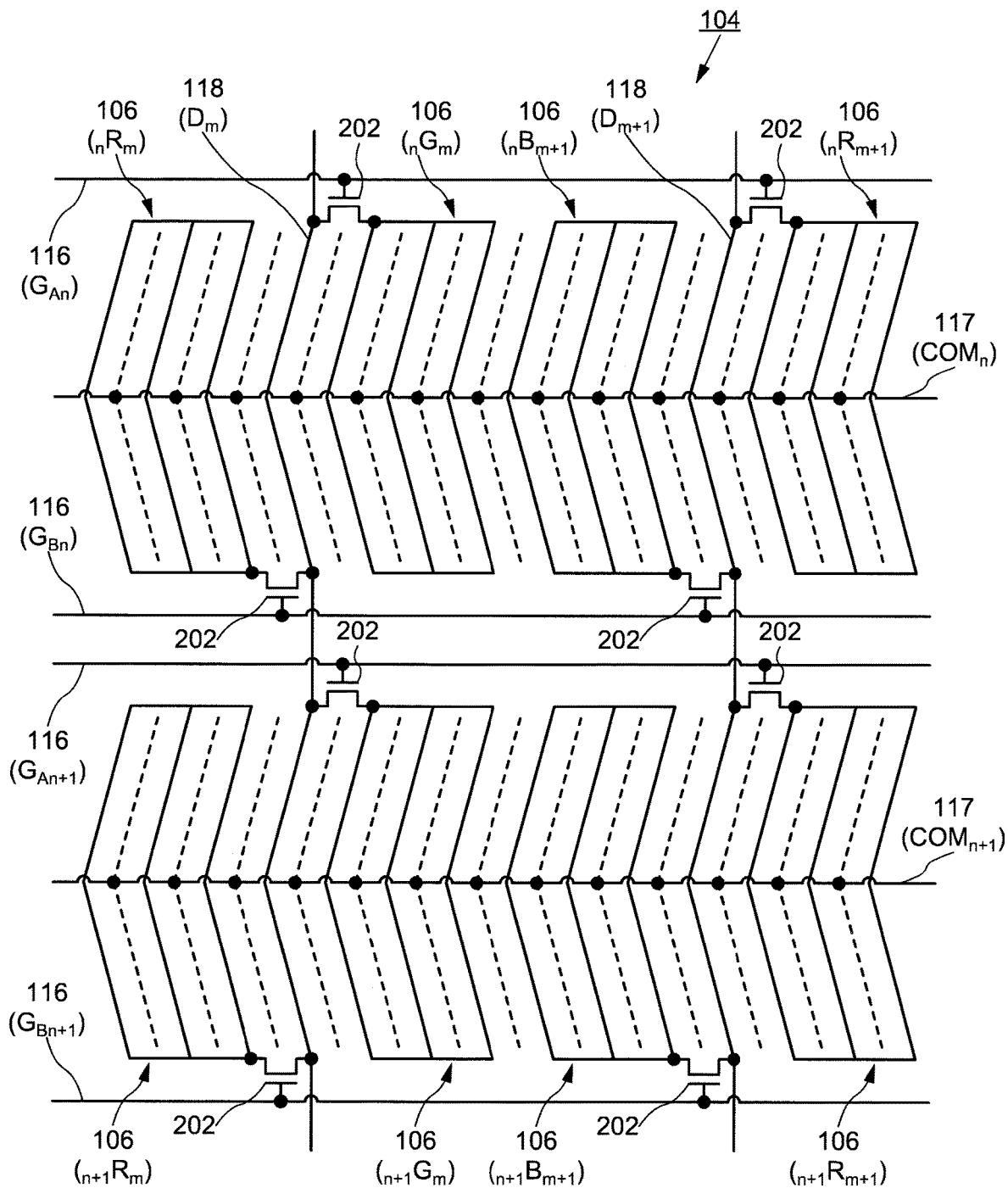
FIG. 2 shows an example of a circuit configuration of a display part of a liquid crystal display device according to an embodiment of the present invention.

FIG. 2 shows a circuit configuration of the display part 104 in the FFS mode and the IPS mode. FIG. 2 shows a configuration in which the pixels 106 ($_nR_m$), 106 ($_nG_m$), 106 ($_nB_{m+1}$), 106 ($_nR_{m+1}$) are arranged in the n-th row of the display part 104, and the pixels 106 ($_{n+1}R_m$), 106 ($_{n+1}G_m$), 106 ($_{n+1}B_{m+1}$), 106 ($_{n+1}R_{m+1}$) are arranged in the n+1-th row of the display part 104. Each pixel is disposed with the transistor 202. The transistor 202 disposed in each pixel is connected to the scanning signal line 116 and the data signal line 118. Each pixel is disposed with a pixel electrode and a common electrode.

FIG. 2 shows a configuration in which each pixel is arranged corresponding to a stripe array. That is, FIG. 2 shows an example in which red (R) pixels, green pixels (G), and blue pixels (B) are arranged according to each column. Each pixel has a connection relationship with the data signal line 118, the pixels 106 ($_nR_m$), 106 ($_nG_m$), 106 ($_{n+1}R_m$), 106 ($_{n+1}G_m$) are connected to a first data signal line 118 ($D_m$) arranged corresponding to the m-th column, and the pixels 106 ($_nB_{m+1}$), 106 ($_nR_{m+1}$), 106 ($_{n+1}B_{m+1}$), 106 ($_{n+1}R_{m+1}$) are connected to a second data signal line 118 ($D_{m+1}$) arranged corresponding to the m+1-th column. In the pixels arranged in the n-th row, the common electrode is connected to a first common signal line 117 ($COM_n$), and in the pixels arranged in the n+1-th row, the common electrode is connected to a second common signal line ($COM_{n+1}$).

As shown in FIG. 2, by arranging two scanning signal lines in each row, the number of data signal lines can be reduced. For example, the pixels 106 ($_nR_m$), 106 ($_nG_m$) belonging to the n-th row are connected to the first data signal line 118 ($D_m$), and a video signal is input from the same data signal line. Similarly, the pixels 106 ($_nB_{m+1}$), 106 ($_nR_{m+1}$) belonging to the n-th row are connected to the second data signal line 118 ($D_{m+1}$), and a video signal is input from the same data signal line.

FIG. 3 shows a configuration example of the data signal line drive circuit 110. FIG. 3 shows an example in which a driver IC 111 mounted on a flexible printed circuit substrate (FPC substrate) 101 and a demultiplexer 209 formed on the first substrate 100 constitute a data signal line drive circuit 110. The FPC 101 is connected by a terminal electrode 114 provided on the first substrate 100. The output signal line 115 connected to the driver IC 111 is connected to the demultiplexer 209 and branched into a plurality of data signal lines. FIG. 3 shows an aspect in which one output signal line 115 extending from the driver IC 111 is input to one block of the demultiplexer 209 and branched into three data signal lines 118 ($D_1$), 118 ($D_2$) and 118 ($D_3$). Note that the number of branches to be made by the demultiplexer 209 is arbitrary.

The demultiplexer 209 can be constructed of a transistor having the same structure as that of the transistor 202 disposed in the pixel 106. In this way, the processing of the video signal is performed by the driver IC, the driver IC is mounted by the COF (Chip on Film), and the demultiplexer 209 is provided on the first substrate 100 on which a display part 104 is arranged, and by using the demultiplexer 209 to branch the input signal line from the driver IC 111 into a plurality of data signal lines 118, the circuit scale of the driver IC 111 can be reduced. Further, the power consumption of the driver IC 111 can be reduced.

Figure 4A:
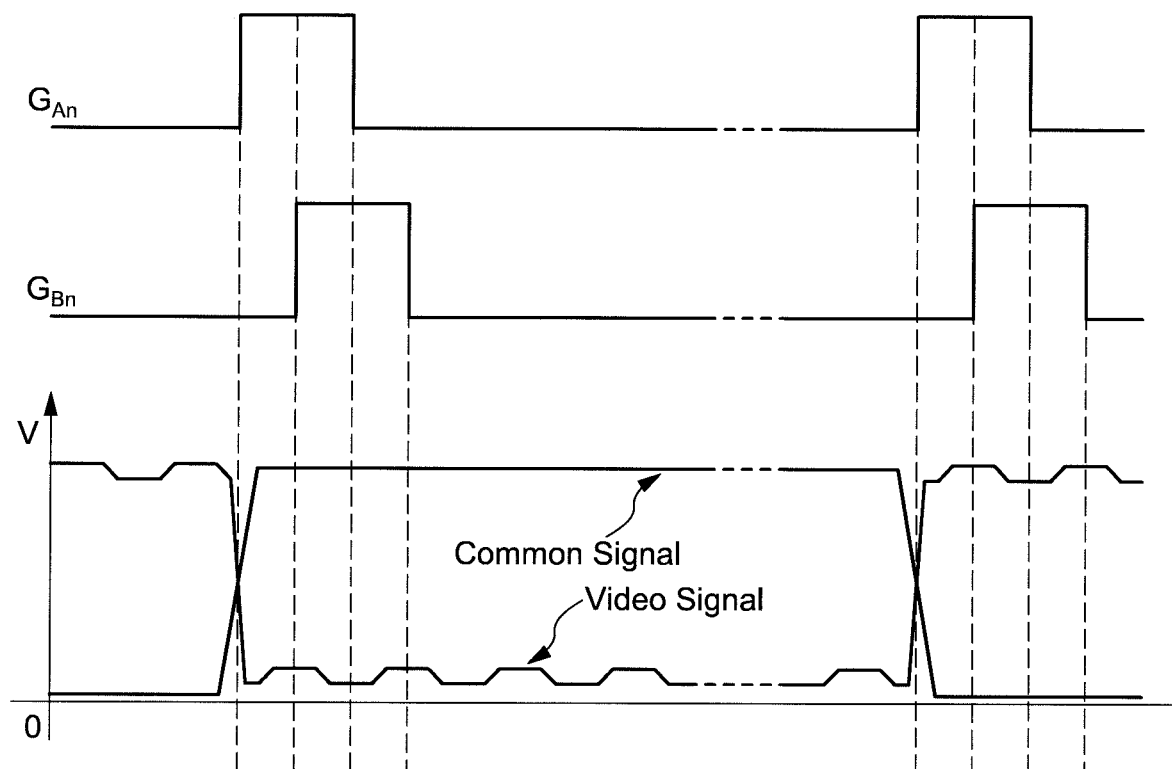
FIG. 4A is a timing chart for explaining the operation of a liquid crystal display device according to an embodiment of the present invention, and shows the operation of the FFS mode liquid crystal display device and the IPS mode liquid crystal display device.

FIG. 4A shows a timing chart of signals input to the first scanning signal line 116 ($GA_n$), the second scanning signal line 116 ($GB_n$), the first data signal line 118 ($D_m$), and the common signal line 117 ($COM_n$). The timing chart shown in FIG. 4A shows an example of the frame inversion driving method. In the inversion driving method, when the common voltage of the common signal line 117 is inverted in a certain frame, the n-th row of the first scanning signal line (for example, the first scanning signal line 116 ($GA_n$)) is selected, and a video signal is written to the pixels of the even-numbered columns. In this manner, the video signal is written in the pixels of each row of the display part 104. In the next frame, the common voltage of the common signal line 117 is inverted, and the voltage level of the video signal is inverted accordingly, and the same operation is performed. As described above, the frame inversion driving method can be applied to the FFS mode and IPS mode liquid crystal display device 200a.

1-2. PVSA Mode Liquid Crystal Display Device

Figure 5:
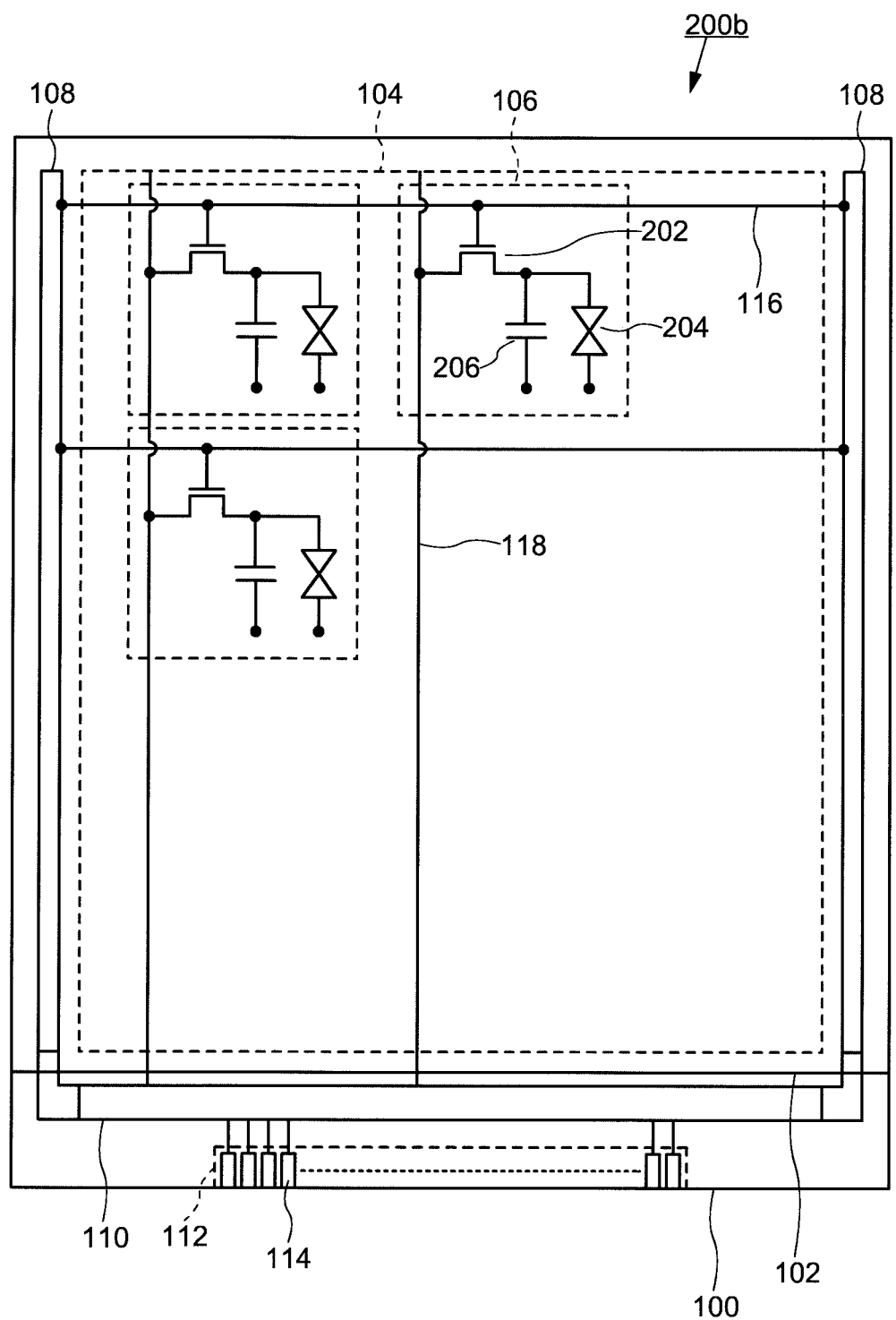
FIG. 5 shows a configuration of a liquid crystal display device according to an embodiment of the present invention.

FIG. 5 shows a configuration of a PSVA mode liquid crystal display device 200b according to an embodiment of the present invention. The liquid crystal display device 200b has a structure in which a liquid crystal layer (not shown) is provided between the first substrate 100 and the second substrate 102 arranged oppositely, and is provided with a display part 104 for displaying an image by using the electro-optical effect of the liquid crystal. The scanning signal line drive circuit 108 and the data signal line drive circuit 110 are appropriately arranged in a region outside the display part 104 in the liquid crystal display device 200b. The scanning signal line 116 disposed on the display part 104 is connected to the scanning signal line drive circuit 108, and the data signal line 118 is connected to the data signal line drive circuit 110. The scanning signal line drive circuit 108 outputs scanning signals to the scanning signal line 116, and the data signal line drive circuit 110 outputs video signals to the data signal line 118. One terminal of the liquid crystal element 204 and the retention capacitor element 206 are electrically connected to the transistor 202, and a common voltage is applied to the other terminal.

Figure 6:
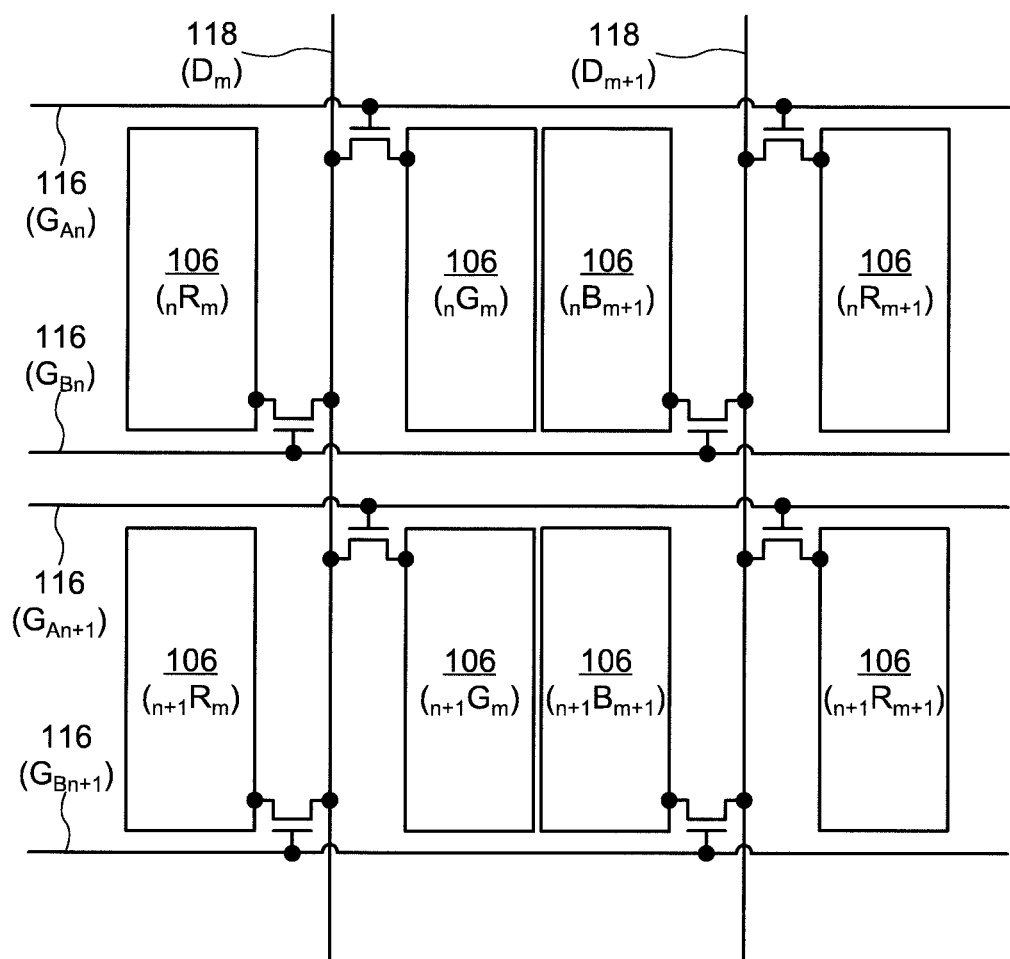
FIG. 6 shows an example of a circuit configuration of a display part of a liquid crystal display device according to an embodiment of the present invention.

FIG. 6 shows a circuit configuration of the display part 104 in the PSVA mode. FIG. 6 shows a configuration in which the pixels 106 ($_nR_m$), 106 ($_nG_m$), 106 ($_nB_{m+1}$), 106 ($_nR_{m+1}$) are arranged in the n-th row of the display part 104, and the pixels 106 ($_{n+1}R_m$), 106 ($_{n+1}G_m$), 106 ($_{n+1}B_{m+1}$), 106 ($_{n+1}R_{m+1}$) are arranged in the n+1-th row. Each pixel is provided with the transistor 202 connected to the data signal line 118.

FIG. 6 shows a configuration in which each pixel is arranged corresponding to a stripe array. The pixels 106 ($_nG_m$), 106 ($_nR_{m+1}$) are connected to a first scanning signal line 116 (GA$_n$) arranged corresponding to the n-th row, the pixels 106 ($_nR_m$), 106 ($_nB_{m+1}$) are connected to a second scanning signal line (GB$_n$) arranged corresponding to the n-th row, the pixels 106 ($_{n+1}G_m$), 106 ($_{n+1}R_{m+1}$) are connected to a scanning signal line 116 (GA$_{n+1}$) arranged corresponding to the n+1-th row, and the pixels 106 ($_{n+1}R_m$), 106 ($_{n+1}B_{m+1}$) are connected to a second scanning signal line 116 (GB$_{n+1}$) arranged corresponding to the n+1-th row. In relation between the data signal lines 118 and the pixels 106, the pixels 106 ($_nR_m$), 106 ($_nG_m$), 106 ($_{n+1}R_m$), 106 ($_{n+1}G_m$) are connected to a first data signal line 118 (D$_m$) arranged corresponding to the m-th column, and the pixels 106 ($_nB_{m+1}$), 106 ($_nR_{m+1}$), 106 ($_{n+1}B_{m+1}$), 106 ($_{n+1}R_{m+1}$) are connected to a second data signal line 118 (D$_{m+1}$) arranged corresponding to the m+1-th column. As described above, in the pixel circuit shown in FIG. 6, the number of data signal lines can be reduced by providing two scanning signal lines in each row in the same manner as the FFS mode and IPS mode pixel circuits.

Figure 4B:
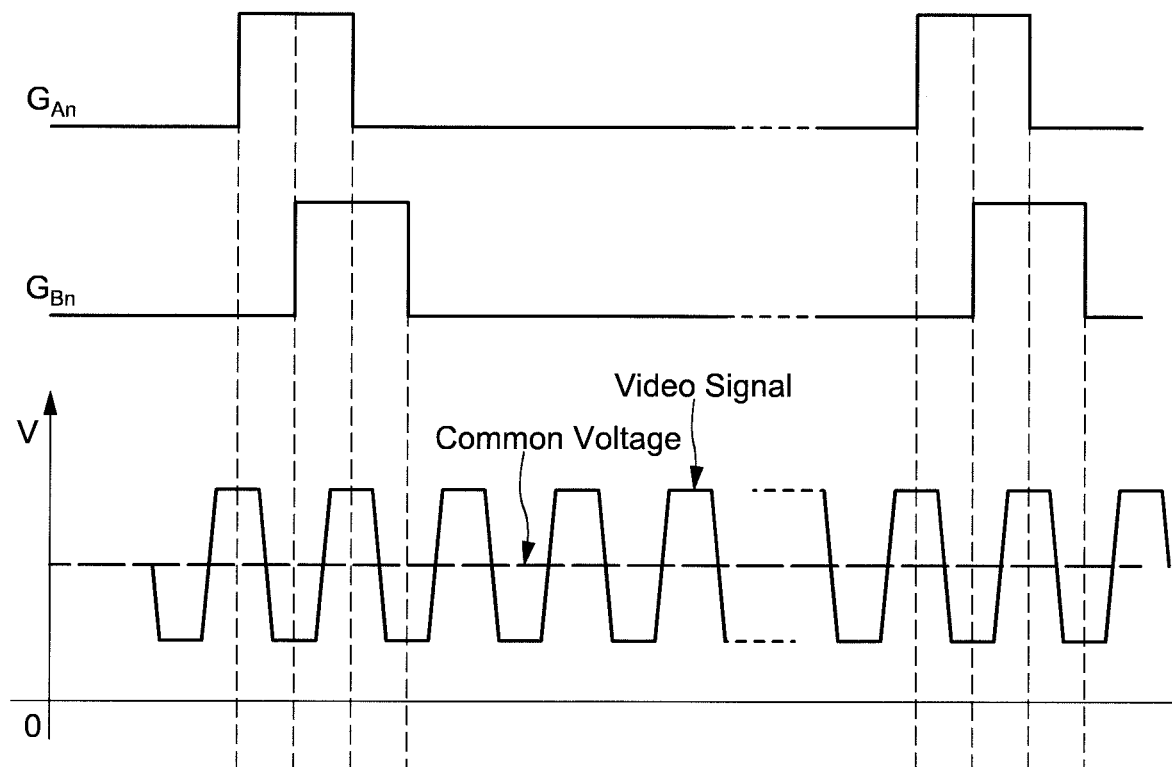
FIG. 4B is a timing chart for explaining the operation of a liquid crystal display device according to an embodiment of the present invention, and shows the operation of the PVSA mode liquid crystal display device.

FIG. 4B shows a timing chart of signals input to the first scanning signal line 116 (GA$_n$), the second scanning signal line 116 (GB$_n$), and the first data signal line 118 (D$_m$). The timing chart shown in FIG. 4B shows an example of the dot inversion driving method, in which the common voltage is constant. In a certain frame, the first scanning signal line (for example, the first scanning signal line 116 (GA$_n$)) of the n-th row is selected, and a video signal is written to the pixels of the even-numbered columns. Next, the n-th row of the second scanning signal lines (for example, the second scanning signal line (GB$_n$)) is selected, and a video signal having a polarity opposite to that of the even-numbered column is input when the common voltage is used as a reference. As described above, the dot inversion driving method can be applied to the liquid crystal display device 200b of the PSVA mode.

1-3. Problems Associated with Higher Pixel Resolution

The transistor 202 is a thin film transistor having a channel region formed of a semiconductor thin film. The transistor 202, together with the scanning signal line 116 and the data signal line 118, is manufactured using a fine pattern forming technique by photolithography. In order to reduce the manufacturing cost of the liquid crystal display devices 200a, 200b, it is considered necessary to reduce the number of photomasks. However, the scanning signal lines 116 and the data signal lines 118 need to be disposed to cross each other. Further, a part of these wirings must be provided to cross the seal pattern for sealing the liquid crystal layer. Although the scanning signal line 116 and the data signal line 118 are formed of metal wiring, the metal wiring cannot be exposed at a portion overlapping the seal pattern. Therefore, it is necessary to coat the metal wiring with an inorganic insulating film. When the sealing material and the metal wiring are in direct contact with each other, moisture (H$_2$O) in the atmosphere easily permeates into the liquid crystal layer through the interface between the sealing material and the metal wiring, and this leads to a decrease in reliability.

The liquid crystal display devices 200a, 200b can display a high-definition image by increasing the density of a plurality of pixels 106 arranged on the display part 104. However, when the number of pixels of the display part 104 increases, the signal writing time per 1 frame decreases, and therefore, high-speed operation of the transistor 202 is required. It is generally known that the field effect mobility of a transistor varies depending on the type of semiconductor forming a channel. For example, the field-effect mobility of a thin film transistor using amorphous silicon (amorphous silicon TFT) is about 0.5 cm$^2$/Vsec, and driving a liquid crystal display of full high-definition television (2K) is considered to be a limit. On the other hand, in a liquid crystal display having a resolution of 8 K, it is necessary to shorten the writing time to about 1.9 psec.

The transistors constituting the pixels are required to be capable of high-speed operation with the increase in the density of pixels. Further, the liquid crystal display device is required not only to improve the performance of the transistor but also to reduce the manufacturing cost while improving the image quality. Hereinafter, an embodiment of a liquid crystal display device which can satisfy such requirements will be described.

2. Structure of Transistor and Backplane

The transistor 202 applied to the liquid crystal display devices 200a and 200b according to an embodiment of the present invention will be described in detail. In the present embodiment, the transistor 202 is a thin film transistor, and has at least two kinds of structures as shown below.

2-1. Example of First Structure of Transistor

Figure 7A:
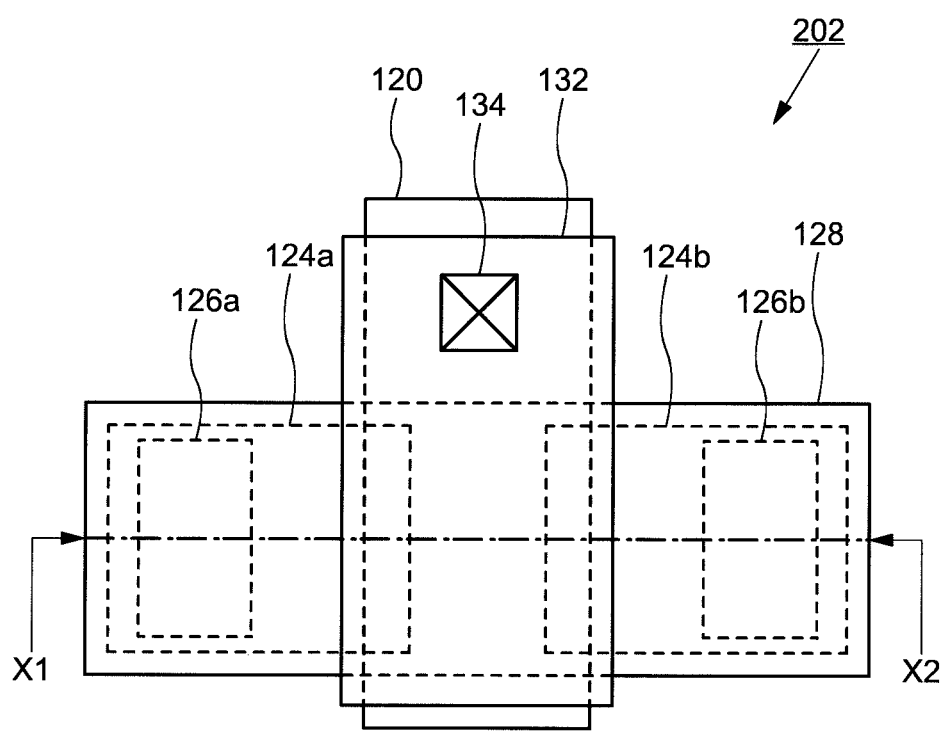
FIG. 7A is a plan view of a transistor in a liquid crystal display device according to an embodiment of the present invention.
Figure 7B:
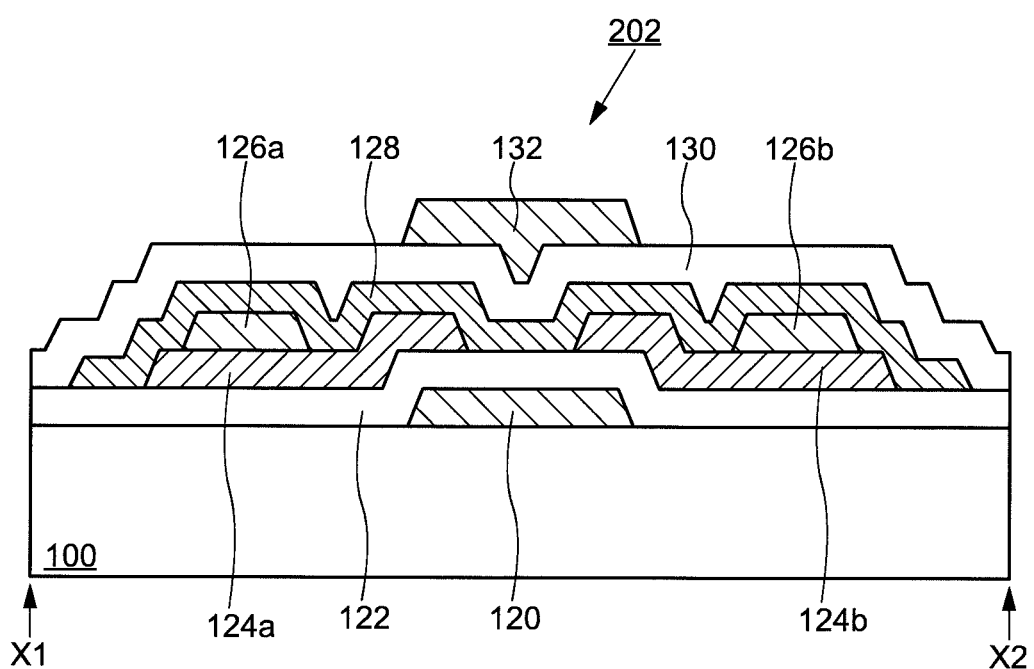
FIG. 7B is a cross-sectional view of a transistor in a liquid crystal display device according to an embodiment of the present invention.

FIGS. 7A and 7B show a first structural example of a transistor. FIG. 7A shows a plan view of transistor 202. FIG. 7B shows the cross-sectional structure of the transistor 202 corresponding to the X1-X2 line shown in FIG. 7A.

The transistor 202 includes an oxide semiconductor layer 128, a first gate electrode 120, and a second gate electrode 132. The first gate electrode 120 is arranged on the first substrate 100 side of the oxide semiconductor layer 128, and the second gate electrode 132 is arranged on the opposite side of the oxide semiconductor layer 128 to the first substrate 100. A first insulating layer 122 is disposed between the first gate electrode 120 and the oxide semiconductor layer 128, and a second insulating layer 130 is disposed between the oxide semiconductor layer 128 and the second gate electrode 132. The first insulating layer 122 and the second insulating layer 130 have a function as a gate insulating film for insulating the first gate electrode 120 and the second gate electrode 132 from the oxide semiconductor layer 128.

The transistor 202 has a structure in which a first oxide conductive layer 124a and a second oxide conductive layer 124b are provided between the first insulating layer 122 and the oxide semiconductor layer 128. The first oxide conductive layer 124a and the second oxide conductive layer 124b are arranged so that one end (end portion) of each overlaps the first gate electrode 120 and the second gate electrode 132. The first oxide conductive layer 124a and the second oxide conductive layer 124b are disposed in contact with the surface of the oxide semiconductor layer 128 on the first gate electrode 120 side (first surface). The first oxide conductive layer 124a and the second oxide conductive layer 124b are formed of a material belonging to the same metal oxide as the oxide semiconductor layer 128. Since the first oxide conductive layer 124a and the second oxide conductive layer 124b are in ohmic contact with the oxide semiconductor layer 128, they can be regarded as source electrodes and drain electrodes. Further, since the first oxide conductive layer 124a and the second oxide conductive layer 124b have higher conductivity than that of the oxide semiconductor layer 128, it can be considered that the source region and the drain region are formed at the interface in contact with the oxide semiconductor layer 128.

One end of the first oxide conductive layer 124a and one end of the second oxide conductive layer 124b are arranged apart from each other, and are arranged so as to face each other and overlap the first gate electrode 120 and the second gate electrode 132. The transistor 202 has a so-called gate overlap structure in which one end of the source region and the drain region substantially overlaps the gate electrode. With this structure, the transistor 202 can obtain a high on-current.

A first metal layer 126a is disposed between the first oxide conductive layer 124a and the oxide semiconductor layer 128, and a second metal layer 126b is disposed between the second oxide conductive layer 124b and the oxide semiconductor layer 128. The first metal layer 126a and the second metal layer 126b are arbitrary members and are provided appropriately. The first metal layer 126a and the second metal layer 126b are arranged, for example, as wiring for electrically connecting the transistor 202 to other elements. The first metal layer 126a and the second metal layer 126b are arranged at positions away from a region where a channel is formed in the oxide semiconductor layer 128. The transistor 202 has a structure which can be connected to the wiring in the circuit with such an arrangement, and can prevent the contamination of the channel region by the metal forming the first metal layer 126a and the second metal layer 126b.

The transistor 202 has a structure in which the first gate electrode 120 and the second gate electrode 132 are electrically connected. A first contact hole 134 shown in FIG. 7A is a hole through the first insulating layer 122 and the second insulating layer 130, and is provided outside a region where a channel of the oxide semiconductor layer 128 is formed.

Since the transistor 202 has a dual gate structure in which gate electrodes are arranged above and below the oxide semiconductor layer 128, the transistor 202 can operate in a fully depleted state. Further, the transistor 202 can operate in a state where channels are formed on both a first surface side (first gate electrode 120 side) and a second surface side (the second gate electrode 132 side) of the oxide semiconductor layer 128 (partial depletion type), even if the transistor is not of the complete depletion type. Even when the transistor 202 operates in either the fully depleted or partially depleted state, the effect of the electric field from the metal layer 126 existing at the interface with the insulating layer (the first insulating layer 122 and the second insulating layer 130) and in the vicinity thereof can be eliminated, and the change of the threshold voltage can be prevented.

Next, the details of the oxide semiconductor layer 128, the oxide conductive layer 124 (the first oxide conductive layer 124a, the second oxide conductive layer 124b), the insulating layer (the first insulating layer 122 and the second insulating layer 130), the gate electrode (the first gate electrode 120 and the second gate electrode 132), and the metal layer 126 (the first metal layer 126a and the second metal layer 126b) which constitute the transistor 202 will be described.

2-1-1. Oxide Semiconductor Layer

The oxide semiconductor layer 128 contains one or a plurality of elements selected from indium (In), zinc (Zn), gallium (Ga), tin (Sn), aluminum (Al) and magnesium (Mg). For example, an oxide semiconductor material used to form the oxide semiconductor layer 128 may be a four-component oxide material, a three-component oxide material, a two-component oxide material or a one-component oxide material showing semiconductor characteristics. Examples of the four-component oxide material include an $In_2O_3$—$Ga_2O_3$—$SnO_2$—ZnO-based oxide material and the like. Examples of the three-component oxide material include an $In_2O_3$—$Ga_2O_3$—ZnO-based oxide material, an $In_2O_3$—$SnO_2$—ZnO-based oxide material, an $In_2O_3$—$Al_2O_3$—ZnO-based oxide material, a $Ga_2O_3$—$SnO_2$—ZnO-based oxide material, a $Ga_2O_3$—$Al_2O_3$—ZnO-based oxide material, an $SnO_2$—$Al_2O_3$—ZnO-based oxide material, and the like. Examples of the two-component oxide material include an $In_2O_3$—ZnO-based oxide material, an $SnO_2$—ZnO-based oxide material, an $Al_2O_3$—ZnO-based oxide material, an MgO—ZnO-based oxide material, an $SnO_2$—MgO-based oxide material, an $In_2O_3$—MgO-based oxide material, and the like. Examples of the one-component oxide material include an $In_2O_3$-based metal oxide material, an $SnO_2$-based metal oxide material, a ZnO-based metal oxide material, and the like. The above-listed oxide semiconductors may include silicon (Si), nickel (Ni), tungsten (W), hafnium (Hf), or titanium (Ti). The In-Ga—Zn-O oxide material exemplified above is an oxide material containing at least In, Ga and Zn, and there is no specific limitation on the composition ratio thereof. In other words, the oxide semiconductor layer 128 may be formed of a thin film represented by chemical formula $InMO_3(ZnO)_m$ (m>0). M represents one or a plurality of metal elements selected from Ga, Al, Mg, Ti, Ta, W, Hf and Si. The oxide material contained in each of the four-component oxide materials, the three-component oxide materials, the two-component oxide materials, and one-component oxide materials listed above is not limited to having a stoichiometric composition, but may have a composition shifted from the stoichiometric composition.

The oxide semiconductor layer 128 is formed by a sputtering method. As the sputtering apparatus, a magnetron sputtering apparatus and an inductively coupled plasma sputtering apparatus are used. As the sputtering target, a sintered body of the four-component oxide materials, the three-component oxide materials, the two-component oxide materials and the one-component oxide materials listed above is used, and as the sputtering gas, noble gas such as argon (Ar) or xenon (Xe) or the like, or mixed gas of noble gas and oxygen ($O_2$) or noble gas and oxygen ($O_2$) and hydrogen ($H_2$) is used. In addition, the oxide semiconductor layer 128 may be formed by a coating method (wet process). When the oxide semiconductor layer 128 is formed by a coating method, a composition solution containing the four-component oxide materials, the three-component oxide materials, the two-component oxide materials, the one-component oxide materials that listed above, or their precursors is coated on the substrate and dried and fired.

The oxide semiconductor layer 128 desirably has a carrier concentration of about $1\times10^{15}/cm^3$ to $5\times10^{18}/cm^3$ in order to form a channel layer of the transistor 202. As long as the carrier concentration of the oxide semiconductor layer 128 is in this range, a normally off transistor can be realized. In addition, an on-current/off-current ratio (on/off ratio) of about $10^7$ to $10^{10}$ can be achieved.

2-1-2. Oxide Conductive Layer

The first oxide conductive layer 124a and the second oxide conductive layer 124b are formed of a metal oxide material, a metal nitride material, or a metal oxide nitride material, all of which are conductive. Examples of the metal oxide material usable for the first oxide conductive layer 124a and the second oxide conductive layer 124b include indium tin oxide ($In_2O_3$—$SnO_2$: ITO), indium zinc oxide ($In_2O_3$—ZnO: IZO), and tin oxide ($SnO_2$). The first oxide conductive layer 124a and the second oxide conductive layer 124b using such a metal oxide material can form a good ohmic contact with the oxide semiconductor layer 128.

Examples of the metal oxide material usable for the first oxide conductive layer 124a and the second oxide conductive layer 124b also include titanium oxide ($TiO_x$) and the like. Examples of the metal nitride material usable for the first oxide conductive layer 124a and the second oxide conductive layer 124b include titanium nitride ($TiN_x$), zirconium nitride ($ZrN_x$), and the like. Examples of the metal oxynitride material usable for the first oxide conductive layer 124a and the second oxide conductive layer 124b include titanium oxynitride ($TiO_xN_y$), tantalum oxynitride ($TaO_xN_y$), zirconium oxynitride ($ZrO_xN_y$), hafnium oxynitride ($HfO_xN_y$), and the like. The metal oxide materials, the metal nitride materials, and the metal oxynitride materials described above may contain trace amount of metal element in order to improve the conductivity. For example, titanium oxide doped with niobium ($TiO_x$:Nb) may be used. Use of such a metal oxide material, metal nitride materials, or metal oxynitride material, the chemical stability of the contact portion can be ensured even when the contact portion is brought into contact with the first metal layer 126a and the second metal layer 126b. Namely use of such a metal oxide material, such a metal nitride material, or such a metal oxynitride material exemplified herein as the first oxide conductive layer 124a and the second oxide conductive layer 124b, it is possible to prevents an oxidation-reduction reaction (local cell reaction) with aluminum (Al) having a lower potential.

2-1-3. Insulating Layer

The first insulating layer 122 and the second insulating layer 130 are formed of an inorganic insulating material. Examples of the inorganic insulating material include silicon oxide, silicon nitride, silicon oxide nitride, aluminum oxide, and the like. The first insulating layer 122 and the second insulating layer 130 each have a single-layer structure, or a stack structure including a plurality of films, formed of such an organic insulating material. For example, the first insulating layer 122 may include a silicon nitride film and a silicon oxide film stacked in this order from the first substrate 100 side. The second insulating layer 130 may include a silicon oxide film and a silicon nitride film stacked in this order from the oxide semiconductor layer 128 side. The first insulating layer 122 and the second insulating layer 130, in the case of including a plurality of organic insulating films, alleviate the action of an internal stress and also improve the barrier property against water vapor or the like.

In one embodiment of the present invention, the thickness of the first insulating layer 122 is thicker than that of the second insulating layer 130. Since the first insulating layer 122 is thick, the short-circuit between the scanning signal line 116 and the data signal line 118 can be greatly reduced, and the manufacturing yield can be improved. Further, since the thickness of the second insulating layer 130 is small, the ON-current of the transistor 202 can be increased. The thickness of the first insulating layer 122 is preferably in the range of 250 nm to 500 nm, and the thickness of the second insulating layer 130 is preferably about half the thickness of the first insulating layer 122. For example, the thickness of the first insulating layer 122 is preferably in the range of 125 nm to 250 nm.

2-1-4. Gate Electrodes

The first gate electrode 120 and the second gate electrode 132 are formed of a metal material such as aluminum (Al), molybdenum (Mo), tungsten (W), zirconium (Zr) or the like. For example, the first gate electrode 120 and the second gate electrode 132 may each be formed of a film of aluminum (Al), a molybdenum-tungsten alloy (MoW), or the like. The first gate electrode 120 and the second gate electrode 132 may be formed of an aluminum alloy, a copper alloy, or a silver alloy. Examples of the aluminum alloy usable for the first gate electrode 120 and the second gate electrode 132 include an aluminum-neodymium alloy (Al—Nd), an aluminum-neodymium-nickel alloy (Al—Nd—Ni), an aluminum-carbon-nickel alloy (Al—C—Ni), a copper-nickel alloy (Cu—Ni), a copper-molybdenum alloy (Cu—Mo), a copper-manganese alloy (Cu—Mn), and the like. Alternatively, the first gate electrode 120 and the second gate electrode 132 may each be formed of a transparent conductive film of indium tin oxide (ITO), indium zinc oxide (IZO), zinc oxide (ZnO) or the like.

2-1-5. Metal Layer

The first metal layer 126a and the second metal layer 126b are formed of a metal material having a high conductivity such as aluminum (Al), copper (Cu) or the like. For example, the first metal layer 126a and the second metal layer 126b are formed of an aluminum alloy, a copper alloy, or a silver alloy. Examples of the aluminum alloy usable for the first metal layer 126a and the second metal layer 126b include an aluminum-neodymium alloy (Al—Nd), an aluminum-titanium alloy (Al—Ti), an aluminum-silicon alloy (Al—Si), an aluminum-neodymium-nickel alloy (Al—Nd—Ni), an aluminum-carbon-nickel alloy (Al—C—Ni), a copper-nickel alloy (Cu—Ni), and the like. Use of such a metal material provides heat resistance and decreases the line resistance.

Figure 8A:
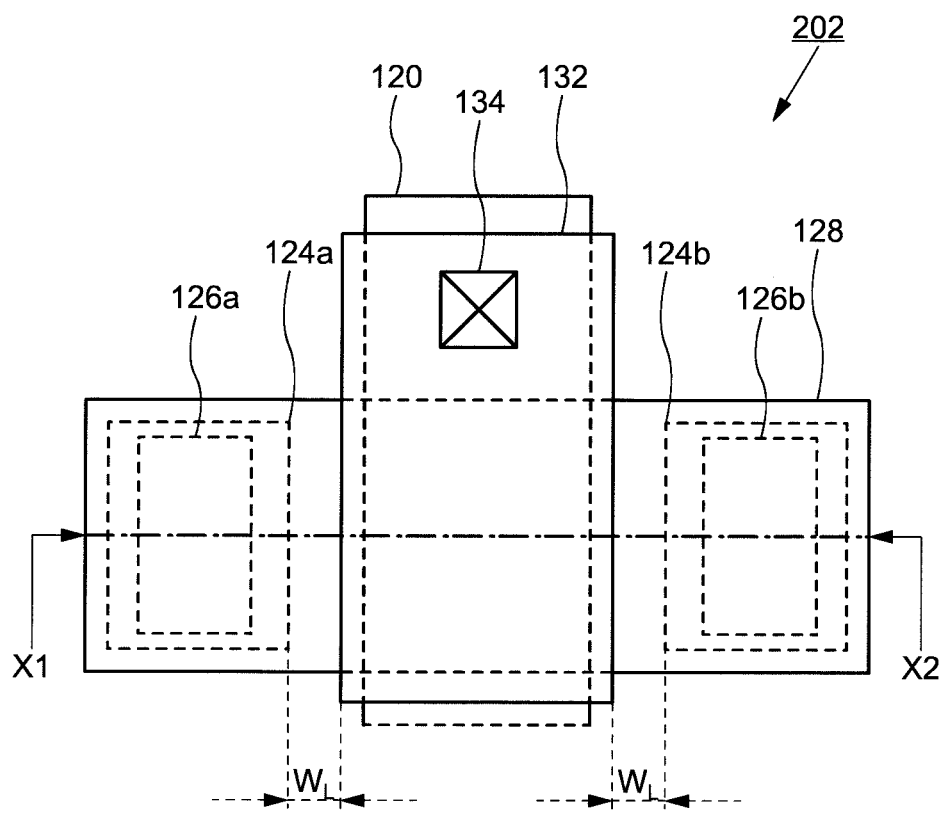
FIG. 8A is a plan view of a transistor in a liquid crystal display device according to an embodiment of the present invention.
Figure 8B:
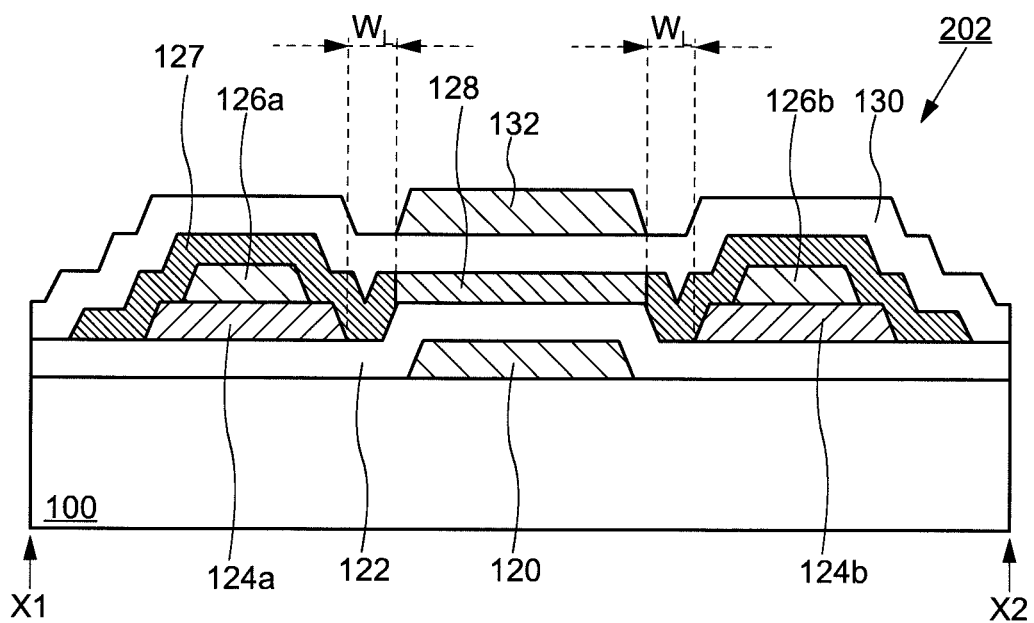
FIG. 8B is a cross-sectional view of a transistor in a liquid crystal display device according to an embodiment of the present invention.

FIGS. 8A and 8B show modifications of the first structure of the transistor 202. FIG. 8A shows a plan view of transistor 202. FIG. 8B shows a cross-sectional structure of transistor 202 corresponding to the X1-X2 line shown in FIG. 8A.

The transistor 202 shown in FIGS. 8A and 8B has a structure in which the oxide semiconductor layer 128 is irradiated with a laser beam to form a low resistance region 127 in the oxide semiconductor layer 128. The low resistance region 127 is formed in a region outside a region where the oxide semiconductor layer 128 overlaps the second gate electrode 132.

The laser beam used for this processing is preferably a laser beam of a short wavelength in order to allow the oxide semiconductor having a wide band gap to absorb the light. For example, it is preferable to irradiate ultraviolet laser light such as KrF excimer laser light (wavelength: 248 nm), XeCl excimer laser light (wavelength: 308 nm), and XeF excimer laser light (wavelength: 351 nm). When the oxide semiconductor layer 128 is irradiated with a laser beam, for example, oxygen deficiency (donor) is generated, and the resistance of the irradiated region is reduced. Further, instead of irradiating the oxide semiconductor layer 128 with laser light, it is also possible to obtain the same effect (Ar) by irradiating the oxide semiconductor layer 128 with ions of an inert gas such as argon (low resistance).

The low resistance region 127 can be formed in the oxide semiconductor layer 128 in a self-aligned manner. That is, the second gate electrode 132 functions as a mask for shielding the laser beam, and the low resistance region 127 can be formed outside the region where the oxide semiconductor layer 128 overlaps the second gate electrode 132 by irradiating the laser beam from the side of the second gate electrode 132.

The ends of the first oxide conductive layer 124a and the second oxide conductive layer 124b can be disposed so as not to overlap the first gate electrode 120 and the second gate electrode 132 by arranging the low resistance region 127. The distance between ends of the first oxide conductive layer 124a and the second oxide conductive layer 124b and the first gate electrode 120 and the second gate electrode 132 (offset Width WO can be 0.5 μm to 2.0 μm.

The transistor 202 shown in FIGS. 8A and 8B includes an oxide semiconductor layer 128 formed with a low resistance region 127 in a self-aligned manner. The channel length of the transistor 202 is formed in a self-aligned manner by the low-resistance region 127, and variation in characteristics is reduced. The transistor 202 in which the low-resistance region 127 is formed in the oxide semiconductor layer 128 can increase the ON-current.

2-2. Example of Second Structure of Transistor

Figure 9:
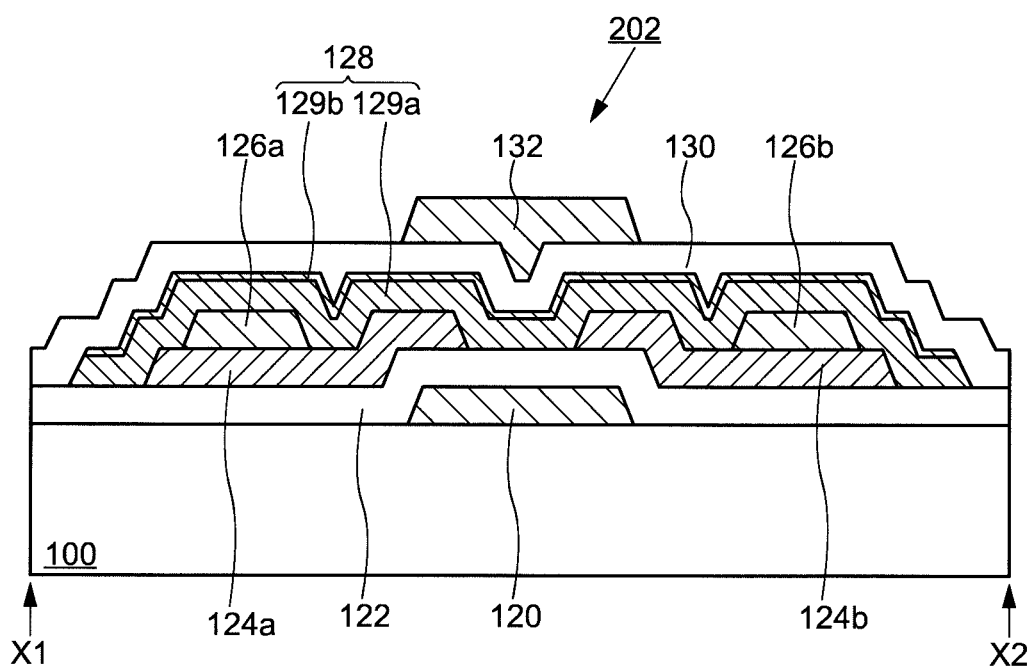
FIG. 9 is a cross-sectional view of a transistor in a liquid crystal display device according to an embodiment of the present invention.

FIG. 9 shows a schematic cross-sectional view of the transistor 202 according to a second exemplary structure. In contrast to the example of first structure, the example of second structure has a different structure of the oxide semiconductor layer 128. The following explanation focuses on the parts that differ from the first structural example.

The oxide semiconductor layer 128 includes at least two regions. Specifically, as shown in FIG. 9, the oxide semiconductor layer 128 includes a first region 129a and a second region 129b. The first region 129a exists on the first gate electrode 120 side, and the second region 129b exists on the second gate electrode 132 side, in the oxide semiconductor layer 128. FIG. 9 shows that the oxide semiconductor layer 128 has a clear boundary between the first region 129a and the second region 129b, but the first region 129a and the second region 129b may not have a clear boundary. The first region 129a occupies the majority in the oxide semiconductor layer 128, and the second region 129b exists as a thin region of the surface layer. The second region 129b is an extremely thin region with respect to the first region 129a, for example, when the first region 129a has a film thickness of 30 nm to 100 nm, the second region 129b has a film thickness of 2 nm to 10 nm and ⅒ or less.

In the oxide semiconductor layer 128, the first region 129a and the second region 129b have different physical properties. For example, the first region 129a and the second region 129b have different carrier concentrations (majority carrier concentration). That is, the carrier concentration in the first region 129a is lower than that in the second region 129b. As an example, when the carrier concentration in the first region 129a is in the range of $1\times10^{15}/cm^3$ or more and $5\times10^{18}/cm^3$ or less, the carrier concentration in the second region 129b is in the range of $1\times10^{11}/cm^3$ or more and less than $1\times10^{15}/cm^3$. Correspondingly, the conductivity of the first region 129a ranges from $1\times10^{-5}$ S/cm to $1\times10^{1}$ S/cm, while the conductivity of the second region 129b ranges from $1\times10^{-10}$ S/cm to less than $1\times10^{-5}$ S/cm.

The oxide semiconductor layer 128 may have a different crystallization rate between the first region 129a and the second region 129b. For example, the first region 129a is amorphous or amorphous and nanocrystal are mixed, while the second region 129b is nanocrystal or nanocrystal and amorphous are mixed. When the first region 129a and the second region 129b are in a mixed of amorphous and nanocrystal, the ratio of the nanocrystal is higher in the second region 129b than in the first region 129a. The second region 129b may contain faceted crystal grains having a larger particle size in addition to or in place of the nanocrystals.

The first region 129a and the second region 129b are formed by changing the deposition conditions. For example, when the oxide semiconductor layer 128 is formed by a sputtering method, the first region 129a is formed by using a noble gas such as argon (Ar) as a sputtering gas, and the second region 129b is formed by using a noble gas such as argon (Ar) and oxygen ($O_2$) gas as a sputtering gas. When the oxide semiconductor layer 128 is formed by the sputtering method, the first region 129a and the second region 129b are continuously formed while maintaining the glow discharge, but by increasing the oxygen partial pressure (the ratio of oxygen (Ar) to argon ($O_2$)) at the time of forming the second region 129b, the donor defect can be reduced, the crystallization rate can be improved, and a dense region (areas of high density) can be formed.

The first region 129a and the second region 129b of the oxide semiconductor layer 128 differ only in the crystallization rate and may have the same composition. In the oxide semiconductor layer 128, although the first region 129a and the second region 129b are the same kind of metal oxide, the composition may be different. Further, the first region 129a and the second region 129b may have different compositions and different crystallization ratio. For example, when the oxide semiconductor layer 128 is formed of an $In_2O_3$—$Ga_2O_3$—ZnO-based oxide material, by changing the sputtering conditions as described above, the first region 129a can be in an amorphous state or a state in which amorphous and nanocrystals are mixed, and the second region 129b can be in a nanocrystalline state or a state in which nanocrystalline and polycrystalline are mixed. When both the first region 129a and the second region 129b are in a mixed state of amorphous and nanocrystal, the ratio of the nanocrystal in the second region 129b can be made larger than that in the first region 129a.

Figure 10:
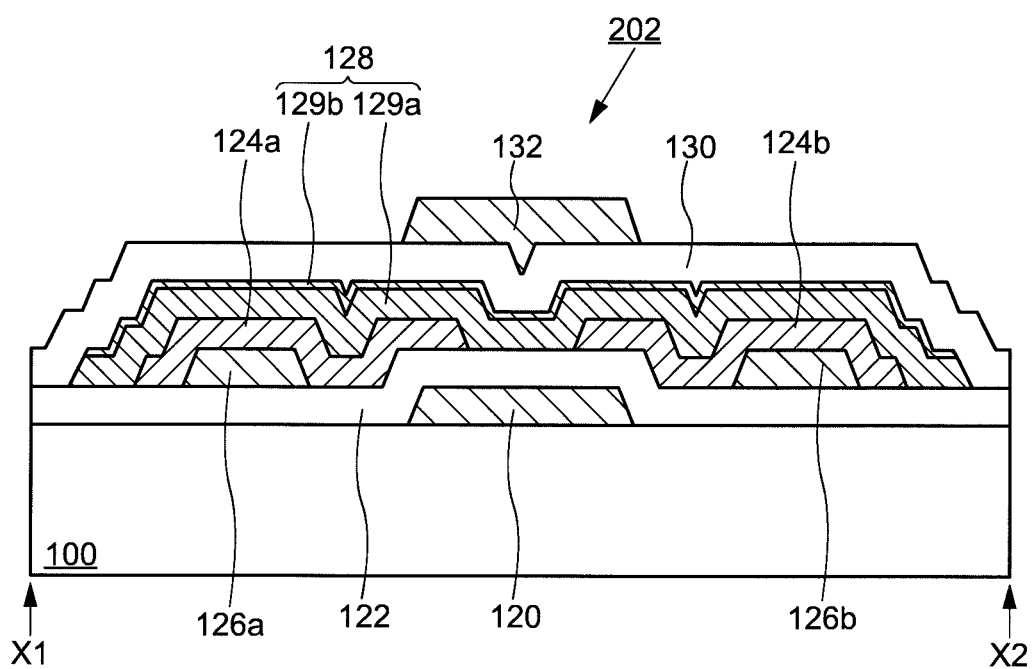
FIG. 10 is a cross-sectional view of a transistor in a liquid crystal display device according to an embodiment of the present invention.

As shown in FIG. 10, the transistor 202 may have a structure in which the first metal layer 126a and the second metal layer 126b are provided on the first insulating layer 122, and the first oxide conductive layer 124a and the second oxide conductive layer 124b are arranged on the upper side. According to such a structure, substantially the entire upper surfaces of the first oxide conductive layer 124a and the second oxide conductive layer 124b (and sides) come into contact with the oxide semiconductor layer 128, so that the contact resistance can be further reduced. In the transistor 202 as shown in FIG. 10, since the first metal layer 126a and the second metal layer 126b and the first oxide conductive layer 124a and the second oxide conductive layer 124b need to be patterned using different photomasks, the number of photomasks is increased as compared with the transistor shown in FIG. 9 (with an increase in photolithographic steps). However, as for the reliability of the transistor 202, good characteristics can be obtained as in the case of the transistor shown in FIG. 9.

Figure 11:
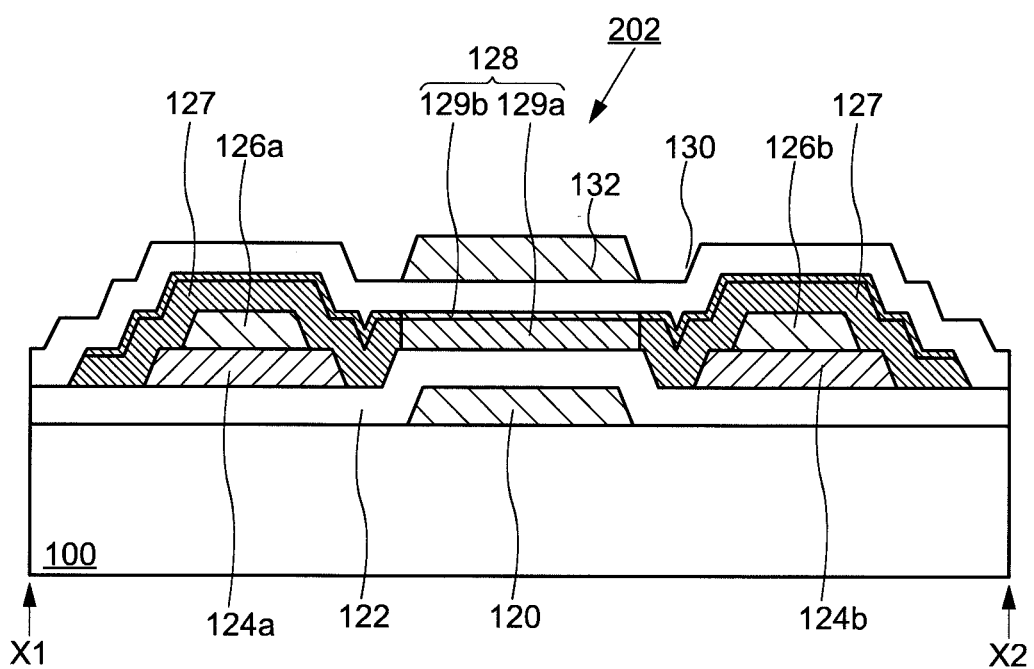
FIG. 11 is a cross-sectional view of a transistor in a liquid crystal display device according to an embodiment of the present invention.

FIG. 11 shows a modification of the second structure of the transistor 202. As shown in FIG. 11, the oxide semiconductor layer 128 may include a low resistance region 127. The low resistance region 127 may include the first region 129a and the second region 129b. That is, even when the oxide semiconductor layer 128 includes the first region 129a and the second region 129b, the transistor 202 in which the source region and the drain region are formed in a self-aligned manner can be formed.

Figure 12A:
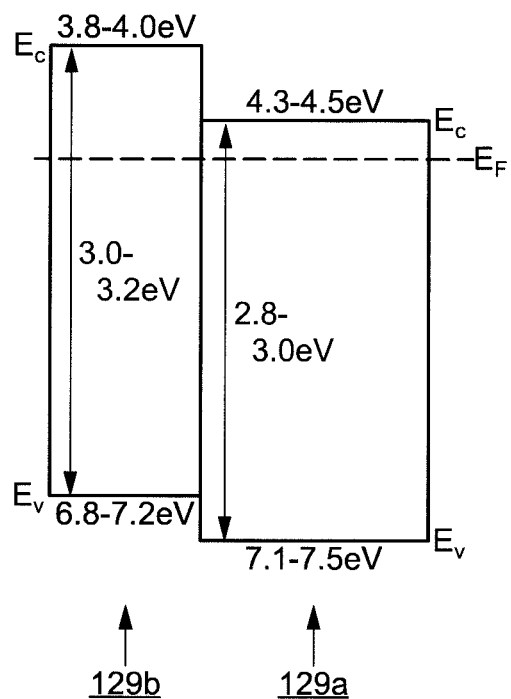
FIGS. 12A, 12B, and 12C are energy band diagrams for explaining the structure and operation of a transistor in a liquid crystal display device according to an embodiment of the present invention.

In FIG. 9, in a case where the first region 129a and the second region 129b of the oxide semiconductor layer 128 have the same composition, when the ratios of the nanocrystals (crystallization rate) in these two regions are different, the band gap energy of the respective regions are different. That is, the band gap of the first region 129a becomes smaller than the band gap of the second region 129b. For example, when the composition of the oxide semiconductor layer 128 is the same, and the band gap of the first region 129a is 2.8 eV or more and less than 3.0 eV, the band gap of the second region 129b having a high crystallization rate is 3.0 eV or more and 3.2 eV or less. With the difference in the crystallization rate, the work function of the first region 129a becomes larger than that of the second region 129b. FIG. 12A shows this state in an energy band diagram. In a state where the first region 129a and the second region 129b are laminated, the energy level (Ec) of the bottom of the conduction band of the second region 129b is higher than the energy level (Ec) of the bottom of the conduction band of the first region 129a. For example, the energy level (Ec) of the bottom of the conduction band in the first region 129a is preferably higher than the energy level (Ec) of the bottom of the conduction band in the second region 129b, and the absolute value of the difference is preferably 0.3 eV or more.

When the oxide semiconductor layer 128 having such a band structure is applied to the transistor 202, it is understood that a buried channel structure is formed as described below. The second region 129b exists between the first insulating layer 122 corresponding to the gate insulating layer and the first region 129a, and forms an energy barrier to electrons in the valence band. In the oxide semiconductor layer 128, the carrier concentration of the first region 129a is higher than that of the second region 129b, so that the channel region of the transistor 202 is formed in the first region 129a. In other words, the channel region of the transistor 202 is formed at a position away from the interface between the first insulating layer 122 functioning as a gate insulating layer and the oxide semiconductor layer 128 (position separated by the thickness of the second region 129b). The oxide semiconductor layer 128 having the first region 129a and the second region 129b forms a buried channel structure in the transistor 202. The buried channel provides a carrier flow that is not affected by the interface between the first insulating layer 122 and the oxide semiconductor layer 128.

Figure 12B:
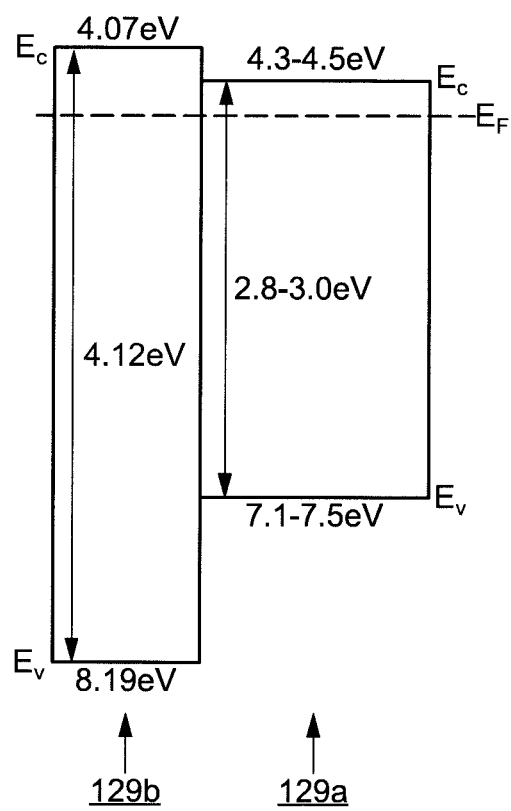

FIG. 12B shows an example of a band diagram when different compositions of oxide materials are used for the first region 129a and the second region 129b of the oxide semiconductor layer 128. For example, in the oxide semiconductor layer 128, the first region 129a is formed of an $In_2O_3$—$Ga_2O_3$—$SnO_2$—$ZnO$-based oxide material, an $In_2O_3$—$Ga_2O_3$-$SnO_2$-based oxide material, or an $In_2O_3$—$Ga_2O_3$—$ZnO$-based oxide material, and the second region 129b is formed of gallium oxide material such as a $Ga_2O_3$-based oxide material, a Ga—$SnO_x$-based oxide material, or a Ga—$SiO_x$-based oxide material. The gallium oxide is a wide gap material and has a band gap of 4 eV or more. The band gap of the first region 129a can be 3.6 eV or more, and the band gap of the second region 129b can be 4.1 eV by forming the first region 129a and the second region 129b with different materials. For example, the band gap of the $In_2O_3$—$Ga_2O_3$-$SnO_2$-based oxide material forming the first region 129a is 3.6 eV to 3.9 eV, and the band gap of the a-$Ga_2O_3$ forming the second region 129b is 4.3 eV. When the second region 129b is formed of a-$GaSnO_x$, it is band gap is 4.0 eV, and when formed of a-$GaSiO_x$, it is band gap is 4.5 eV or more. Thus, when the second region 129b is formed of gallium oxide, the band gap is larger than that of the first region 129a by 1.0 eV or more.

FIG. 12B shows a band diagram of the first region 129a and the second region 129b when the oxide material as described above is used. The band gap of the first region 129a is smaller than that of the second region 129b, and the work function of the first region 129a is larger than that of the second region 129b. Thus, as in the band diagram shown in FIG. 12A, when the first region 129a and the second region 129b are laminated, the energy level (Ec) of the bottom of the conduction band in the second region 129b is higher than that in the first region 129a. Since the oxide semiconductor layer 128 has such a structure, the channel region of the transistor 202 is formed at a position away from the interface between the first insulating layer 122 and the oxide semiconductor layer 128. In other words, the transistor 202 has a structure in which carriers (electron) are not trapped at the interface between the first insulating layer 122 and the oxide semiconductor layer 128.

When the second region 129b of the oxide semiconductor layer 128 is formed of a gallium-based oxide material, the second region 129b has a band gap larger than the first region 129a by 1 eV or more. For example, the band gap of the polycrystalline gallium oxide ($Ga_2O_3$) used in the second region 129b is 4.8 eV to 4.9 eV, and the band gap of the $In_2O_3$—$Ga_2O_3$—$ZnO$-based oxide material used in the first region 129a is 2.8 to 3.0 eV. Therefore, the difference in the band gap between the first region 129a and the second region 129b is 1 eV or more. The buried channel can be formed in the transistor 202, by forming the first region 129a and the second region 129b of the oxide semiconductor layer 128 with the material described above.

The oxide material constituting the first region 129a may further contain silicon (Si) at a ratio of 0.5 atomic % or more and 5 atomic % or less. The carrier concentration of the first region 129a can be enhanced by including silicon in the oxide material constituting the first region 129a, the field effect mobility of the transistor 202 can be enhanced, the heat resistance can be enhanced, and the threshold voltage can be controlled.

The oxide semiconductor layer 128 includes a second region 129b having a carrier concentration and conductivity lower than those of the first region 129a. The oxide semiconductor layer 128 includes the second region 129b having a higher crystallization rate than the first region 129a.

Therefore, the oxide semiconductor layer 128 has a dense structure in which the density of the surface layer portion is high. Further, the oxide semiconductor layer 128 includes a second region 129b having a large energy gap with respect to the first region 129a. The transistor 202 has an oxide semiconductor layer 128 in which the second region 129b is laminated on the first region 129a, so that the channel can be formed in the oxide semiconductor layer 128.

The ion sheath disappears when the glow discharge is stopped at the end of film deposition when the oxide semiconductor layer is formed by the sputtering method. However, even when the glow discharge is stopped, sputtered particles remaining in the gas phase are deposited on the surface of the oxide semiconductor layer, and a surface layer region having a low density is formed in the oxide semiconductor layer. This low-density surface region includes defects and adversely affects the characteristics of the transistor. On the other hand, in the present embodiment, the second region 129b is intentionally formed in a region corresponding to the surface layer of the oxide semiconductor layer 128. The transistor 202 has such structure that the channel region can be formed away from the interface between the gate insulating layer and the oxide semiconductor layer as described above, so that the characteristic deterioration can be prevented.

Since the oxide semiconductor layer 128 has the first region 129a and the second region 129b, the electric charge trapped at the interface between the first insulating layer 122 and the oxide semiconductor layer 128 is reduced in the transistor 202. As a result, the transistor 202 can reduce the shift (change) amount of the threshold voltage. Since the transistor 202 has a buried channel structure, a leakage current flowing in the interface between the first insulating layer 122 and the oxide semiconductor layer 128 can be suppressed, and an off current can be reduced. Further, as shown in FIG. 9, since the first oxide conductive layer 124a and the second oxide conductive layer 124b having high conductivity and contact with the first region 129a, the on-current of the transistor 202 can be increased. Thus, the transistor 202 can obtain a ratio of an on-current to an off-current of about $1 \times 10^9$ to $1 \times 10^{12}$ (on-off ratio).

Figure 12C:
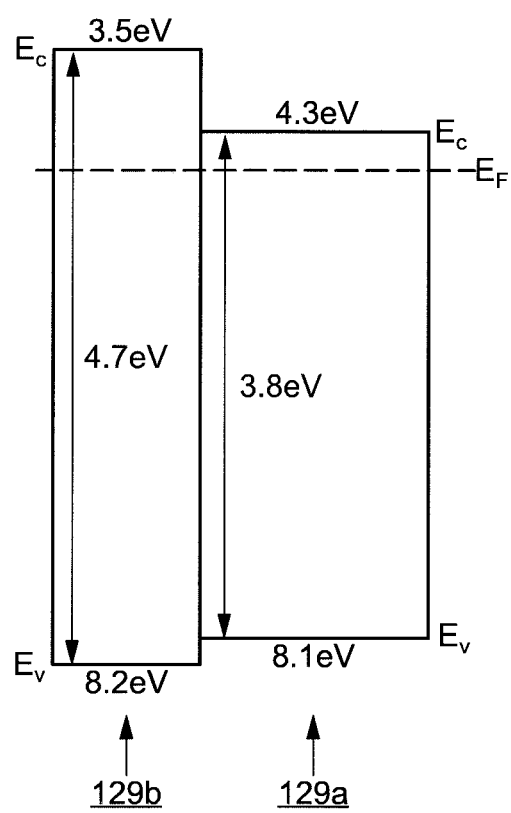

As shown in FIG. 12C, when $InGaSnO_x$ or $InGaSmO_x$ having a band gap of 3.8 eV is used in the first region 129a and $Ga_2O_3$ having a band gap of 4.7 eV is used in the second region 129b, even if the substrate temperature for forming the second insulating layer 130 is raised to 250° C. or higher, $Ga_2O_3$ is not reduced by hydrogen (H) contained in silane ($SiH_4$) used as a film forming gas, so that the oxide semiconductor layer 128 does not become a conductor. Therefore, the second insulating layer 130 of good quality can be formed.

The transistor 202 includes an oxide semiconductor layer 128 having the band gap of 3.6 eV or more, thereby preventing absorption of light having a wavelength of 450 nm, which is a component of blue light, out of the light irradiated from the backlight, so that reliability in actual operation of the liquid crystal display device can be greatly improved.

Although not shown in FIGS. 12A to 12C, an intermediate region of the oxide semiconductor in which the carrier concentration varies stepwise or continuously may exist between the first region 129a and the second region 129b. The intermediate regions of the oxide semiconductor may be formed together with the first region 129a and the second region 129b in the same oxide semiconductor layer or may be formed separately as different oxide semiconductor layers. The transistor 202 shown in this embodiment is applicable not only as a liquid crystal display device but also as an element constituting a backplane of an organic electroluminescent display device (also called organic EL display) and a micro-LED display device.

Pixels (and drive circuit) of a liquid crystal display device according to an embodiment of the present invention is formed by the transistor having the structure described above. Next, the liquid crystal display device according to an embodiment of the present invention will be described in detail.

3. Driving Mode for Liquid Crystal Display Device

The liquid crystal display device according to the present embodiment will be described in detail. The liquid crystal display device includes the transistors described in the previous section. In this section, the structure of the liquid crystal display device corresponding to various modes is shown.

3-1. FFS Mode Liquid Crystal Display Device

As an example of the liquid crystal display device according to an embodiment of the present invention, a liquid crystal display device having FFS mode pixels will be described.

3-1-1. First Embodiment

This embodiment shows a structure of a liquid crystal display device 200a having FFS mode pixels using the transistors shown in FIG. 7B or FIG. 9, and a method of manufacturing the liquid crystal display device 200a.

3-1-1-1. Pixel Configuration

Figure 13:
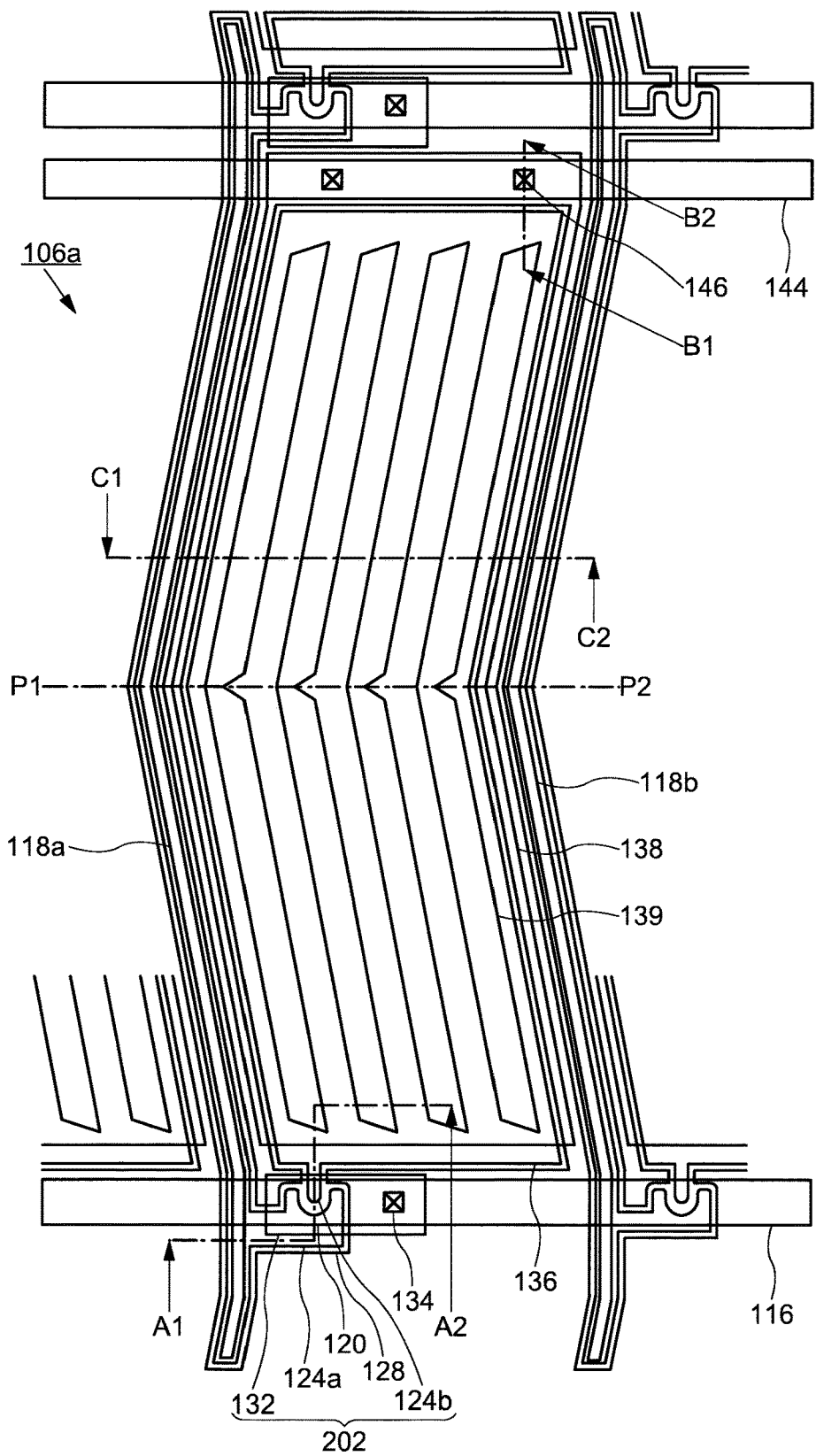
FIG. 13 is a plan view of pixel of a liquid crystal display device according to an embodiment of the present invention.
Figure 14A:
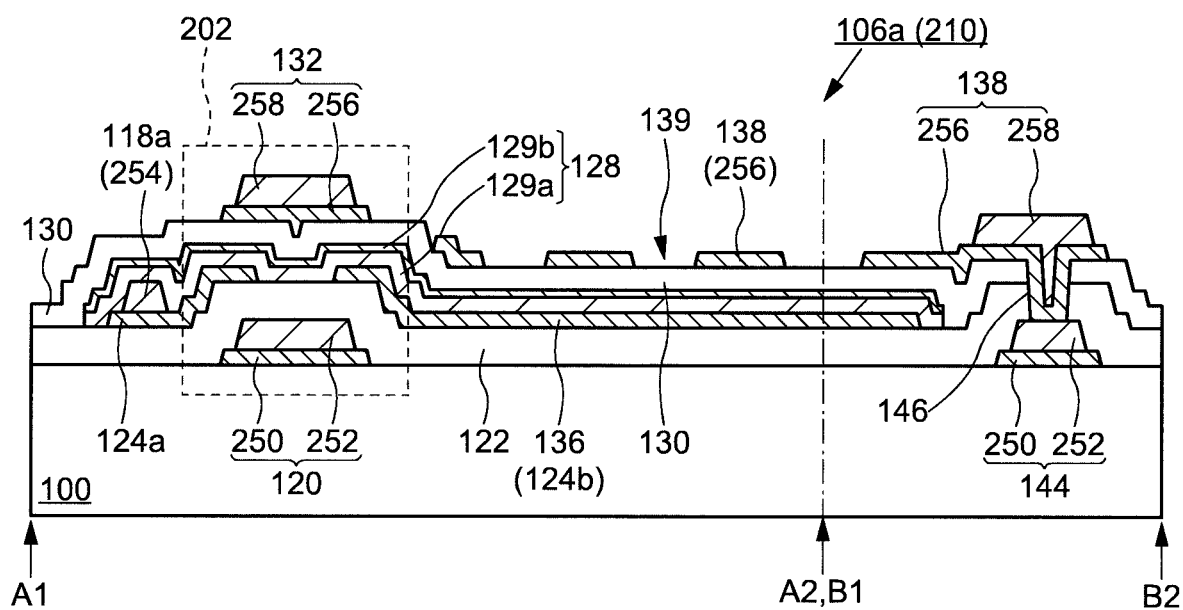
FIG. 14A shows a cross-sectional view corresponding to lines A1-A2 and B1-B2 of the pixel shown in FIG. 13.
Figure 14B:
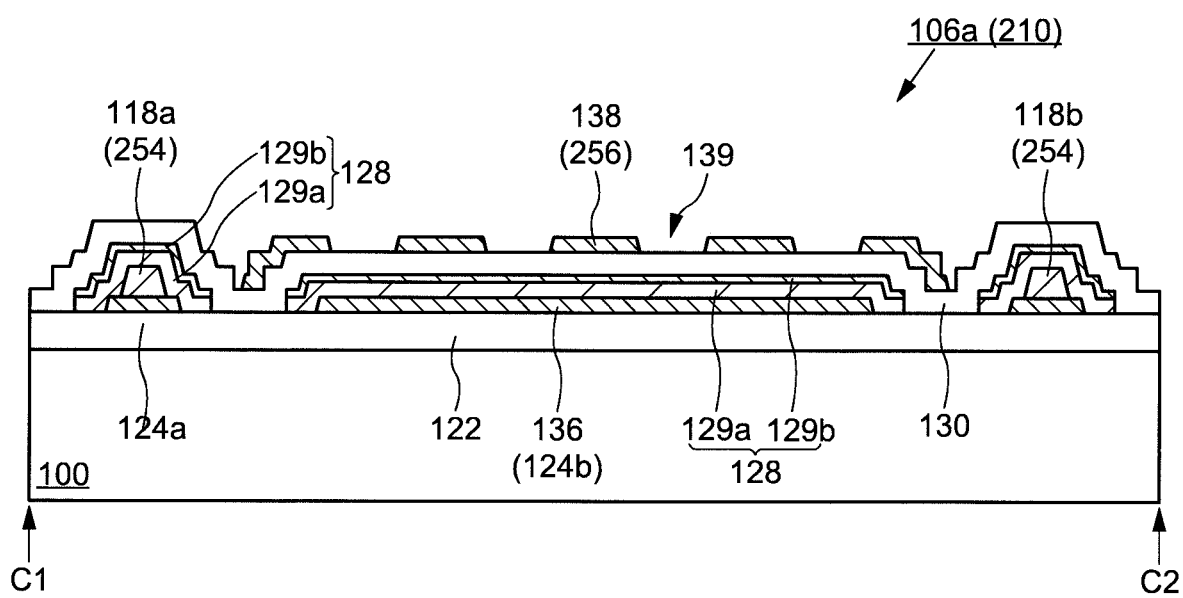
FIG. 14B shows a cross-sectional view corresponding to the line C1-C2 of the pixel shown in FIG. 13.

FIG. 13 is a schematic plan view of the pixel 106a in the liquid crystal display device 200a according to the present embodiment. The cross-sectional structure of FIG. 13 along lines A1-A2 and B1-B2 are shown in FIG. 14A, and the cross-sectional structure along line C1-C2 is shown in FIG. 14B.

In this embodiment, an element substrate refers to a substrate (also referred to as backplane) on which transistors and pixel electrodes for driving a liquid crystal are formed. On the other hand, an opposite substrate refers to a substrate which is disposed opposite to the element substrate and on which a color filter is appropriately formed. The liquid crystal display device 200a according to the present embodiment is assumed to be a transmission type.

As shown in FIG. 13, the pixel 106a includes the transistor 202, a pixel electrode 136, and a common electrode 138. The pixel electrode 136 is electrically connected to the transistor 202. The pixel electrode 136 is insulated from the common electrode 138 by at least one insulating layer (not shown). The pixel electrode 136 and the common electrode 138 are surrounded by the scanning signal line 116, the data signal line 118a, the data signal line 118b, and a common line 144. The scanning signal lines 116 and the common lines 144 are arranged to extend in the first direction, and the data signal lines 118a, 118b are arranged to extend in the second direction crossing the first direction. The data signal lines 118a, 118b are disposed so as to cross the scanning signal line 116 and the common line 144 with at least one insulating layer (not shown) therebetween. The data signal line 118a is electrically connected to the transistor 202, and the data signal line 118b is electrically connected to a transistor of an adjacent pixel.

The transistor 202 has a dual gate structure in which the oxide semiconductor layer 128 is sandwiched between the first gate electrode 120 and the second gate electrode 132. As shown in FIG. 13, the oxide semiconductor layer 128 is provided so as to overlap the pattern of the data signal line 118a and the pixel electrode 136. The scanning signal line 116 is arranged on the first surface side of the oxide semiconductor layer 128. The scanning signal line 116 has a region overlapping the oxide semiconductor layer 128. The region where the scanning signal line 116 and the oxide semiconductor layer 128 overlap substantially functions as the first gate electrode 120. The scanning signal line 116 serves both as a wiring for transmitting a scanning signal and as a gate electrode (the first gate electrode 120) of the transistor 202. The conductive pattern having these two functions can improve the aperture ratio of the pixel 106a. The second gate electrode 132 is arranged so that at least a part thereof overlaps with the first gate electrode 120. The first gate electrode 120 and the second gate electrode 132 are provided with at least one insulating layer (not shown) interposed therebetween. The first gate electrode 120 and the second gate electrode 132 are electrically connected through the first contact hole 134.

The first oxide conductive layer 124a has a continuous pattern from the data signal line 118a, and the second oxide conductive layer 124b has a continuous pattern from the pixel electrode 136. In other words, the first oxide conductive layer 124a forms the data signal line 118a, and the second oxide conductive layer 124b forms the pixel electrode 136. More specifically, the first oxide conductive layer 124a is electrically connected to the data signal line 118a, and the second oxide conductive layer 124b is electrically connected to the pixel electrode 136.

As shown in FIG. 13, the pixel electrode 136 has a continuous plate pattern without slit. The pixel electrode 136 is formed of the same oxide conductive material as the second oxide conductive layer 124a. Specifically, the pixel electrode 136 is formed of a translucent conductive film such as indium tin oxide (ITO), indium zinc oxide (IZO), zinc oxide to which aluminum is added (AZO), zinc oxide to which gallium is added (GZO), titanium oxide to which niobium is added (TiO$_x$:Nb), and titanium oxide to which tantalum is added (TiO$_x$:Ta).

The common electrode 138 is arranged so as to overlap with the pixel electrode 136. The common electrode 138 has at least one first slit 139. The at least one first slit 139 is formed by a through hole through the common electrode 138. The common electrode 138 includes at least one, preferably a plurality of first slits 139. The common electrode 138 is formed of an oxide conductive material having the same translucency as that of the pixel electrode 136. The common electrode 138 may be formed of a metal such as aluminum (Al) (non-translucent conductive material) by having the plurality of first slits 139. The common electrode 138 is electrically connected to the common wiring 144. The common electrode 138 is electrically connected through a second contact hole 146 provided in at least one insulating layer (not shown) to the common wiring 144.

Since the common electrode 138 provided with the at least one first slit 139 is arranged on the upper layer side (liquid crystal layer side) of the pixel electrode 136 having the plane shape continuous pattern, an electric field generated between the pixel electrode 136 and the common electrode 138 acts on the liquid crystal layer. As shown in FIG. 13, the at least one first slit 139 is elongated in the second direction in the same direction as the direction in which the data signal line 118a extends, and has a structure in which it is bent at a substantially central portion (line P1-P2) of the pixel 106a. The direction in which the liquid crystal molecules oriented by the action of the electric field can also be controlled by the structure of the at least one first slit 139. Since the at least one first slit 139 elongated in the second direction has a structure bent at a substantially central portion (line P1-P2) of the pixel 106a, the directions in which the liquid crystal molecules oriented can be made different between the upper half and the lower half of the pixel 106a. That is, a plurality of regions (also called multidomain) having different directions of orientation of the liquid crystal molecules can be formed in the liquid crystal layer. In the liquid crystal display device 200a, since the pixel 106a has such a configuration, the viewing angle can be widened.

FIGS. 14A and 14B show schematic cross-sectional views of an element substrate 210. As shown in FIG. 14A, the element substrate 210 includes the transistor 202 provided on the first substrate 100, the pixel electrode 136, and the common electrode 138. The transistor 202 has a structure similar to the structure shown in any of FIGS. 7A and 7B, FIG. 8, FIG. 9, FIG. 10, and FIG. 11. The transistor 202 has a structure in which the first gate electrode 120, the first insulating layer 122, the first oxide conductive layer 124a, the second oxide conductive layer 124b, the oxide semiconductor layer 128, the second insulating layer 130, and the second gate electrode 132 are laminated. FIG. 14A shows a configuration in which the oxide semiconductor layer 128 includes the first region 129a and the second region 129b. However, as shown in FIG. 7B, the oxide semiconductor layer 128 may be formed of substantially mono layer (only the first region 129a).

The materials of the first insulating layer 122 and the second insulating layer 130 are not limited. The first insulating layer 122 and the second insulating layer 130 are preferably formed of an oxide-based insulating material such as silicon oxide or aluminum oxide. The first insulating layer 122 and the second insulating layer 130 may have a structure in which a silicon nitride film and a silicon oxide film or an aluminum oxide film are laminated.

The first insulating layer 122 is preferably formed to a thickness of 200 nm to 800 nm, for example, 400 nm. When the screen size of the liquid crystal display device 200a is about 4 to 6 inches, the second insulating layer 130 is preferably formed to a thickness of 100 nm to 400 nm, for example, 200 nm. When the screen size of the liquid crystal display device 200a is about 10 to 27 inches, the second insulating layer 130 is preferably formed to a thickness of 200 nm to 600 nm, for example, 300 nm. When the screen size of the liquid crystal display device 20a is 30 inches or larger, the second insulating layer 130 is preferably formed to have a thickness of 200 nm to 800 nm, for example, 350 nm. Different voltages are applied to the pixel electrode 136 and the common electrode 138. The second insulating layer 130 is interposed to generate capacitance between the pixel electrode 136 and the common electrode 138. This capacitance has the function of holding the potential of the pixel electrode 136 constant. That is, the retention capacitor element is formed by a structure in which the pixel electrode 136, the second insulating layer 130, and the common electrode 138 are laminated. When the screen size of the liquid crystal display device 200a is small, the size of pixels naturally decreases. In this case, it is preferable that the retention capacitor element has a large capacitance by reducing the thickness of the second insulating layer 130. On the other hand, when the screen size of the liquid crystal display device 200a is increased to 30 inches or larger, it is preferable to increase the film thickness of the second insulating layer 130 in order to reliably insulate the pixel electrode 136 from the common electrode 138.

As described above, the first oxide conductive layer 124a extends from the region where the first gate electrode 120 and the second gate electrode 132 are superposed to the outside (opposite side of the channel region), and is in contact with the data signal line 118*a*. In other words, the first oxide conductive layer 124*a* is electrically connected to the data signal line 118*a*. On the other hand, the second oxide conductive layer 124*b* is provided so as to extend from a region where the first gate electrode 120 and the second gate electrode 132 overlap to a region of the pixel electrode 136. As described with reference to FIGS. 9A and 9B, the first oxide conductive layer 124*a* and the second oxide conductive layer 124*b* form input/output terminals of the transistor 202. The pixel 106*a* has a structure in which the transistor 202 is connected to the data signal line 118*a* by the first oxide conductive layer 124*a* and connected to the pixel electrode 136 by the second oxide conductive layer 124*b*. The contact hole of the pixel 106*a* is omitted by this connection structure. The pixel 106*a* has a simplified structure and an improved aperture ratio. The pixel 106*a* according to an embodiment of the present invention does not have a structure in which a contact hole is formed to connect the pixel electrode and the transistor like a conventional liquid crystal display panel. Thus, in principle, contact failure does not occur in the pixel 106*a*. In the liquid crystal display device 200*a* according to the present embodiment, it is difficult to form defective pixels even if the number of pixels increases as the definition becomes higher. As a result, the manufacturing yield of the liquid crystal display device 200*a* can be improved.

The structures of the first gate electrode 120 and the second gate electrode 132 are not limited. The first gate electrode 120 and the second gate electrode 132 may have a structure in which a plurality of conductive layers is laminated as shown in FIG. 14A. For example, the first gate electrode 120 may have a structure in which a first conductive layer 250 and a second conductive layer 252 are laminated, and the second gate electrode 132 may have a structure in which a fourth conductive layer 256 and a fifth conductive layer 258 are laminated. The first conductive layer 250 is provided in contact with the first substrate 100 (alternatively, when at least one insulating film is formed on the first substrate 100, the at least one insulating film). The fourth conductive layer 256 is provided in contact with the second insulating layer 130. For the first conductive layer 250, it is preferable to use a high-melting-point metal such as titanium (Ti), molybdenum (Mo), tantalum (Ta), or a molybdenum-titanium alloy (Mo—Ti) in order to enhance adhesion with the underlying surface. Since the fourth conductive layer 256 is also used as a conductive layer for forming the common electrode 138, it is preferable to form it with a light-transmitting conductive material such as ITO or IZO.

The second conductive layer 252 is laminated on the first conductive layer 250, and the fifth conductive layer 258 is laminated on the fourth conductive layer 256. For the second conductive layer 252 and the fifth conductive layer 258, it is preferable to use a low-resistance metal material such as aluminum (Al) or an alloy thereof or copper (Cu) in order to lower the resistance of the gate electrode. In the liquid crystal display device having a screen size of 15 inches or less, molybdenum (Mo), a molybdenum-tantalum alloy (MoTa), a molybdenum-tungsten alloy (MoW) or the like may be applied.

The thicknesses of the first conductive layer 250, the second conductive layer 252, the fourth conductive layer 256, and the fifth conductive layer 258 are arbitrary. For example, the first conductive layer 250 and the fourth conductive layer 256 may be formed to a thickness of 20 nm to 200 nm, and the second conductive layer 252 and the fifth conductive layer 258 may be formed to a thickness of 200 nm to 1000 nm. The structure of the first gate electrode 120 is also applied to the scanning signal line 116. An adhesion with an under surface can be enhanced and the wiring resistance (or electrode resistance) can be reduced by forming the first gate electrode 120 and the scanning signal line 116 in such a laminated structure.

The data signal line 118*a* has a structure in which the first oxide conductive layer 124*a* is laminated with a third conductive layer 254. The third conductive layer 254 is formed of copper (Cu), aluminum (Al) or an alloy thereof in order to reduce wiring resistance. For example, in a liquid crystal display device having a screen size of 15 inches or less, molybdenum (Mo) can be applied. Although not shown in FIGS. 14A and 14B, the third conductive layer 254 may have a laminated structure in which a high melting point metal layer such as titanium (Ti) or molybdenum (Mo) is provided on the upper layer side and the lower layer side of aluminum (Al) in order to enhance heat resistance. The data signal line 118*a* may have a structure covered with the oxide semiconductor layer 128. Since the data signal line 118*a* has such a layer structure, it can be prevented from being peeled off from the under surface, and high resistance due to oxidation can be prevented in the manufacturing process. Since the data signal line 118 a is not connected to the first oxide conductive layer 124*a* through the contact hole but the two layers are directly laminated, the contact area is increased, and the contact resistance can be reduced. Such the connection structure of the wiring and the transistor effectively works when the pixel is miniaturized.

As shown in FIGS. 14A and 14B, the common electrode 138 is provided on the second insulating layer 130. The common electrode 138 is formed of the same conductive film as the fourth conductive layer 256 forming the second gate electrode 132. In FIG. 14A, as shown in the section of line B1-B2, the common electrode 138 is electrically connected to the common line 144 by a second contact hole 146 through the first insulating layer 122 and the second insulating layer 130. Since the common electrode 138 has a structure in which the fourth conductive layer 256 and the fifth conductive layer 258 are laminated in a region overlapping the second contact hole 146, an increase in contact resistance is prevented. In other words, since the film thickness of the fifth conductive layer 258 is thicker than that of the fourth conductive layer 256, the step coverage can be improved by arranging the fifth conductive layer 258 so as to overlap with the second contact hole 146, and the high resistance of the contact resistance can be prevented. The common wiring 144 is provided between the first substrate 100 and the first insulating layer 122 and is formed in the same layer structure as the scanning signal line 116. On the other hand, the common electrode 138 is formed of only the fourth conductive layer 256 in a region overlapping the pixel electrode 136. With this structure, it is possible to prevent a large step from being formed in the region where the liquid crystal is driven by the pixel electrode 136, and it is possible to reduce the alignment disturbance (disclination) of the liquid crystal.

FIG. 14B shows a cross-sectional structure of a portion of the pixel 106*a* where the transistor 202 is not provided. The pixel electrode 136 is provided between the data signal line 118*a* and the data signal line 118*b* of an adjacent pixel. The pixel electrode 136 is formed of a light-transmitting conductive film such as ITO or IZO as described above. As shown in FIG. 14B, the upper surface of the pixel electrode 136 may be covered with an oxide semiconductor layer 128.

Since the band gap of the oxide semiconductor layer 128 is almost the same as that of the transparent conductive film, the oxide semiconductor layer has translucency. The oxide semiconductor layer 128 has conductivity as a semiconductor. Therefore, the oxide semiconductor layer 128 overlapping the pixel electrode 136 can be regarded as a part of the pixel electrode.

Figure 15:
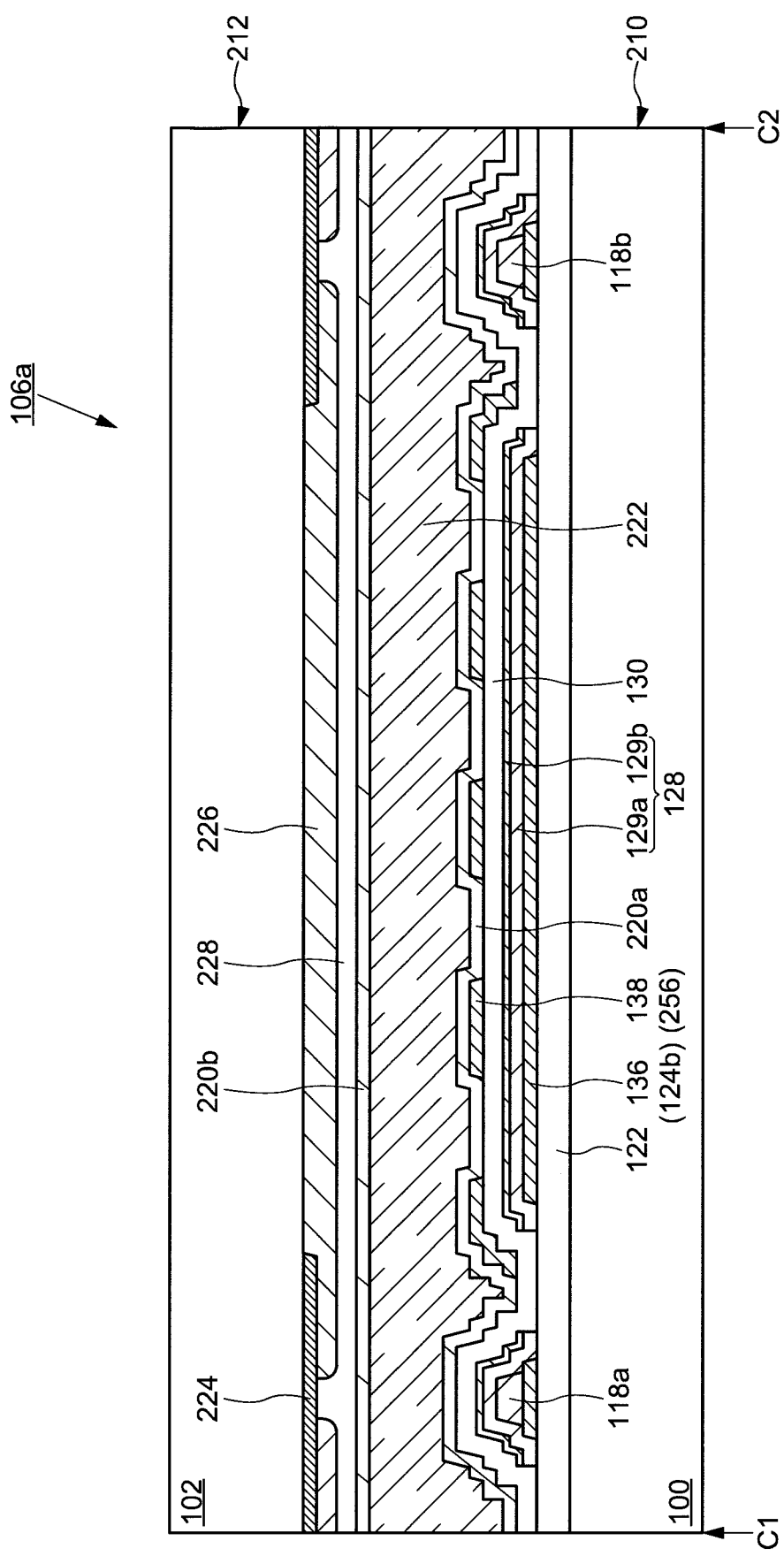
FIG. 15 is a cross-sectional view of a pixel of a liquid crystal display device according to an embodiment of the present invention, showing a structure in which, an element substrate, an opposite substrate, and a liquid crystal layer are arranged.

FIG. 15 shows the cross-sectional structure of the pixel 106a along the line C1-C2 shown in FIG. 13. Specifically, in contrast to the structure of the element substrate 210 shown in FIG. 14B, an opposite substrate 212 and a liquid crystal layer 222 are provided.

The element substrate 210 is provided with an alignment film 220a so as to cover the common electrode 138. The opposite substrate 212 includes the second substrate 102, and has a structure in which a light shielding layer 224, a color filter layer 226, an overcoat layer 228, and an alignment film 220b are provided on the second substrate 102. The light shielding layer 224 is provided so as to surround the boundary region of the pixel 106a, and the color filter layer 226 is provided so as to overlap the pixel electrode 136. In this embodiment, since the liquid crystal display device 200a is an FFS mode, the alignment films 220a, 220b are horizontal alignment films. The liquid crystal layer 222 is provided between the element substrate 210 and the opposite substrate 212.

As is apparent from the structures shown in FIGS. 14A and 14B and FIG. 15, the liquid crystal display device 200a according to this embodiment includes dual-gate transistor 202, and has a structure in which the scanning signal line 116 is not exposed to the liquid crystal layer 222. The data signal line 118 also has a structure not exposed to the liquid crystal layer 222. In particular, the pixel 106a has such a structure that the scanning signal line 116 is covered with the first insulating layer 122 and the second insulating layer 130, so that the liquid crystal layer 222 is hardly affected by a signal (voltage) applied to the scanning signal line 116.

The second gate electrode 132 is electrically connected to the first gate electrode 120 and arranged at a position near the liquid crystal layer 222. Since the second gate electrode 132 is arranged separately and independently for each pixel, the influence on the entire liquid crystal layer 222 is slight. Rather, the second gate electrode 132 functions so as to locally collect impurity ions in the liquid crystal layer 222, so that the effect of suppressing the deterioration of the liquid crystal layer 222 and preventing the occurrence of display spots can be realized.

3-1-1-2. Structure of the Terminal Part

Figure 16A:
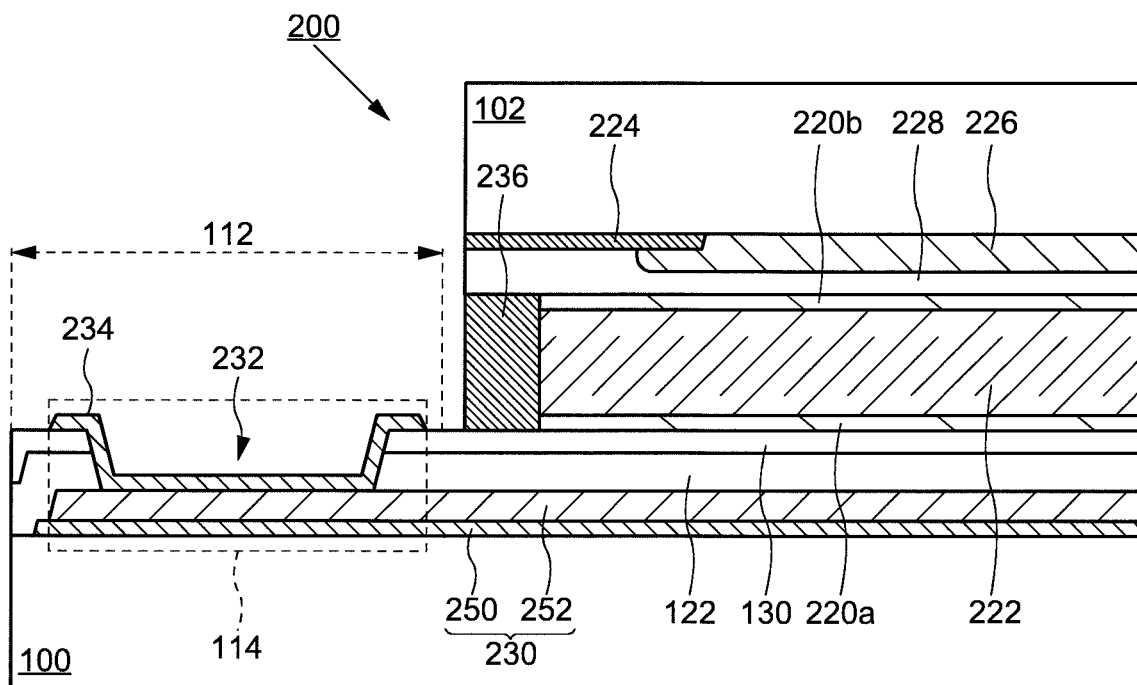
FIGS. 16A and 16B are cross-sectional views of pixels of a liquid crystal display device according to an embodiment of the present invention.

FIG. 16A shows a configuration of the input terminal part 112 of the liquid crystal display device 200a. The input terminal part 112 includes a terminal electrode 114. The terminal electrode 114 is formed of the first conductive layer 250 and the second conductive layer 252. That is, the terminal electrode 114 is formed of the same conductive layer as the first gate electrode 120 (the first conductive layer 250 and the second conductive layer 252). The terminal electrode 114 is electrically connected to a wiring 230 extending from a region where pixels are formed toward an end of the first substrate 100 (in other words, the terminal electrode 114 and the wiring 230 have a continuous structure.). On the upper layer side of the wiring 230, the first insulating layer 122 and the second insulating layer 130 are provided. In the region of the input terminal part 112, an opening 232 from which the first insulating layer 122 and the second insulating layer 130 are removed is provided so that the terminal electrode 114 is exposed. The terminal electrode 114 may be provided with a metal oxide conductive layer 234 superposed on the opening 232. The metal oxide conductive layer 234 is formed of, for example, ITO or IZO and is provided to protect the surface of the second conductive layer 252 formed of a relatively soft metal such as aluminum (Al).

The liquid crystal layer 222 is provided between the element substrate 210 and the opposite substrate 212. The element substrate 210 and the opposite substrate 212 are fixed by a sealing member 236. The sealing member 236 is provided in contact with the second insulating layer 130 on the element substrate 210 side and with the overcoat layer 228 on the opposite substrate 212 side. The sealing member 236 is provided in contact with the second insulating layer 130 formed of the inorganic insulating film, so that the adhesive force increases, and peeling is prevented. The high adhesiveness of the sealing member 236 prevents moisture from entering the liquid crystal layer 222.

Since the wiring 230 electrically connected to the terminal electrode 114 is covered with the first insulating layer 122 and the second insulating layer 130 formed of an inorganic insulating film, the wiring 230 is disposed at a position not directly in contact with the sealing member 236. When the wiring connected to the terminal electrode 114 is formed by the fourth conductive layer 256 and the fifth conductive layer 258 forming the second gate electrode 132, the wiring is in direct contact with the sealing member 236 unless an inorganic insulating film is newly added. In this structure, the structure in which the wiring formed of a metallic material contacts the sealing member 236 causes the adhesive force of the sealing member 236 to decrease. Furthermore, when the wirings are arranged on the second insulating layer 130, steps (unevenness) formed by the wirings lowers the adhesion of the sealing member 236, which may cause moisture to enter the liquid crystal layer 222. In order to prevent such a problem, as shown in FIG. 16A, it is effective to form the terminal electrode 114 and the wiring 230 by the first conductive layer 250 and the second conductive layer 252 forming the first gate electrode 120. According to the liquid crystal display device 200a of the present embodiment, since the adhesion of the sealing member 236 for bonding the element substrate 210 and the opposite substrate 212 can be enhanced, the deterioration of the liquid crystal layer 222 can be prevented and the reliability can be enhanced.

Figure 16B:
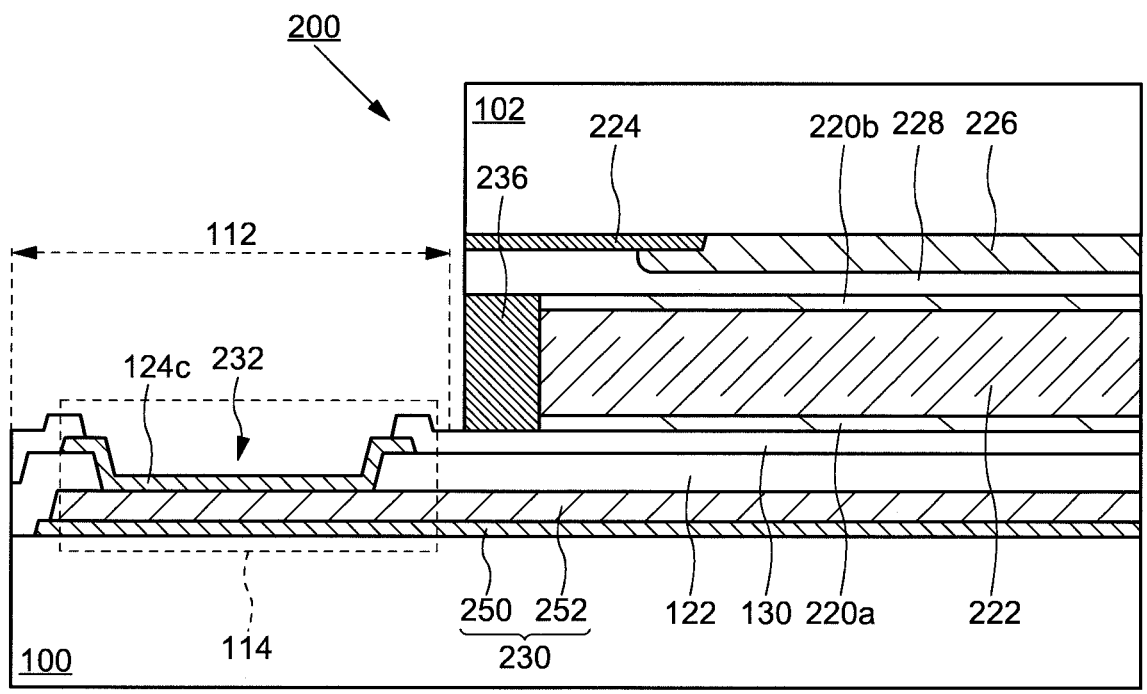

FIG. 16B shows another example of the terminal electrode 114. The terminal electrode 114 is formed of the first conductive layer 250 and the second conductive layer 252, and has a structure in which a third oxide conductive layer 124c is provided superposed on the opening 232. The third oxide conductive layer 124c is a conductive layer formed in the same layer as the first oxide conductive layer 124a and the second oxide conductive layer 124b forming the transistor 202. The step of newly forming the metal oxide conductive layer (separately) for the terminal electrode 114 is not required with this structure, and the manufacturing step can be simplified.

As described above, according to the liquid crystal display device 200a of the present embodiment, in a structure in which a dual-gate transistor is provided in a pixel, the wiring (the scanning signal line 116 and the data signal line 118) connected to the transistor can be embedded in the insulating layer. Thus, the reliability of the liquid crystal display device 200a can be improved.

3-1-1-3. Manufacturing Method

The manufacturing process of the liquid crystal display device 200a according to the present embodiment will be described in detail with reference to the drawings. As described below, the liquid crystal display device 200*a* according to this embodiment can be manufactured by using 5 photomasks.

Figure 17A:
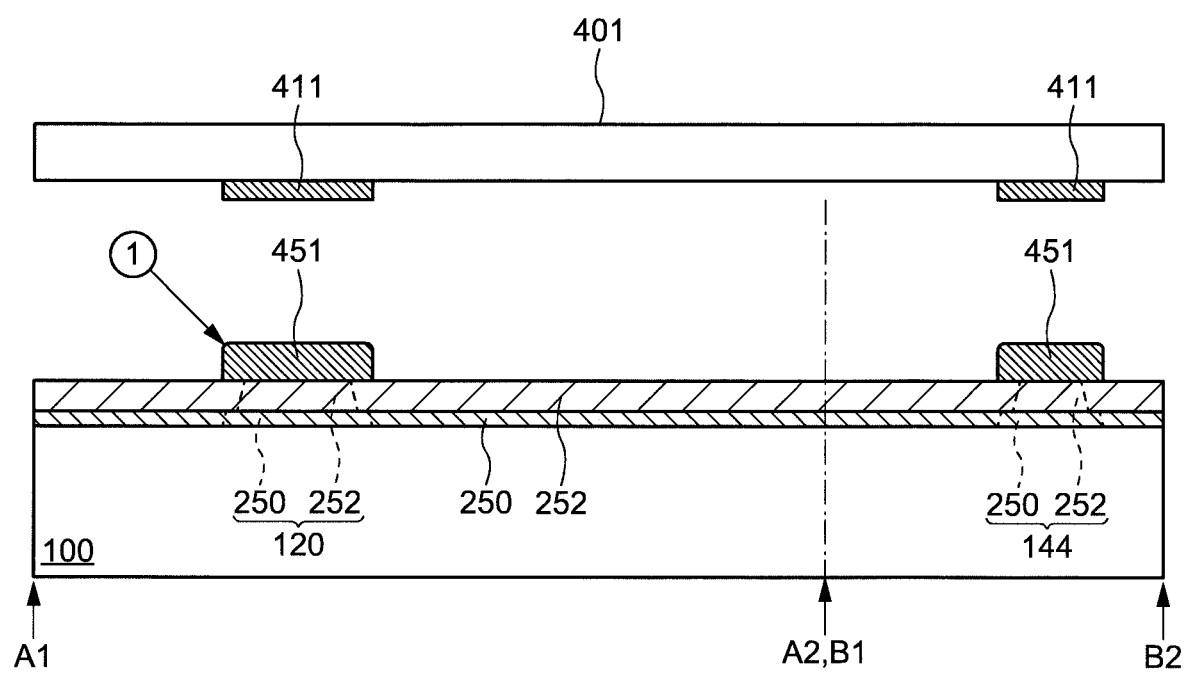
FIG. 17A shows a manufacturing method of a liquid crystal display device according to an embodiment of the present invention, and shows a cross-sectional view corresponding to lines A1-A2 and B1-B2 shown in FIG. 13.
Figure 17B:
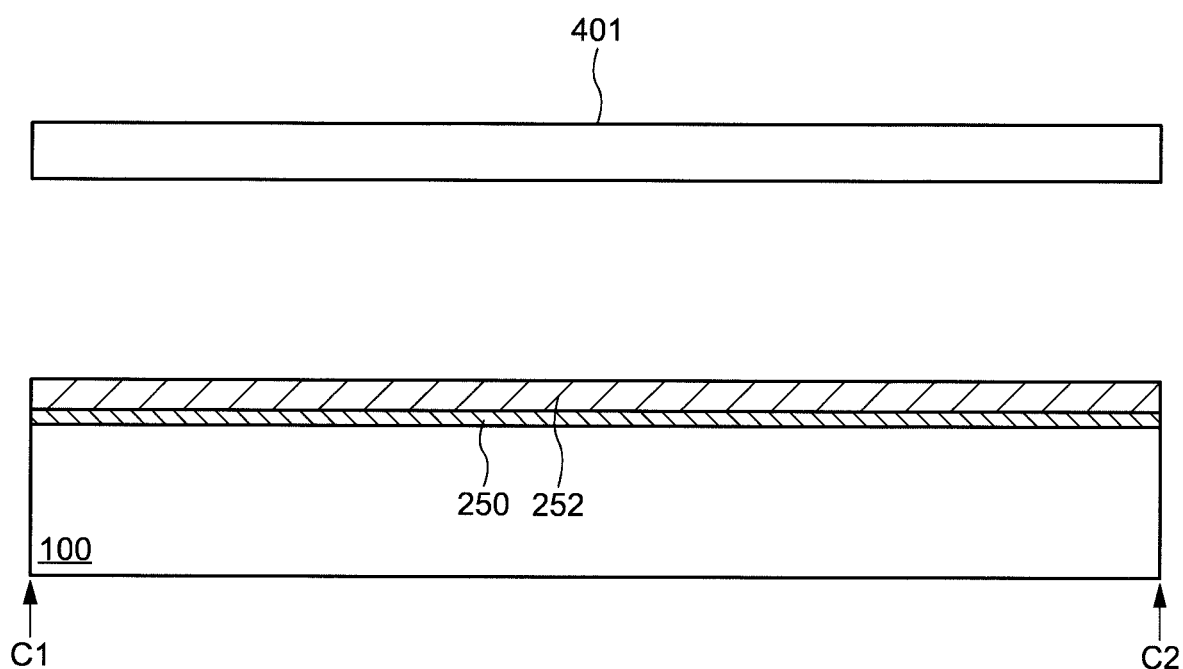
FIG. 17B shows a manufacturing method of a liquid crystal display device according to an embodiment of the present invention, and shows a cross-sectional view corresponding to line C1-C2 shown in FIG. 13.

FIGS. 17A and 17B show the steps of forming on the first substrate 100 the first gate electrode 120 and the common wiring 144. Although not shown, scanning signal lines are formed simultaneously with the first gate electrode 120 at this stage.

On the first substrate 100, the first conductive layer 250 and the second conductive layer 252 are formed. The first conductive layer 250 is formed of a metal such as titanium (Ti), molybdenum (Mo), tantalum (Ta), or a molybdenum-titanium alloy (MoTi), and the second conductive layer 252 is formed of a metal such as aluminum (Al) or an alloy thereof, or copper (Cu). For example, the first conductive layer 250 and the second conductive layer 252 are formed on substantially the entire surface of the first substrate 100 by sputtering method. For example, the first conductive layer 250 is formed to a thickness of 20 nm to 200 nm, and the second conductive layer 252 is formed to a thickness of 200 nm to 1000 nm.

On the substantially entire surface of the first substrate 100, the first conductive layer 250 and the second conductive layer 252 are formed, and then, on the second conductive layer 252, a first resist mask 451 is formed. The first resist mask 451 is formed by a first photomask 401. The first photomask 401 is a binary mask in which the first gate electrode 120, the common wiring 144, and a first mask pattern 411 including patterns of scanning signal lines (116) not shown are formed. FIG. 17A shows a case where a positive photoresist is used, and shows a mode in which the first mask pattern 411 forms a light shielding portion. On the other hand, FIG. 17B shows a cross-sectional view of the vicinity of the center of the pixel 106*a*, which shows that the gate electrode, the scanning signal line, and the common wiring are not formed in this portion, and therefore the first resist mask is not formed.

Note that the circled numeral "1" in FIG. 17A (indicates that the first resist mask 451 is formed by the first photomask 401. The first gate electrode 120, the common wiring 144, and a scanning signal line (116) not shown are formed by using the first resist mask 451 to etch the first conductive layer 250 and the second conductive layer 252.

Figure 18A:
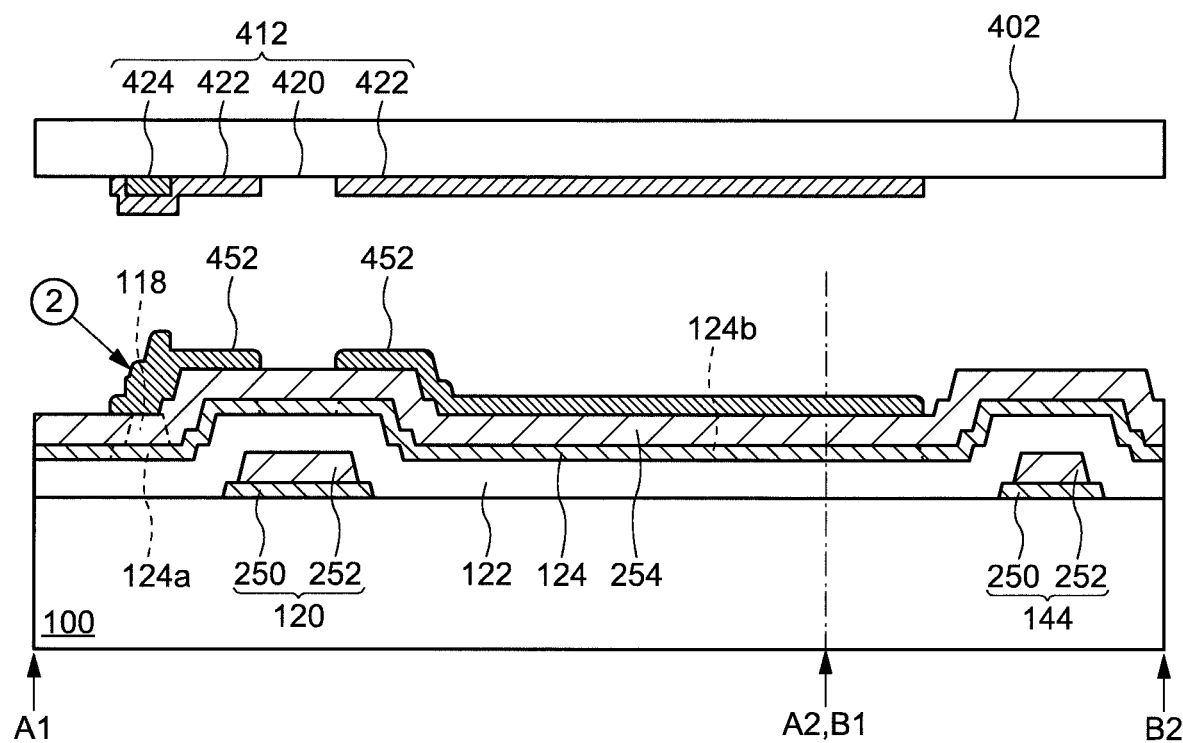
FIG. 18A shows a manufacturing method of a liquid crystal display device according to an embodiment of the present invention, and shows a cross-sectional view corresponding to lines A1-A2 and B1-B2 shown in FIG. 13.
Figure 18B:
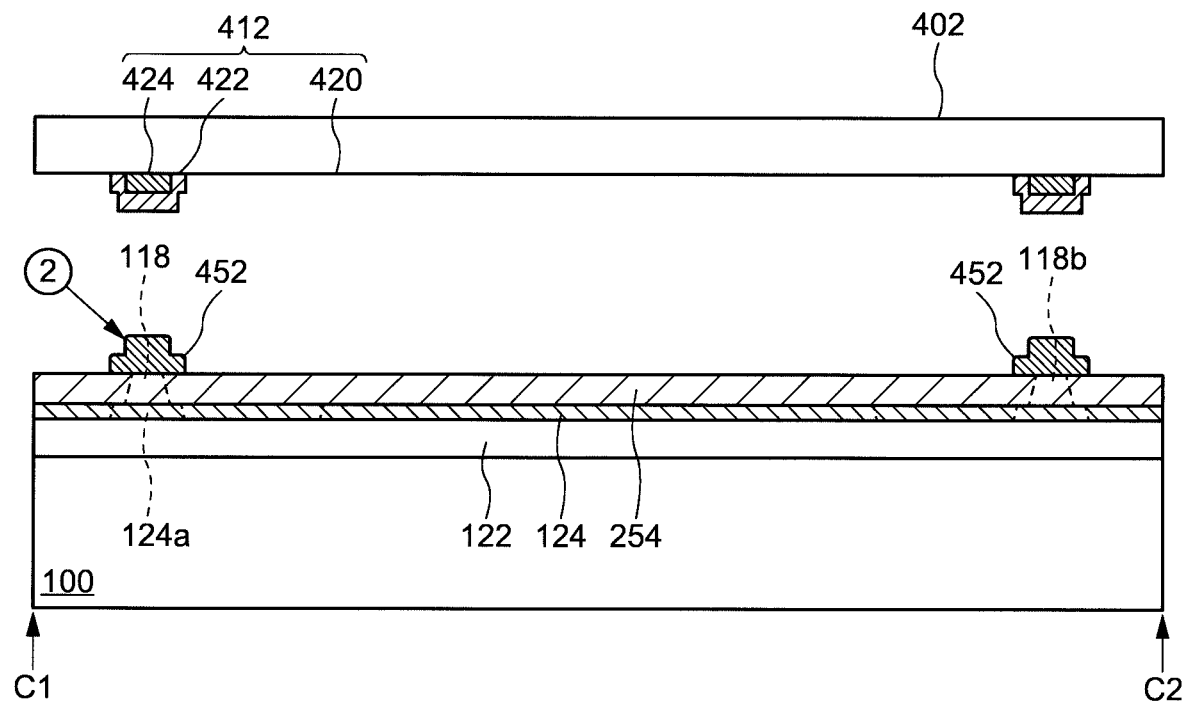
FIG. 18B shows a manufacturing method of a liquid crystal display device according to an embodiment of the present invention, and shows a cross-sectional view corresponding to line C1-C2 shown in FIG. 13.

FIGS. 18A and 18B show the steps of forming the first insulating layer 122, the oxide conductive layer 124, and the third conductive layer 254 on the first substrate 100 on which the first gate electrode 120, the common wiring 144, and the scanning signal line (116) not shown are formed, and forming a second resist mask 452 thereon.

The first insulating layer 122 is formed by a thin film forming technique such as a plasma CVD (Chemical Vapor Deposition) method or a sputtering method. The first insulating layer 122 is an inorganic insulating film such as a silicon oxide film, a silicon nitride film, a silicon oxynitride film, and an aluminum oxide film, and is formed to a thickness of 200 nm to 800 nm, for example, 400 nm.

The oxide conductive layer 124 and the third conductive layer 254 are formed on the first insulating layer 122. The oxide conductive layer 124 is formed to a thickness of 30 nm to 200 nm by a sputtering method, a vapor deposition method, or a coating method. The third conductive layer 254 is a thin film of a metal material such as aluminum (Al) or an alloy thereof, copper (Cu), or the like, formed by a sputtering method, and has a thickness of 200 nm to 2000 nm.

The second resist mask 452 is formed on the upper surface of the third conductive layer 254. The second resist mask 452 is formed by using a second photomask 402. The second photomask 402 has a second mask pattern 412 including a part (transmissive part 420) which transmits light, a part (light shielding part 424) which blocks the light, and a part (semitransparent part 422) which reduces the transmitted light quantity and transmits the light. The second photomask 402, unlike the binary mask (photomask formed of transmission part and light shielding part), is a halftone mask having the light shielding portion 424 for forming the data signal lines 118*a* and 118*b*, and the semitransparent part 422 for forming the first oxide conductive layer 124*a* and the second oxide conductive layer 124*b*. By exposing the photoresist film using the second photomask 402, the second resist mask 452 is formed. The circled numeral "2" shown in FIGS. 18A and 18B indicates that the second resist mask 452 is formed by the second photomask 402.

As shown in FIG. 18A and FIG. 18B, the second resist mask 452 has a pattern corresponding to the first oxide conductive layer 124*a* and the second oxide conductive layer 124*b*, and the pattern corresponding to the data signal line 118*a* is included in a state where the pattern is thickened on top of the pattern.

With the second resist mask 452 formed, the third conductive layer 254 and the oxide conductive layer 124 are etched. The etching conditions are not limited, but for example, the third conductive layer 254 formed of a metal is subjected to wet etching using a mixed acid etching solution, and the oxide conductive layer 124 formed of a metal oxide material or the like is subjected to dry etching using a halogen-based gas. At this step, the first oxide conductive layer 124*a* and the second oxide conductive layer 124*b* are formed. After this etching, the region in which the thickness of the second resist mask 452 is small is removed by the ashing treatment, and the third conductive layer 254 is etched while leaving the thick film portion. The data signal lines 118*a*, 118*b* are formed by this etching.

Figure 19A:
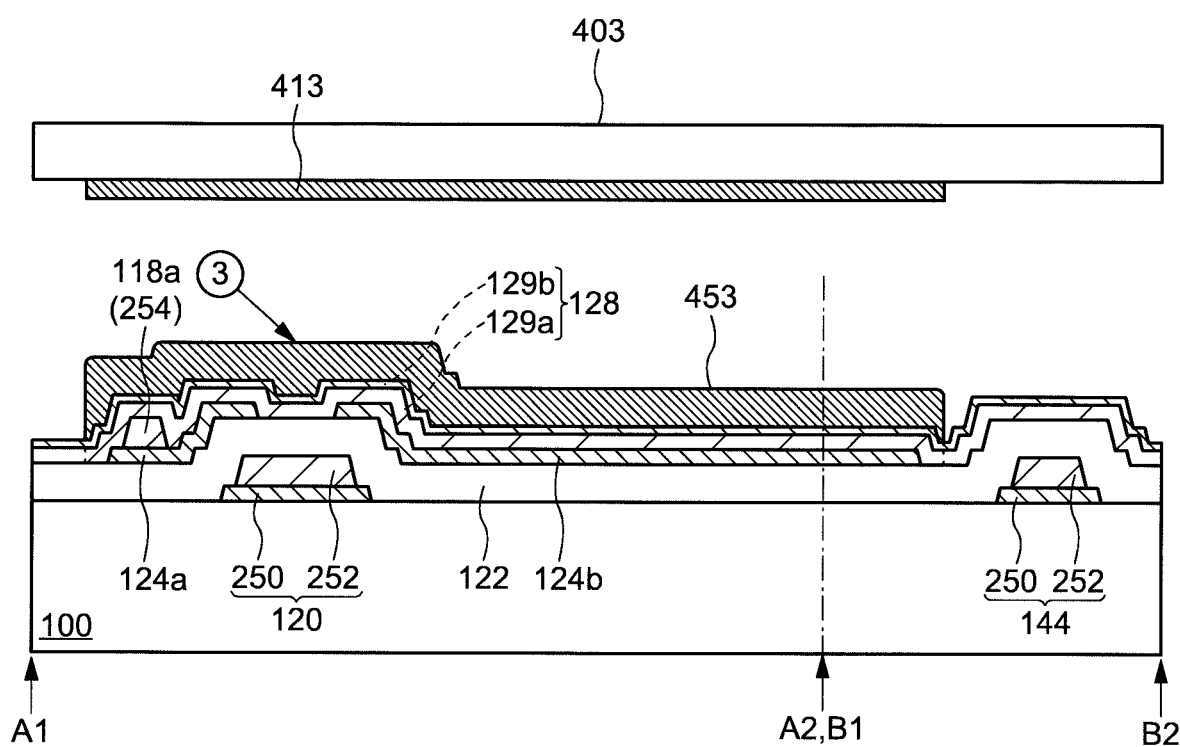
FIG. 19A shows a manufacturing method of a liquid crystal display device according to an embodiment of the present invention, and shows a cross-sectional view corresponding to lines A1-A2 and B1-B2 shown in FIG. 13.
Figure 19B:
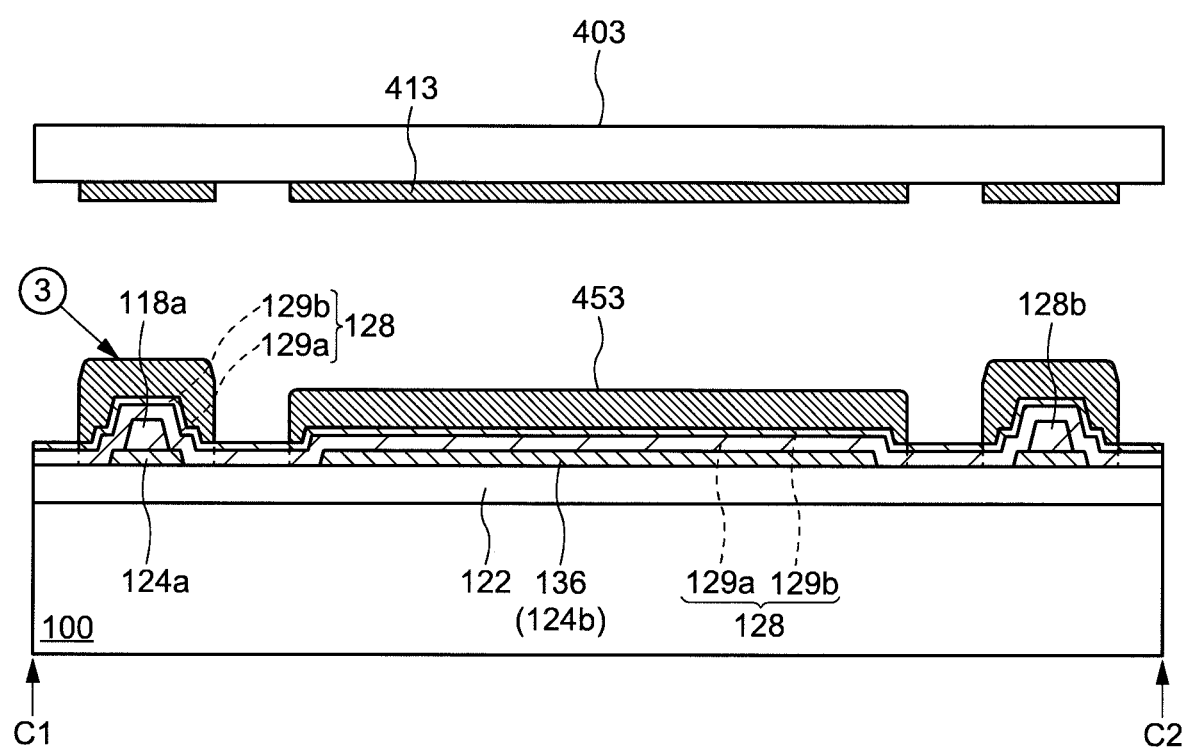
FIG. 19B shows a manufacturing method of a liquid crystal display device according to an embodiment of the present invention, and shows a cross-sectional view corresponding to line C1-C2 shown in FIG. 13.

FIGS. 19A and 19B show a step in which the oxide semiconductor layer 128 is formed on the upper side of the first oxide conductive layer 124*a* and the second oxide conductive layer 124*b* and the data signal lines 118*a*, 118*b*, and a third resist mask 453 is formed on the oxide semiconductor layer 128. The oxide semiconductor layer 128 is formed, for example, by a sputtering method. The sputtering target is formed by sintering an oxide semiconductor material. The oxide semiconductor layer 128 is formed in a thickness of, for example, 20 nm or more and 100 nm or less, for example, 30 nm or more and 50 nm or less.

The third resist mask 453 is formed by applying a photoresist on the oxide semiconductor layer 128 formed on the substantially entire surface of the first substrate 100 and exposing the same using a third photomask 403. The third photomask 403 is a binary mask in which a third mask pattern 413 for forming a pattern of the oxide semiconductor layer 128 is formed. FIG. 19A shows a mode in which the third mask pattern 413 is formed at the light shielding part, assuming that a positive photoresist is used. Note that the circled numeral "3" shown in FIGS. 19A and 19B indicates that the third resist mask 453 is formed of the third photomask 403. A pattern corresponding to the arrangement of the transistor, the pixel electrode, and the data signal line is formed by etching the oxide semiconductor layer 128 using the third resist mask 453.

Figure 20A:
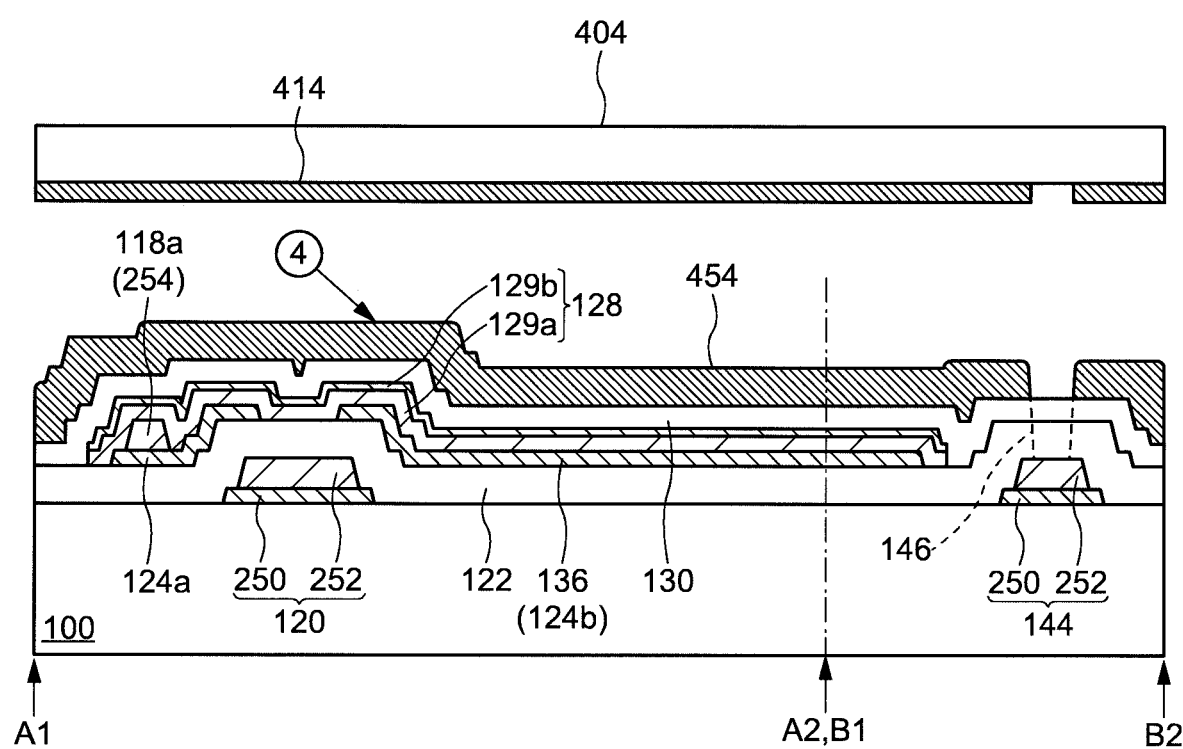
FIG. 20A shows a manufacturing method of a liquid crystal display device according to an embodiment of the present invention, and shows a cross-sectional view corresponding to lines A1-A2 and B1-B2 shown in FIG. 13.
Figure 20B:
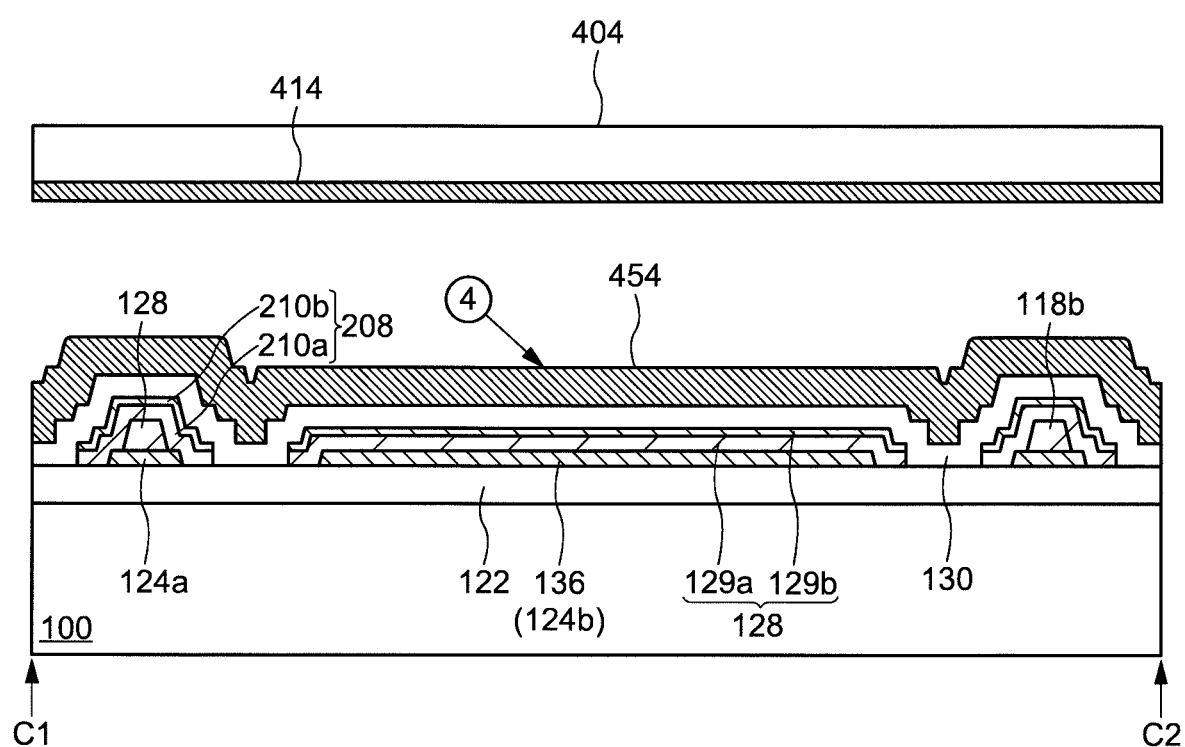
FIG. 20B shows a manufacturing method of a liquid crystal display device according to an embodiment of the present invention, and shows a cross-sectional view corresponding to line C1-C2 shown in FIG. 13.

FIGS. 20A and 20B show the step of forming the second insulating layer 130 on the upper side of the oxide semiconductor layer 128 and forming a fourth resist mask 454 for forming the contact hole.

The second insulating layer 130 is formed of an oxide-based insulating material such as silicon oxide or aluminum oxide like the first insulating layer 122. The second insulating layer 130 may be formed in a structure in which a silicon nitride film and a silicon oxide film or an aluminum oxide film are laminated. The second insulating layer 130 is formed with a film thickness of, for example, 100 nm or more and 800 nm or less. However, the thickness of the second insulating layer 130 can be appropriately adjusted according to the screen size of the liquid crystal display device 200a.

The fourth resist mask 454 is formed on the second insulating layer 130 by a fourth photomask 404. The fourth photomask 404 is a binary mask in which a fourth mask pattern 414 is formed, and includes a pattern for forming a first contact hole (134) which are not shown and a second contact hole 146. FIGS. 20A and 20B show a case where a positive photoresist is used, in which the fourth mask pattern 414 is formed by a light shielding part. The circled numeral "4" shown in FIG. 20A indicates that the fourth resist mask 454 is formed by the fourth photomask 404. Using the fourth resist mask 454, the second insulating layer 130 and the first insulating layer 122 are etched to form the first contact hole (134) which are not shown and the second contact hole 146.

Figure 21A:
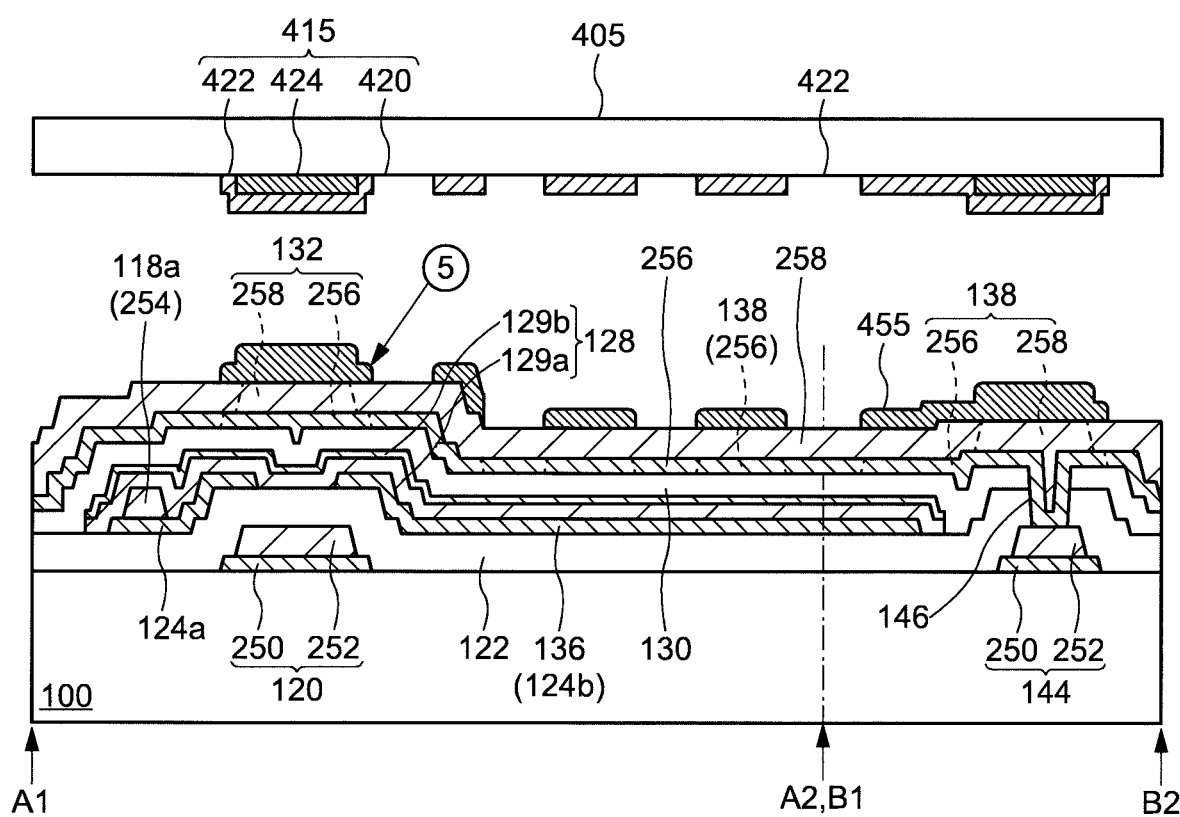
FIG. 21A shows a manufacturing method of a liquid crystal display device according to an embodiment of the present invention, and shows a cross-sectional view corresponding to lines A1-A2 and B1-B2 shown in FIG. 13.
Figure 21B:
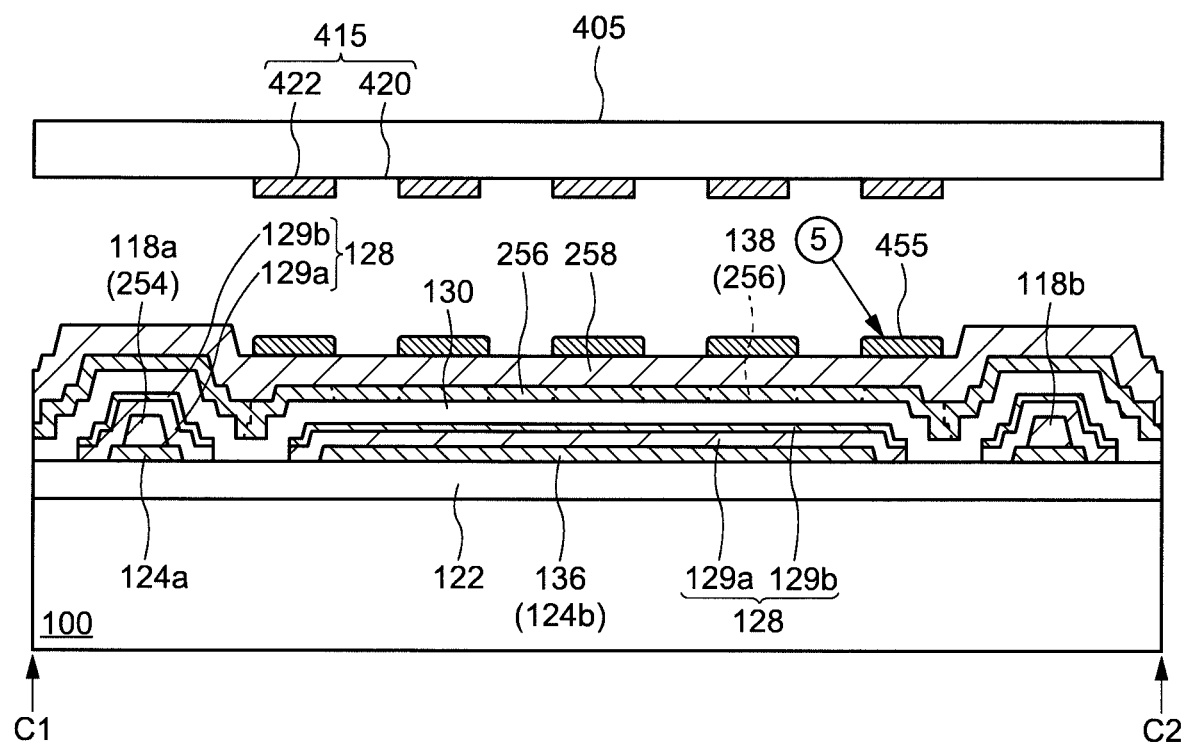
FIG. 21B shows a manufacturing method of a liquid crystal display device according to an embodiment of the present invention, and shows a cross-sectional view corresponding to line C1-C2 shown in FIG. 13.

FIGS. 21A and 21B show steps in which the second insulating layer 130 is formed with the first contact hole (134) and the second contact hole 146, and then the fourth conductive layer 256 and the fifth conductive layer 258 are formed, and a fifth resist mask 455 is formed thereon.

The fourth conductive layer 256 is formed of, for example, a transparent conductive material such as ITO or IZO and has a film thickness of 10 nm or more and 40 nm or less by a sputtering method or the like. The fifth conductive layer 258 is formed similarly to the first conductive layer 250.

The fifth resist mask 455 is formed by using a fifth photomask 405. The fifth photomask 405 is a halftone mask. The fifth mask 405 has a fifth mask pattern 415 that the light shielding part 424 and the semitransparent part 422 for reducing the transmitted light quantity formed in the transmissive part 420. A part corresponding to the patterns of the second gate electrode 132 and the common electrode 138 is thickened to form the fifth resist mask 455 by using the fifth photomask 405. The circled numeral "5" shown in FIGS. 21A and 21B indicates that the fifth resist mask 455 is formed by the fifth photomask 405.

As shown in FIGS. 21A and 21B, the fifth resist mask 455 has a shape corresponding to the second gate electrode 132 and the common electrode 138, and a part corresponding to the fifth conductive layer 258 is thickened. With the fifth resist mask 455 formed, the fifth conductive layer 258 and the fourth conductive layer 256 are etched. The etching conditions are not limited, but for example, the fifth conductive layer 258 formed of a metal material is subjected to wet etching using a mixed acid etching solution, and the fourth conductive layer 256 formed of a metal oxide material or the like is subjected to dry etching using a halogen-based gas. After this etching process, a thin region of the fifth resist mask 455 is removed by ashing. Using the thick film portion of the fifth resist mask 455, the fifth conductive layer 258 is further etched. The second gate electrode 132 and a common electrode 138 are formed by this etching. The common electrode 138 is connected to the common wiring 144 at a position where the second contact hole 146 is formed. Although not shown, the second gate electrode 132 is connected to the first gate electrode 120 through a first contact hole (134).

It is possible to form a common electrode 138 having a structure in which the portion overlapping with the pixel electrode 136 consists only of the fourth conductive layer 256 by using the halftone mask in this step, and the portion connected with the common wiring 144 has a structure in which the fourth conductive layer 256 and the fifth conductive layer 258 are laminated.

The element substrate 210 of the liquid crystal display device 200a having the structure shown in FIGS. 14A and 14B can be manufactured by 5 photomasks by the above steps. In this manufacturing method, by using a halftone mask, a structure for connecting the data signal line 118a and the transistor 202 can be manufactured by 1 photomask, and the second gate electrode 132 and the common electrode 138 can be manufactured by a multilayer structure.

3-1-2. Second Embodiment

This embodiment shows an aspect in which the shape of the pixel electrode is different from that of the pixel 106a shown in the first embodiment. In the following, the description will focus on the different parts from the first embodiment, and the description of the same configuration will be omitted as appropriate.

Figure 22:
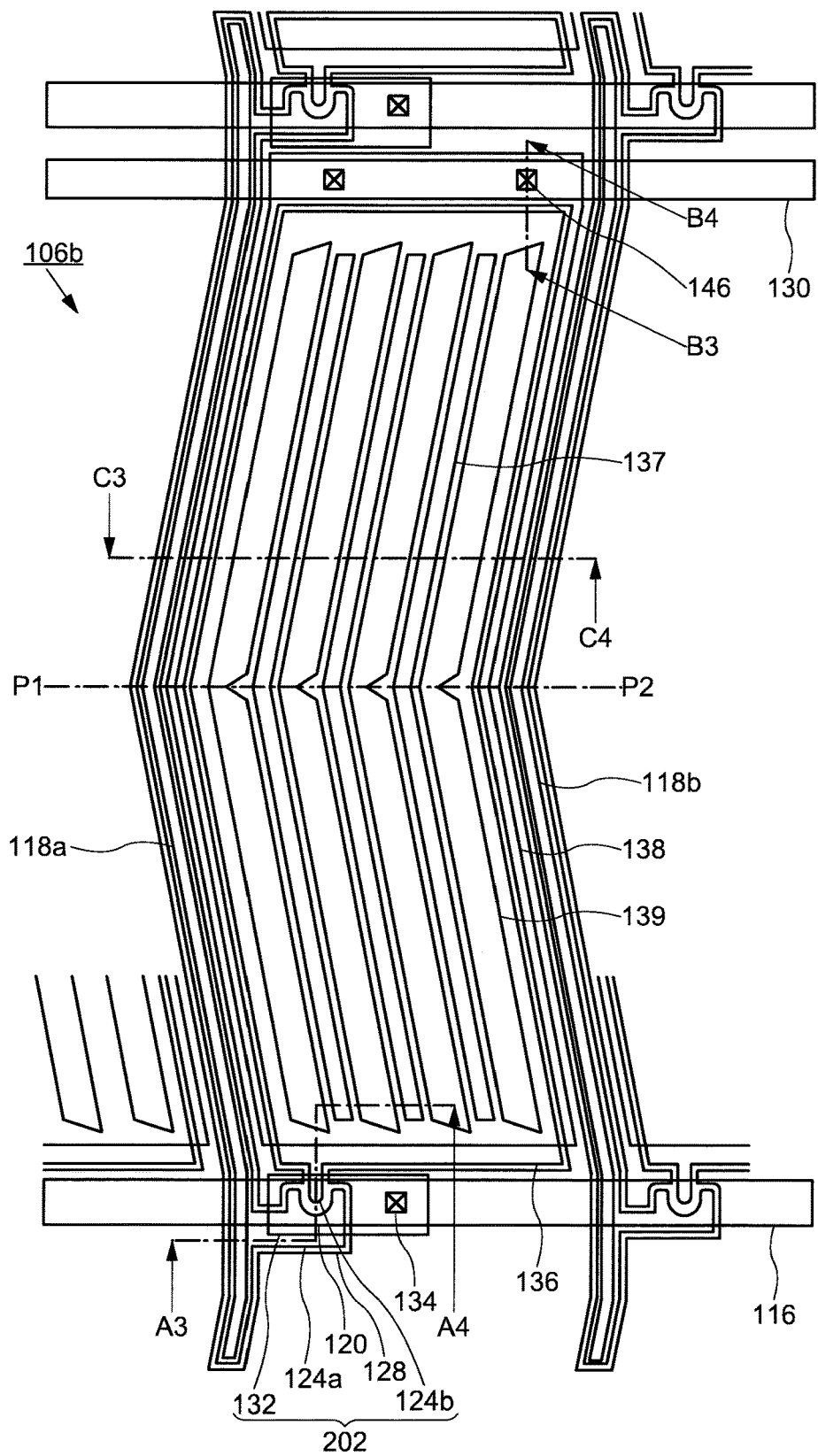
FIG. 22 is a plan view of pixel of a liquid crystal display device according to an embodiment of the present invention.

FIG. 22 is a schematic plan view of the pixel 106b in the liquid crystal display device 200a according to the present embodiment. The cross-sectional structure of FIG. 22 along lines A3-A4 and B3-B4 are shown in FIG. 23A, and the cross-sectional structure along line C3-C4 is shown in FIG. 23B.

As shown in FIG. 22, the pixel 106b has a pixel electrode 136 provided with at least one second slit 137. The at least second slit 137 is arranged at a position of the common electrode 138 which does not overlap with the at least one first slit 139. That is, the pixel 106b has a structure in which the at least one first slit 139 and the at least one second slit 137 are alternately arranged.

Figure 23A:
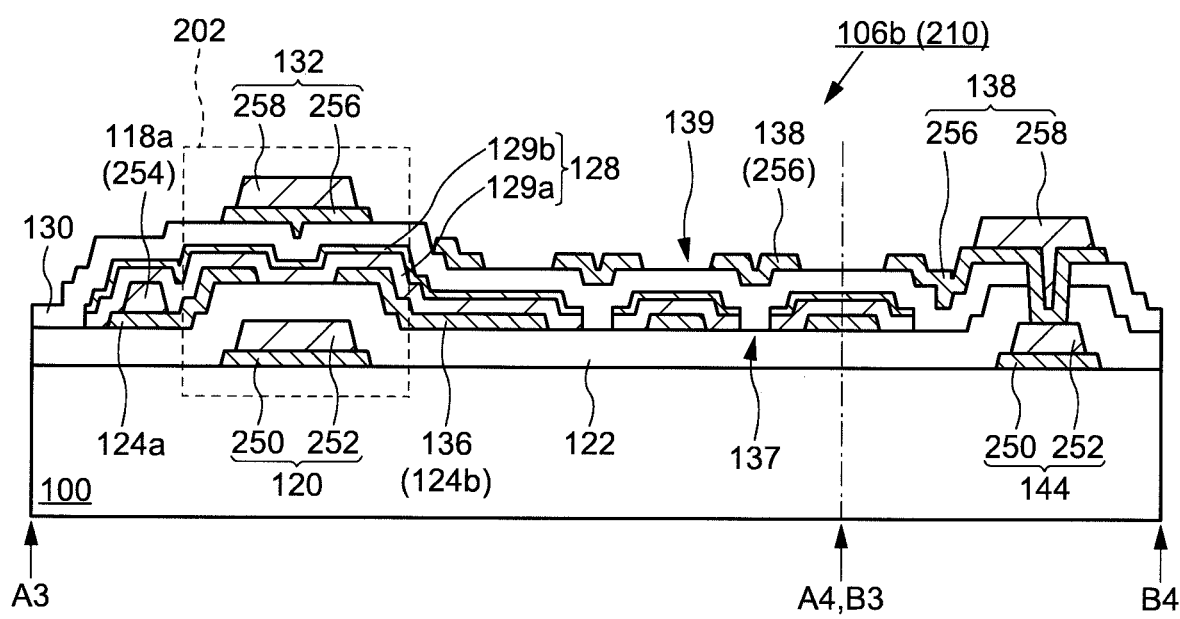
FIG. 23A shows the cross-sectional structure of the pixels corresponding to lines A3-A4 and B3-B4 shown in FIG. 22.
Figure 23B:
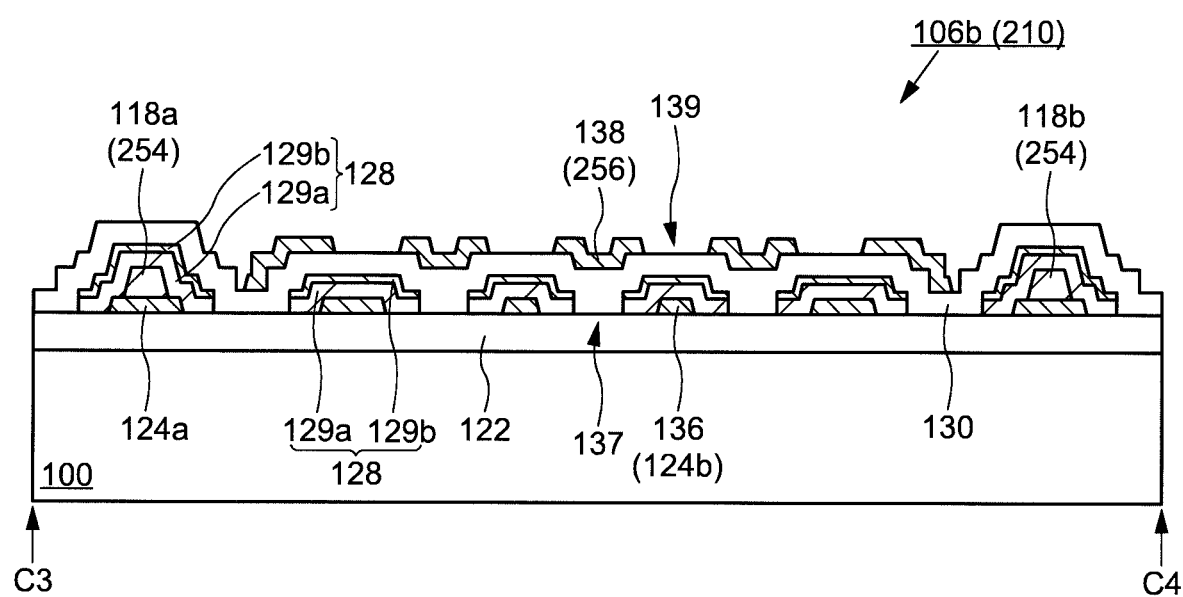
FIG. 23B shows the cross-sectional structure of the pixels corresponding to line C3-C4 shown in FIG. 22.

As shown in FIGS. 23A and 23B, the pixel electrode 136 has a laminated structure of the second oxide conductive layer 124b, the oxide semiconductor layer 128. The pixel electrode 136 has a structure in which the at least one second slit 137 is provided in a region where the second oxide conductive layer 124b is removed. The oxide semiconductor layer 128 provided on the upper layer of the second oxide conductive layer 124b may also be removed in accordance with the pattern of the at least one second slit 137. The at least one second slit 137 can also be regarded as a region where the second oxide conductive layer 124b and the oxide semiconductor layer 128 are removed.

An area where the pixel electrode 136 overlaps with the common electrode 138 is reduced by providing the pixel electrode 136 with the at least one second slit 137. As a result, the capacitance formed between the pixel electrode 136 and the common electrode 138 is reduced. The liquid crystal display device 200a can reduce the power consumption of the drive circuit for driving the liquid crystal by reduced the capacitance. Note that the at least one second slit 137 of the pixel electrode 136 is formed simultaneously with patterning of the second oxide conductive layer 124b and the oxide semiconductor layer 128. Therefore, even if the at least one second slit 137 is formed in the pixel electrode 136, it does not increase the number of steps in the manufacturing process of the liquid crystal display device 200a.

The pixel 106b shown in this embodiment has the same configuration as the pixel 136a shown in the first embodiment except that the pixel electrode 136 is provided with the at least one second slit 137. Therefore, the liquid crystal display device 200a according to the present embodiment has the same advantageous effect as that of the first embodiment in addition to the advantageous effect of the provision of the at least one second slit 137.

3-1-3. Third Embodiment

This embodiment shows an aspect in which the form of the common electrode is different from that of the pixel 106b shown in the second embodiment. In the following description, parts different from those of the second embodiment will be mainly described, and description of the same configuration will be omitted as appropriate.

Figure 24:
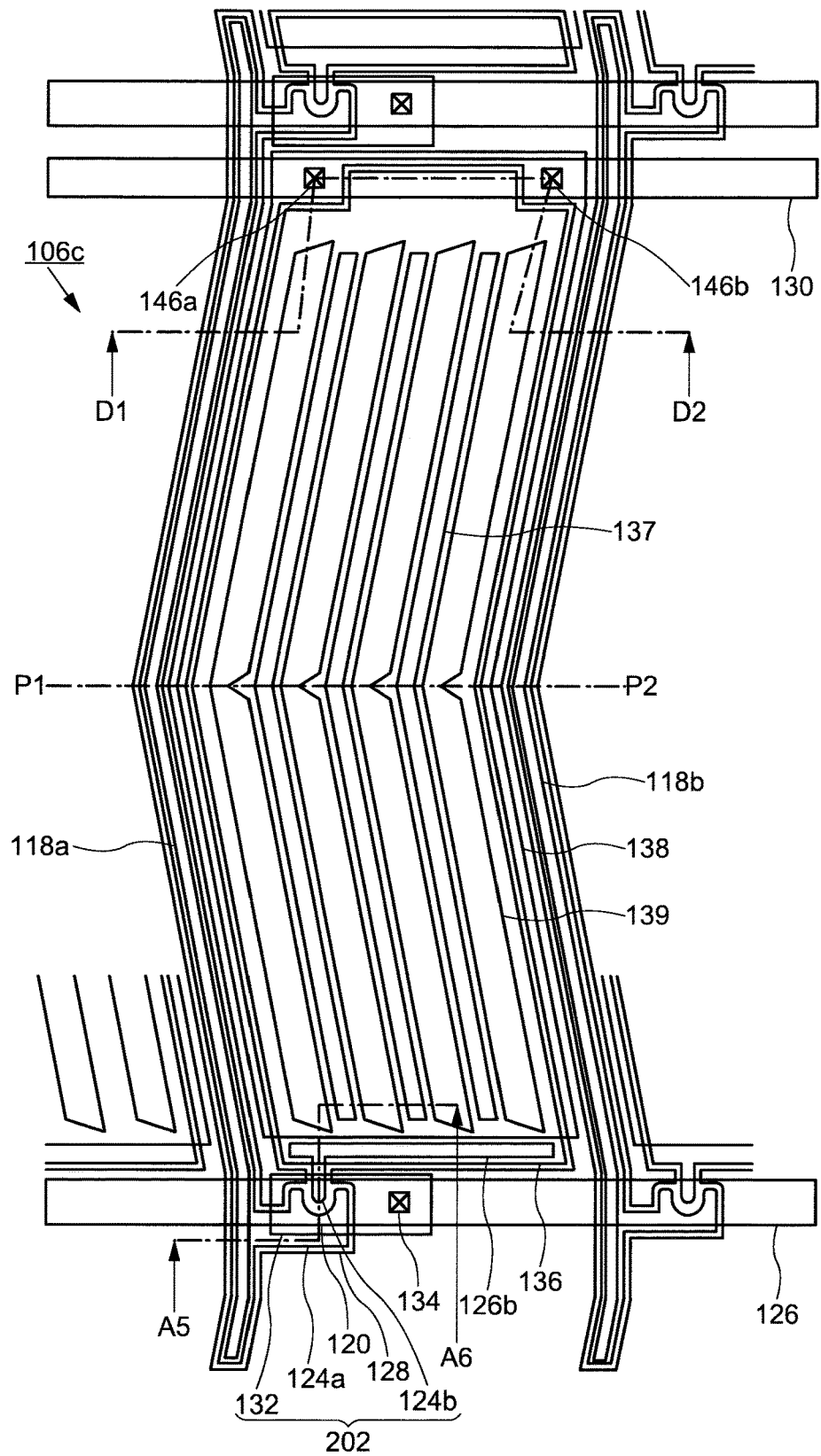
FIG. 24 is a plan view of pixel of a liquid crystal display device according to an embodiment of the present invention.

FIG. 24 is a schematic plan view of the pixel 106c in the liquid crystal display device 200a according to the present embodiment. The cross-sectional structure of FIG. 24 along line A5-A6 is shown in FIG. 25A, and the cross-sectional structure along line D1-D2 is shown in FIG. 25B.

As shown in FIG. 24, the common electrode 138 is electrically connected to the common wiring 144 at two positions of the second contact hole 146a and the second contact hole 146b. The second contact hole 146a and the second contact hole 146b are spaced apart from each other. The pixel electrode 136 has a structure extended so as to overlap with the common electrode 138 in a region between them. On the other hand, the transistor 202 has the same configuration as that of the first embodiment. In a region connecting the input/output terminal of the transistor 202 and the pixel electrode 136, the second metal layer 126b may be provided superimposed on the second oxide conductive layer 124b.

Figure 25A:
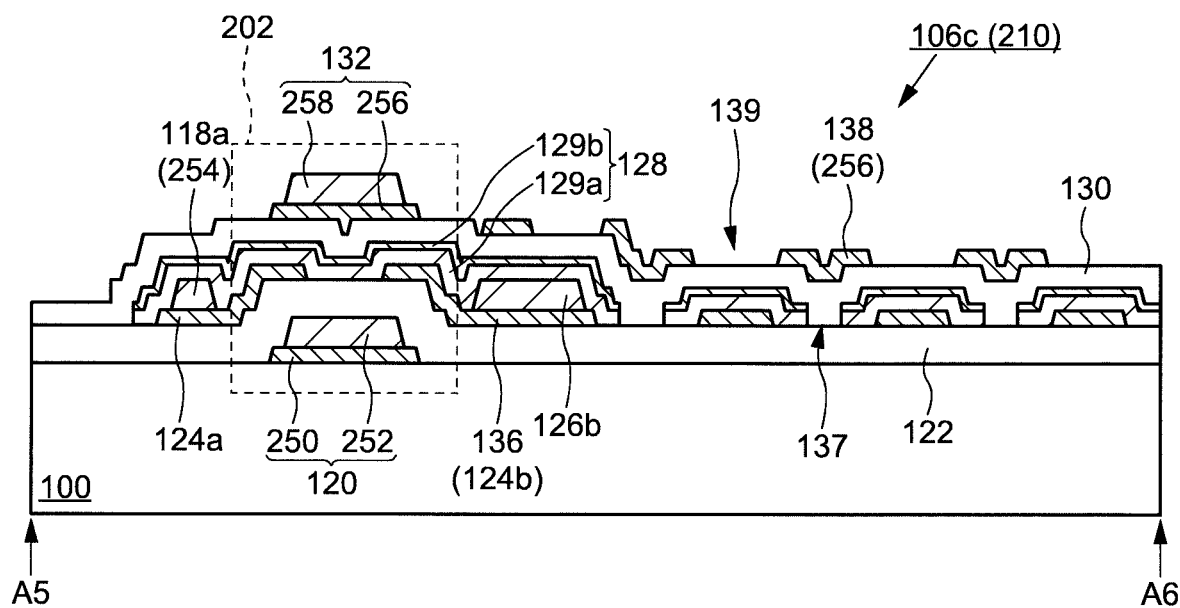
FIG. 25A shows the cross-sectional structure of the pixels corresponding to lines A5-A6 and B3-B4 shown in FIG. 24.
Figure 25B:
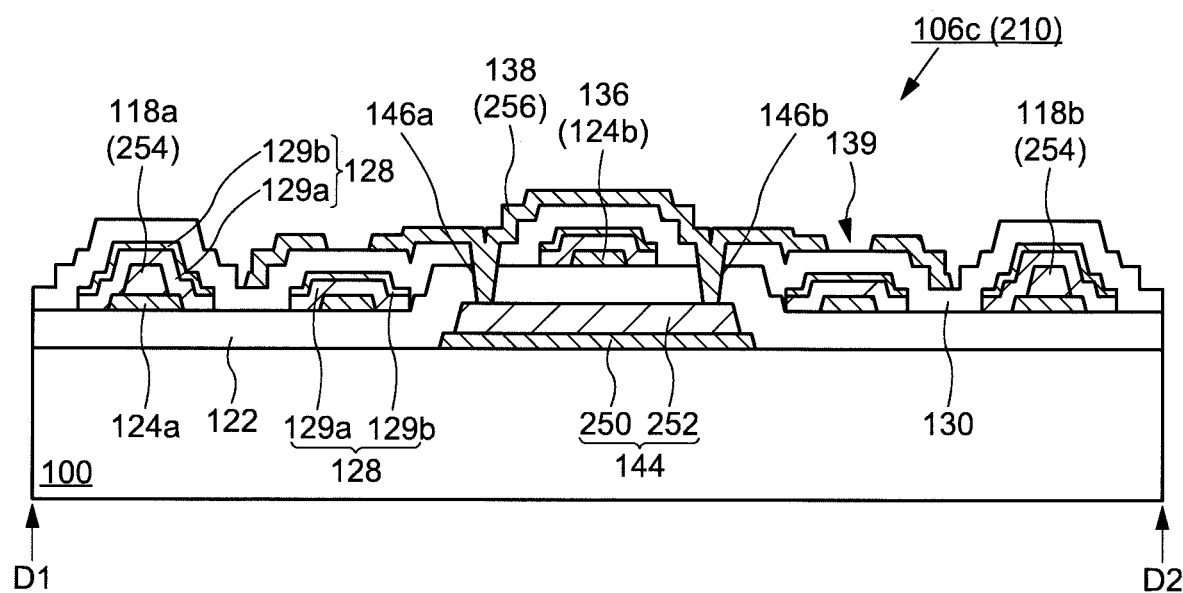
FIG. 25B shows the cross-sectional structure of the pixels corresponding to line D1-D2 shown in FIG. 24.

FIGS. 25A and 25B show a structure in which the pixel electrode 136 is provided with the at least one second slit 137 and the common electrode 138 is provided with the at least one first slit 139. As in the first embodiment, the pixel electrode 136 may be formed of a plane shape continuous film. As shown in FIG. 25B, a region between the second contact hole 146a and the second contact hole 146b has a region where the pixel electrode 136 and the common electrode 138 overlap via the second insulating layer 130. Since this region is a region where the capacitance is accumulated, the capacitance of the retention capacitance element formed in the region where the pixel electrode 136 and the common electrode 138 overlap can be increased without impairing the aperture ratio of the pixel 106c. Also, in this embodiment, since only the arrangement of the second contact holes 146a, 146b and the shapes of the pixel electrode 136 and the common electrode 138 are changed, the number of steps does not increase in the manufacturing process of the liquid crystal display device.

The pixel 106c shown in this embodiment is suitable for a liquid crystal display device having a relatively small screen size because the capacitance of the retention capacitor element can be increased without lowering the aperture ratio. Except for the arrangement of the second contact holes 146a, 146b and the pixel electrode 136, the configuration is the same as that of the second embodiment. Therefore, the liquid crystal display device 200a according to the present embodiment has the same advantageous effect as that of the second embodiment in addition to the increase in the capacitance of the holding capacitance element.

3-1-4. Fourth Embodiment

This embodiment shows an aspect in which the form of the common electrode is different from that of the pixel 106a shown in the first embodiment. In the following description, parts different from those of the first embodiment will be mainly described, and description of the same configuration will be omitted as appropriate.

Figure 26:
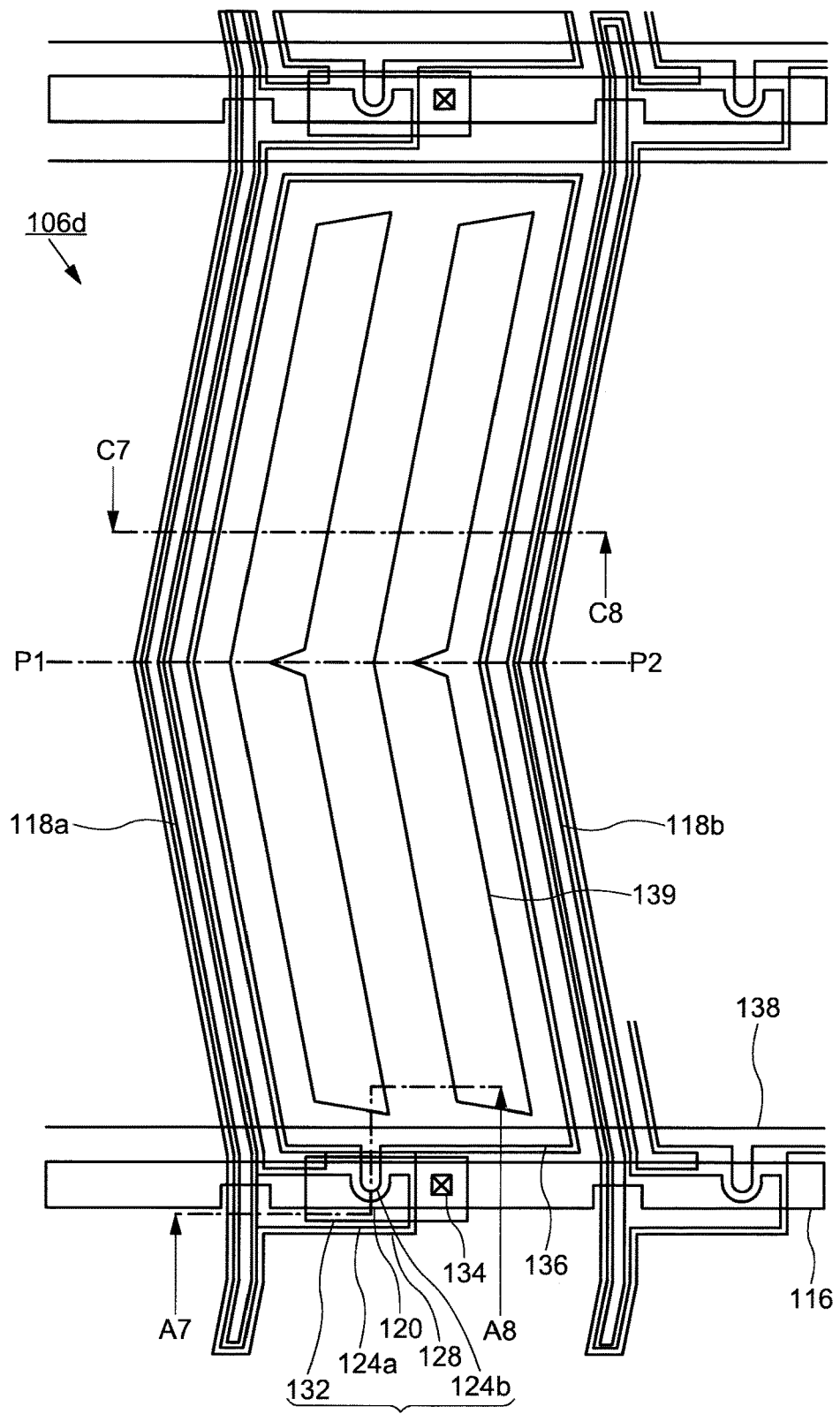
FIG. 26 is a plan view of pixel of a liquid crystal display device according to an embodiment of the present invention.

FIG. 26 is a schematic plan view of the pixel 106d in the liquid crystal display device 200a according to the present embodiment. The cross-sectional structure of FIG. 26 along line A7-A8 is shown in FIG. 27A, and the cross-sectional structure along line C7-C8 is shown in FIG. 27B.

The pixel 106d shown in FIG. 26 has a structure in which the common electrode 138 is provided continuously over a plurality of pixels. The common electrode 138 has a stripe pattern so as to be continuous with adjacent pixels (pixels adjacent to the row direction). The common electrode 138 is provided at a position overlapping the pixel electrode 136 with at least one first slit 139. Since the pixel 106d has a structure in which the common electrode 138 continues over a plurality of pixels, the common wiring is removed. In contrast to the pixel 106a shown in the first embodiment (refer to FIG. 13), the pixel 106d shown in FIG. 26 does not have the common wiring. Therefore, the contact hole for connecting the common electrode and the common wiring becomes unnecessary. With this configuration, the pixel 106d according to the present embodiment can increase the aperture ratio.

Figure 27A:
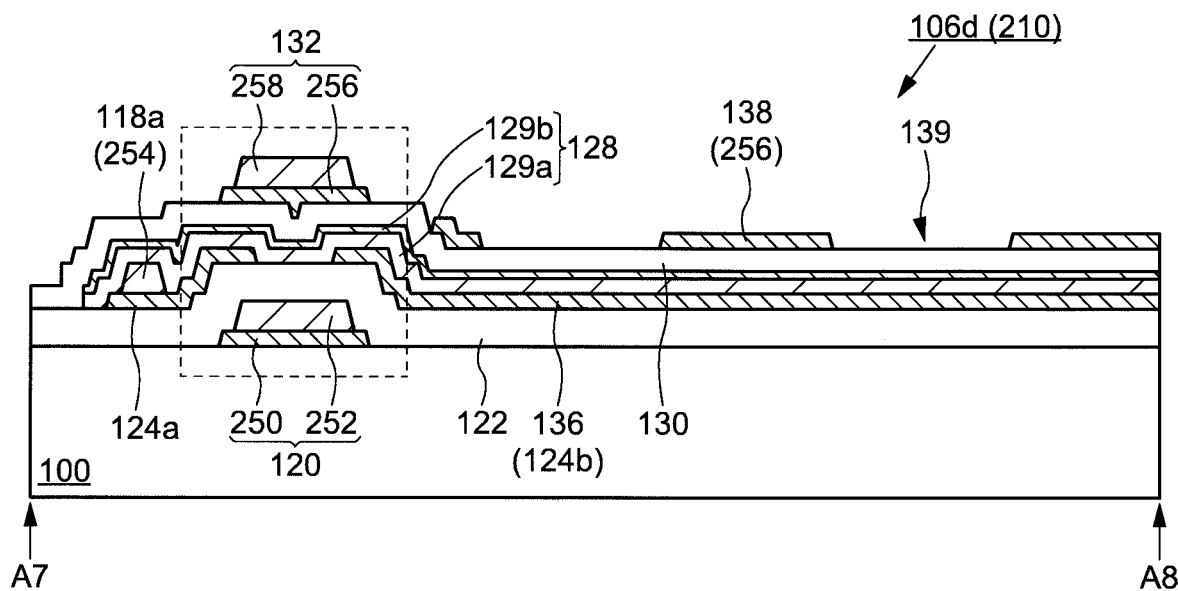
FIG. 27A shows the cross-sectional structure of the pixels corresponding to lines A7-A8 and B3-B4 shown in FIG. 26.
Figure 27B:
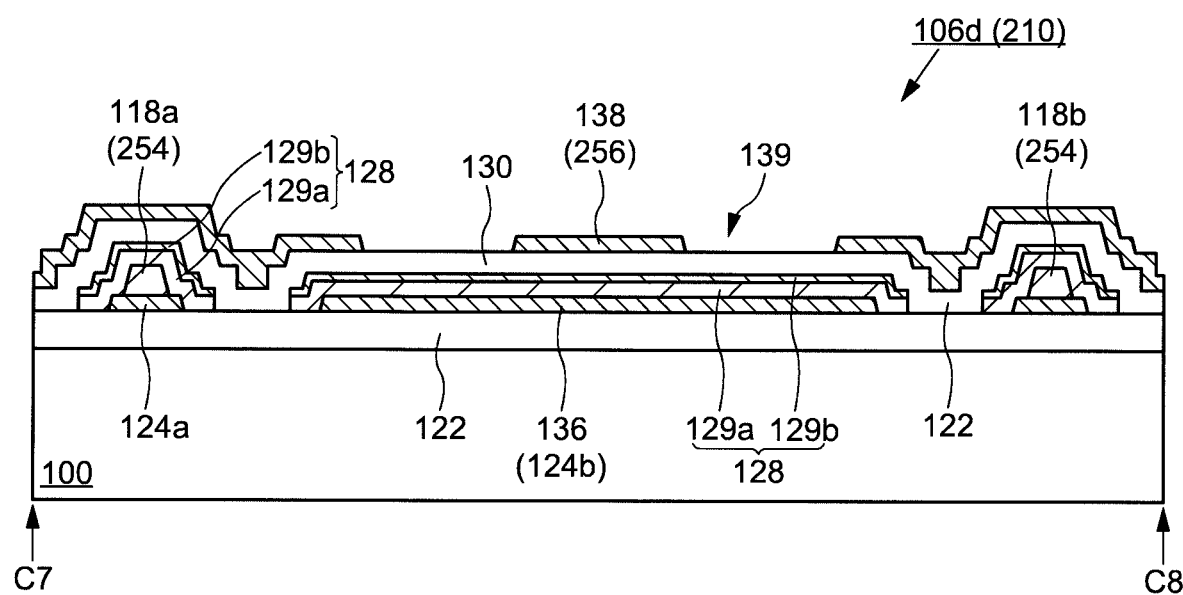
FIG. 27B shows the cross-sectional structure of the pixels corresponding to lines C7-C8 shown in FIG. 26.

As shown in FIG. 27A, the structure of the portion along the line A7-A8 is the same as that of the pixel 106a in the first embodiment. On the other hand, as shown in FIG. 27B, the structure along the line C7-C8 is provided so as to cross the data signal lines 118a, 118b across the second insulating layer 130 because the common electrode is continuous over the adjacent pixels. As described with reference to FIG. 26, the pixel 106d is not provided with the contact hole for connecting the common electrode 138 and the common wiring. Therefore, the area occupied by the pixel electrode 136 in the region of the pixel 106d can be increased, and the aperture ratio of the pixel can be increased. The structure of the pixel 106d is suitable for a small display having a screen size of about 4 to 6 inches, for example.

The pixel 106d shown in the present embodiment has the same configuration as the pixel 106a shown in the first embodiment except that the common electrode 138 is shared with the adjacent pixels. Therefore, the liquid crystal display device 200a having the pixel 106d has the same operation and advantageous effect as in the first embodiment, and can further improve the aperture ratio as described above.

3-1-5. Fifth Embodiment

This embodiment shows an aspect in which the transistor structure provided in the pixel 106a of the first embodiment is different.

Figure 28:
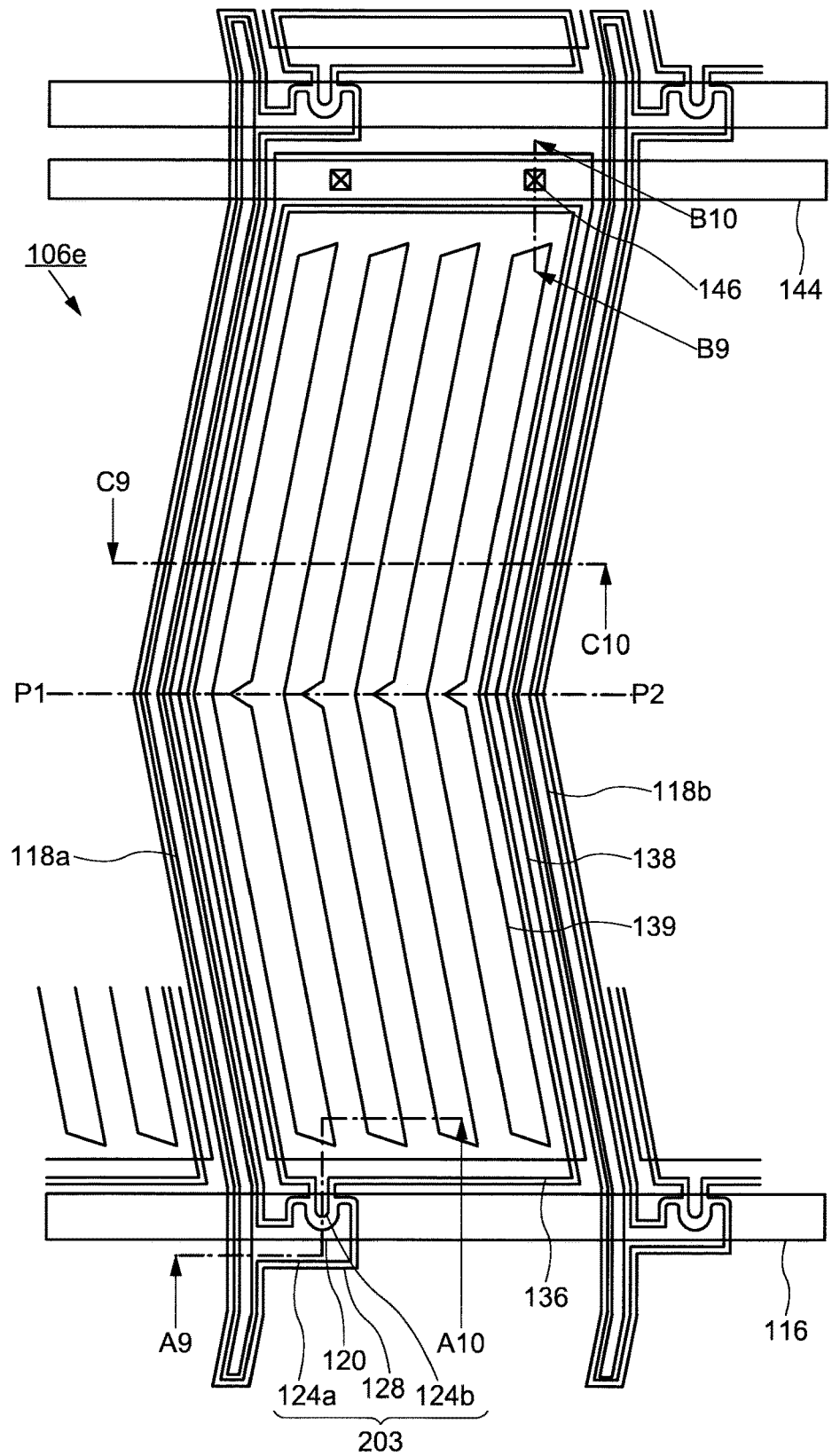
FIG. 28 is a plan view of pixel of a liquid crystal display device according to an embodiment of the present invention.

FIG. 28 is a schematic plan view of the pixel 106e in the liquid crystal display device 200a according to the present embodiment. The cross-sectional structure of FIG. 28 along lines A9-A10 and B9-B10 are shown in FIG. 29A, and the cross-sectional structure along line C9-C10 is shown in FIG. 29B.

The pixel 106d includes a transistor 203, the pixel electrode 136, and the common electrode 138. The pixel electrode 136 is electrically connected to the transistor 203. In this embodiment, the transistor 203 is a bottom-gate transistor. Since the transistor 203 is a bottom gate type, the pixel 106e has a structure in which the second gate electrode 132 and the first contact hole 134 shown in the first embodiment are not provided.

Figure 29A:
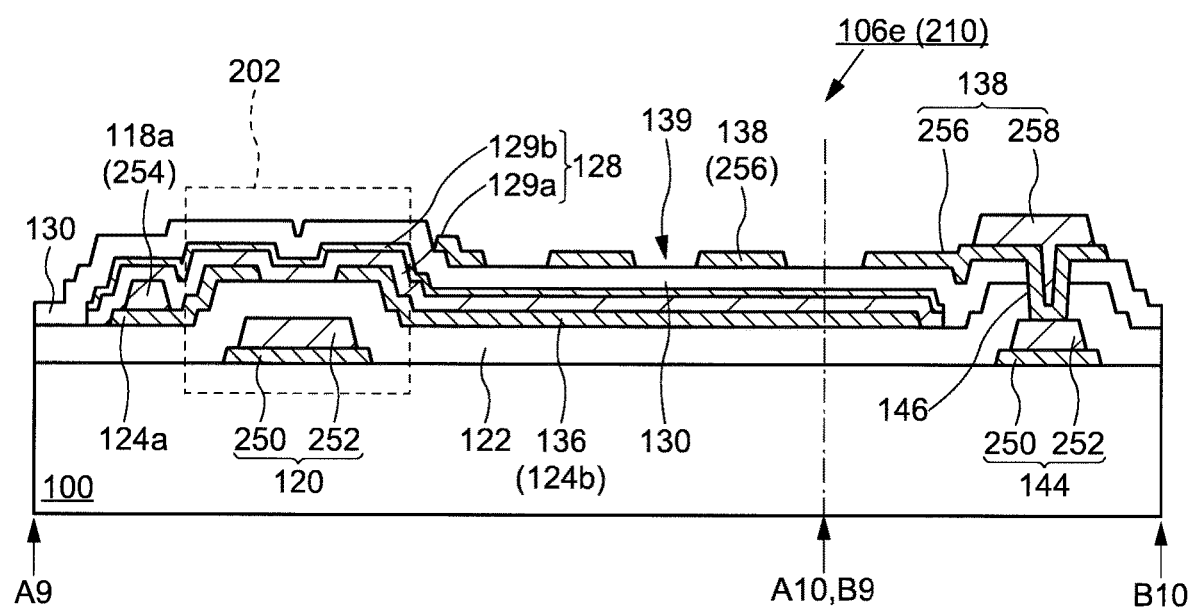
FIG. 29A shows a manufacturing method of a liquid crystal display device according to an embodiment of the present invention, and shows a cross-sectional view corresponding to the lines A9-A10 and B9-B10 shown in FIG. 28.
Figure 29B:
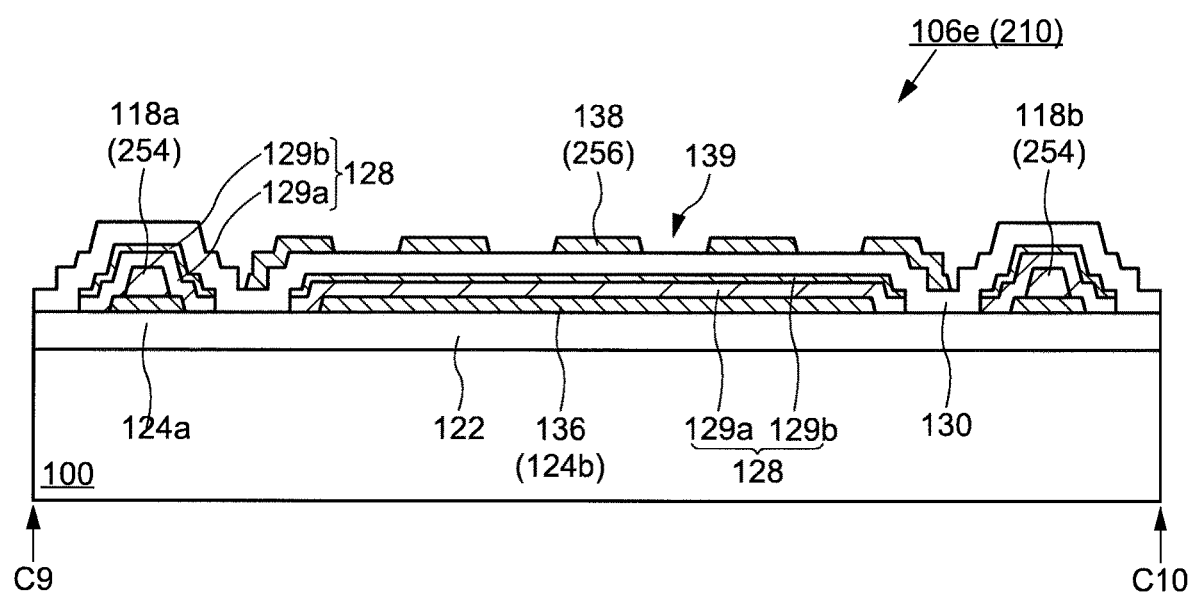
FIG. 29B shows a manufacturing method of a liquid crystal display device according to an embodiment of the present invention, and shows a cross-sectional view corresponding to the line C9-C10 shown in FIG. 28.

As shown in FIG. 29A, the transistor 203 has a structure in which on the first gate electrode 120, the oxide semiconductor layer 128 is provided through the first insulating layer 122. The first oxide conductive layer 124a and the second oxide conductive layer 124b are provided between the first insulating layer 122 and the oxide semiconductor layer 128. The first oxide conductive layer 124a and the second oxide conductive layer 12b are provided in contact with the surface of the oxide semiconductor layer 128 on the first gate electrode 120 side (first surface). The oxide semiconductor layer 128 may include the first region 129a and the second region 129b as described above. The contact resistance of the first oxide conductive layer 124a and the second oxide conductive layer 124b can be reduced by contacting the first surface (the first region 129a) of the oxide semiconductor layer 128.

On the upper side of the oxide semiconductor layer 128 (the second surface side opposite the first surface), the second insulating layer 130 is provided. In the oxide semiconductor layer 128, since the second region 129b is interposed between the oxide semiconductor layer and the second insulating layer 130, the defect density of the interface can be reduced, and the change of the threshold voltage can be prevented.

The pixel 106e according to the present embodiment has the same configuration as that of the pixel 106a according to the first embodiment, except that the configuration of the transistor 203 is different, and exhibits the same advantageous effect.

3-1-6. Sixth Embodiment

This embodiment shows the pixel structure of the liquid crystal display device 200a in which the color filter layer is provided on the lower layer side of the transistor.

Figure 30:
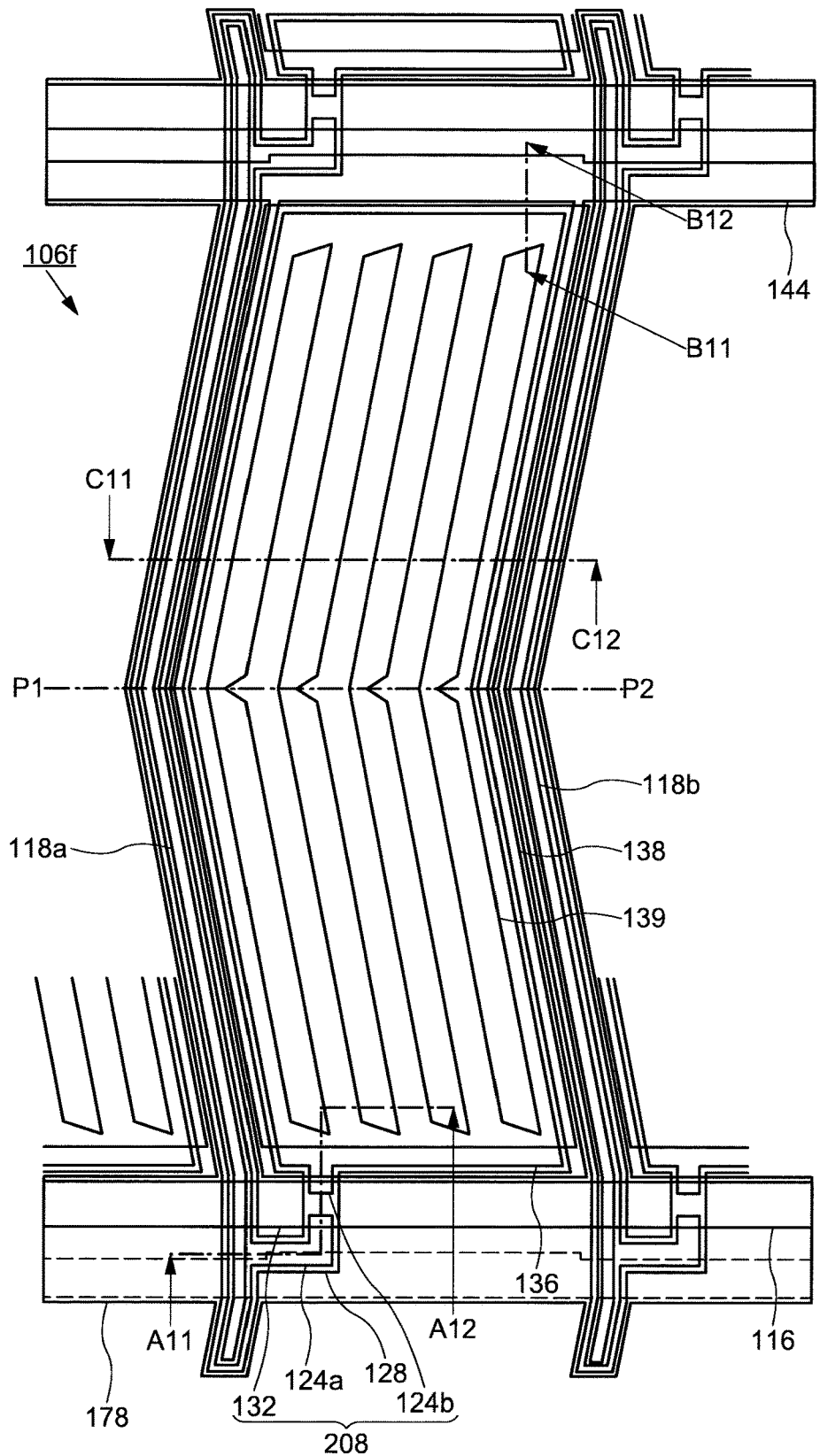
FIG. 30 is a plan view of pixel of a liquid crystal display device according to an embodiment of the present invention.

FIG. 30 is a schematic plan view of the pixel 106f in the liquid crystal display device 200a according to the present embodiment. The cross-sectional structure of FIG. 30 along lines A11-A12 and B11-B12 are shown in FIG. 31A, and the cross-sectional structure along line C11-C12 is shown in FIG. 31B.

As shown in FIG. 21, the pixel 106f includes a transistor 208, the pixel electrode 136, and the common electrode 138. The pixel electrode 136 is electrically connected to the transistor 208. The transistor 208 includes the oxide semiconductor layer 128, the second gate electrode 132, the first oxide conductive layer 124a, and the second oxide conductive layer 124b. The second gate electrode 132 also serves as the scanning signal line 116, and is formed of the same layer as the common electrode 138. That is, the transistor 208 has a top gate structure. The pixel 106f is provided with the scanning signal line 116, the data signal lines 118a, 118b, and a light shielding layer 178 overlapping the transistor 208. Although not shown, color filter layer(s) is provided in a region overlapping the pixel electrode 136.

Figure 31A:
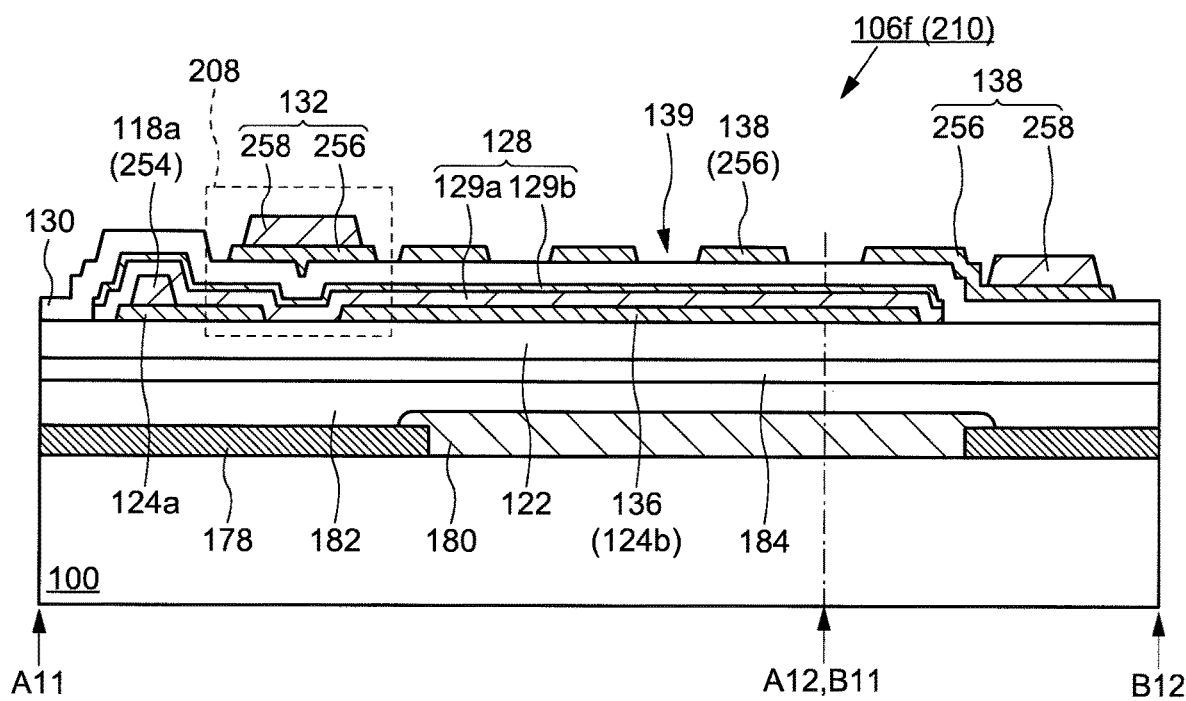
FIG. 31A shows a manufacturing method of a liquid crystal display device according to an embodiment of the present invention, and shows a cross-sectional view corresponding to the lines A11-A12 and B11-B12 shown in FIG. 32.
Figure 31B:
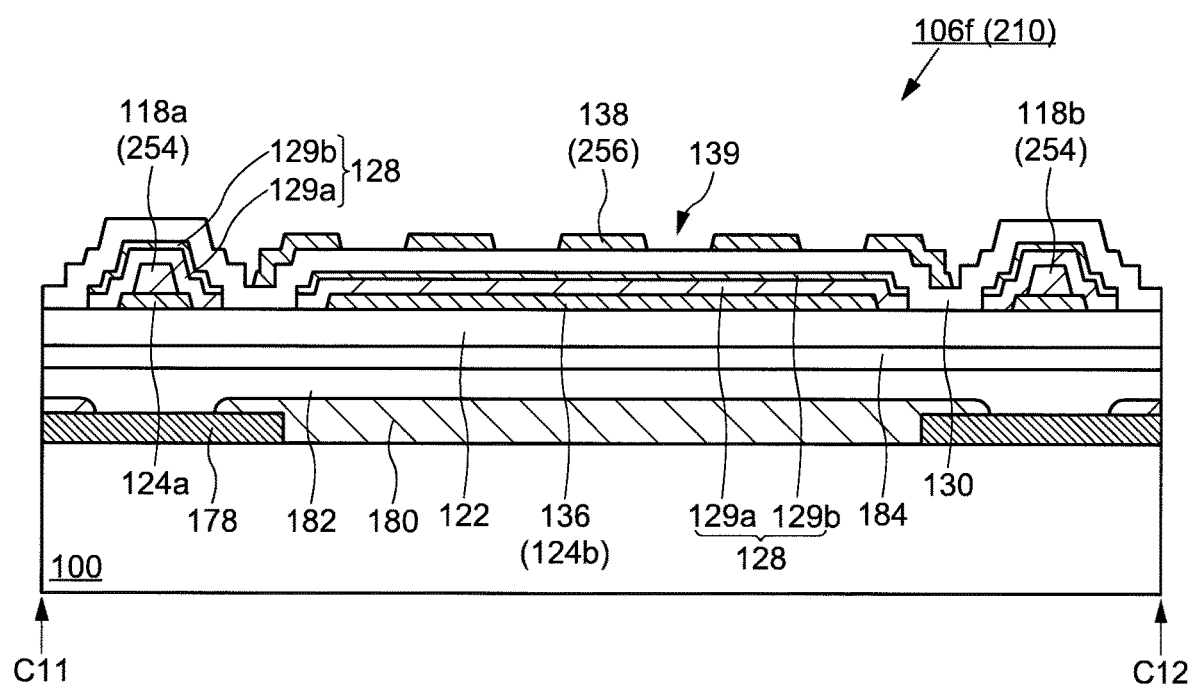
FIG. 31B shows a manufacturing method of a liquid crystal display device according to an embodiment of the present invention, and shows a cross-sectional view corresponding to the line C11-C12 shown in FIG. 30.

As shown in FIGS. 31A and 31B, the light shielding layer 178 and a color filter layer 180 are provided between the first insulating layer 122 and the first substrate 100. The light shielding layer 178 is provided in a region overlapping the transistor 208 and the data signal lines 118a and 118b (and, although not shown, the scan signal lines). The color filter layer 180 is provided in a region overlapping the pixel electrode 136.

An overcoat layer 182 is provided on the light shielding layer 178 and the color filter layer 180. The overcoat layer 182 is formed of a resin material such as polyimide. The uneven surface caused by the pattern of the light shielding layer 178 and the color filter layer 180 is buried by the overcoat layer 182. The overcoat layer 182 has a flat surface.

Further, by providing a silicon nitride film on the overcoat layer 182 as a third insulating layer 184, the influence of impurities from the color filter layer 180 can be reduced.

In the application of portable electronic devices such as smart phones and tablet terminals, it is necessary to miniaturize the size of transistors, wiring, and contact holes in accordance with the miniaturization of pixels for the high definition of a display screen. For example, it is required that the diameter of the contact hole for electrically connecting the top gate and the bottom gate of the dual gate transistor is 2 μm or less. In this case, considering the diameter of the contact hole and the thickness of the insulating layer sandwiching the oxide semiconductor layer above and below, it is necessary to form the contact hole having a high aspect ratio on the mother glass, which increases the difficulty of the manufacturing process.

In the present embodiment, in order to stabilize the characteristics of the transistor 208, the light shielding layer 178 is formed of a conductive material and a predetermined bias (for example, the ground potential) is applied to the light shielding layer 178. That is, the light shielding layer 178 is disposed on surface side of the oxide semiconductor layer 128 on opposite to the second gate electrode 132 and functions as a back-gate electrode, thereby suppressing characteristic changes (for example, a threshold voltage shift) of the transistor 208. The light shielding layer 178 is formed of a metal silicide material such as titanium silicide (TiSix), tantalum silicide (TaSix), molybdenum silicide (MoSix) or the like, so that it has conductivity and heat resistance.

According to the present embodiment, it is possible to stabilize the characteristics of the transistor and to miniaturize the pixel by providing the light-shielding layer having conductivity in overlap with the transistor.

3-2. IPS Mode Liquid Crystal Display Device

As an example of the liquid crystal display device according to an embodiment of the present invention, a liquid crystal display device having IPS mode pixels will be described.

3-2-1. Seventh Embodiment

The present embodiment shows a structure of the liquid crystal display device 200a having pixels of an IPS system in which transistors shown in any of FIG. 7B, FIG. 8, FIG. 9, FIG. 10, and FIG. 11 can be applied.

Figure 32:
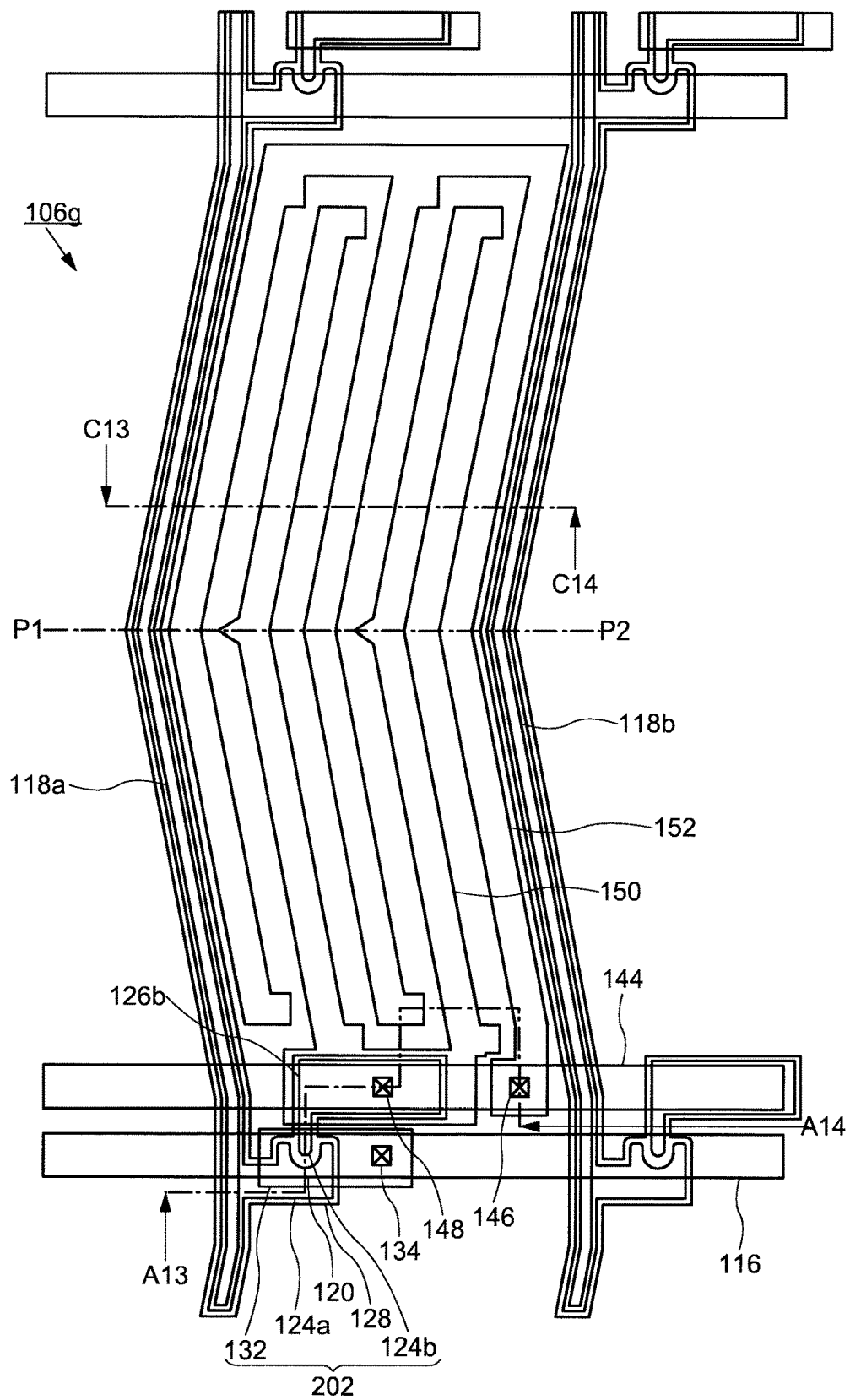
FIG. 32 is a plan view of pixel of a liquid crystal display device according to an embodiment of the present invention.
Figure 33A:
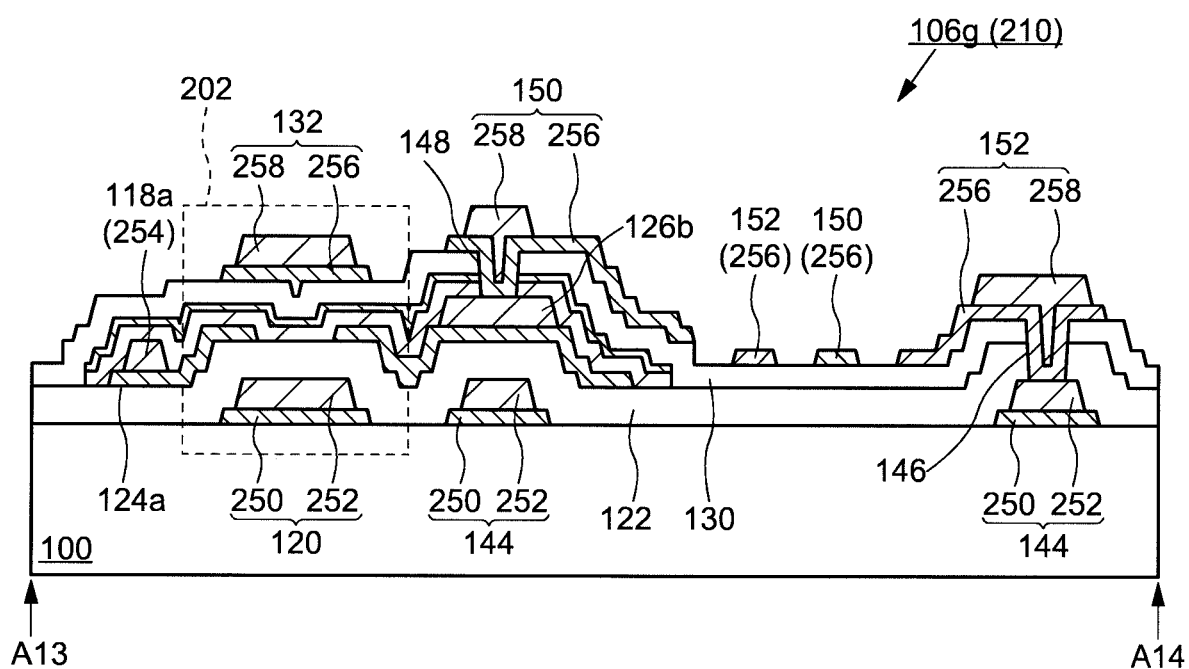
FIG. 33A shows a manufacturing method of a liquid crystal display device according to an embodiment of the present invention, and shows a cross-sectional view corresponding to the line A13-A14 shown in FIG. 32.
Figure 33B:
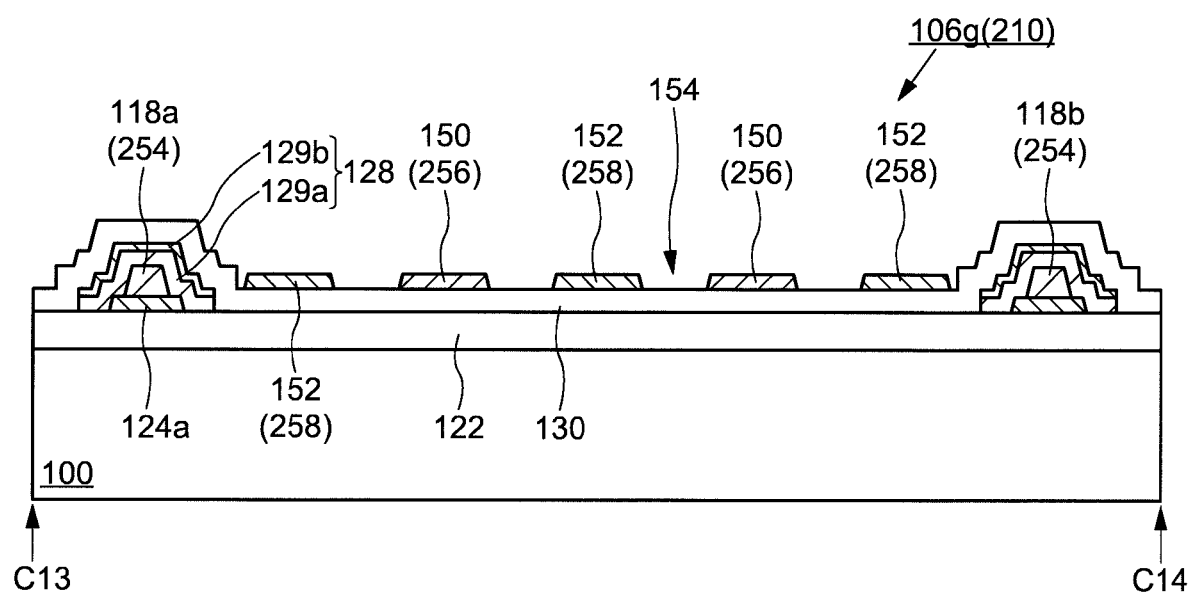
FIG. 33B shows a manufacturing method of a liquid crystal display device according to an embodiment of the present invention, and shows a cross-sectional view corresponding to the line C13-C14 shown in FIG. 32.

FIG. 32 is a schematic plan view of the pixel 106g in the liquid crystal display device 200a according to the present embodiment. The cross-sectional structure of FIG. 32 along line A13-A14 is shown in FIG. 33A, and the cross-sectional structure along line C13-C14 is shown in FIG. 33B. In the following description, the description of the parts common to the first embodiment will be omitted, and the description will focus on the different parts.

As shown in FIG. 32, the pixel 106g includes a transistor 202, a pixel electrode 150, and a common electrode 152. The pixel electrode 150 has a comb-shaped pattern (a plurality of strip patterns), and has a shape bent in one direction at a central portion. The pixel electrode 150 and the common electrode 152 are arranged so that a comb-shaped part bites each other.

The pixel electrode 150 is electrically connected through a third contact hole 148 to the transistor 202, and the common electrode 152 is electrically connected through the second contact hole 146 to the common wiring 144. As shown in FIG. 32, the common wiring 144 is arranged adjacent to the scanning signal line 116 and extends in the first direction. The second contact hole 146 for electrically connecting the common electrode 152 to the common wiring 144 is arranged near the transistor 202. With this layout, the aperture ratio of the pixel 106g can be improved.

As shown in FIG. 33A, the pixel electrode 150 and the common electrode 152 are provided on the second insulating layer 130. The pixel electrode 150 is electrically connected to the transistor 202 via the third contact hole 148 that through the second insulating layer 130 and the oxide semiconductor layer 128. On the upper surface of the second oxide conductive layer 124b, the second metal layer 126b may be provided. The third contact hole 148 is preferably provided at a position overlapping with the second metal layer 126b. Since the fourth conductive layer 256 is in contact with the second metal layer 126b through the third contact hole 148, the pixel electrode 150 and the transistor 202 can be reliably electrically connected. On the other hand, as in the first embodiment, the common electrode 152 is electrically connected through the second contact hole 146 to the common wiring 144.

As shown in FIG. 33B, the pixel electrode 150 and the common electrode 152 are alternately arranged on the second insulating layer 130 with a gap 154. With such an arrangement, the pixel electrode 150 and the common electrode 152 can be formed in the same process, and the manufacturing process can be simplified. Since the pixel electrode 150 and the common electrode 152 can be formed by using a conductive layer (the fourth conductive layer 256, the fifth conductive layer 258) for forming the second gate electrode 132 of the transistor 202, an increase in the number of manufacturing steps can be prevented.

Figure 34:
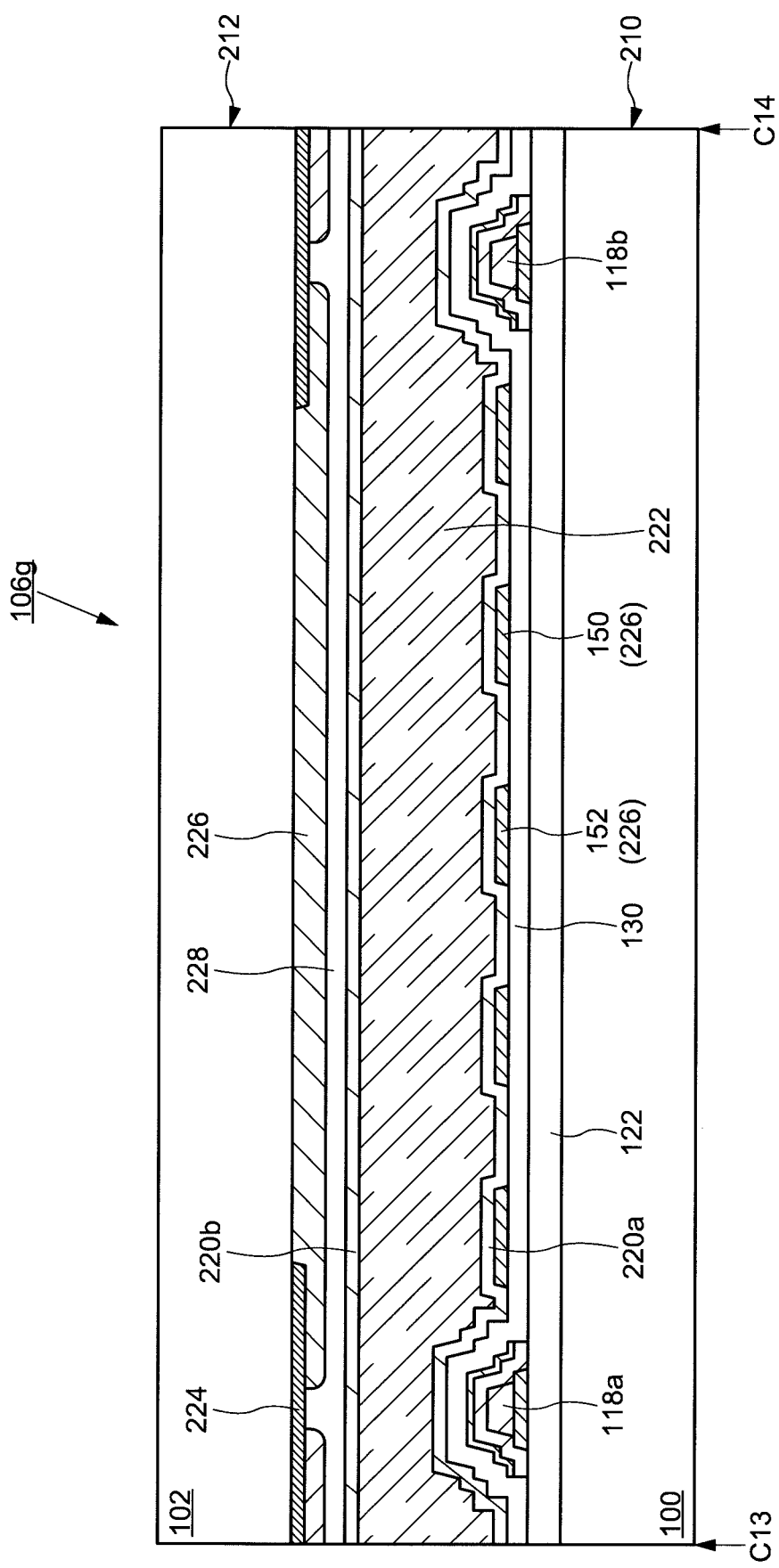
FIG. 34 shows a cross-sectional view of a pixel in a liquid crystal display device according to an embodiment of the present invention in which an element substrate, a opposite substrate, and a liquid crystal layer are arranged.

FIG. 34 shows a cross-sectional structure of the pixel 106g along the line C9-C10 shown in FIG. 33. Specifically, in contrast to the structure of the element substrate 210 shown in FIG. 33B, the opposite substrate 212 and the liquid crystal layer 222 are provided.

The alignment film 220a is provided on the element substrate 210 so as to cover the pixel electrode 150 and the common electrode 152. The configuration of the opposite substrate 212 is the same as that shown in FIG. 15 in the first embodiment. In this embodiment as well, the alignment films 220a, 220b are horizontal alignment films.

In the liquid crystal display device 200a according to this embodiment, similarly to the first embodiment, the scanning signal lines are embedded in the first insulating layer 122 and the second insulating layer 130, and the data signal lines 118a, 118b are embedded in the second insulating layer 130. Therefore, the adhesion of the sealing material for bonding the element substrate 210 and the opposite substrate 212 can be enhanced, and the reliability can be improved.

3-2-2. Eighth Embodiment

This embodiment shows an aspect in which the forms of the pixel electrode and the common electrode is different from that of the pixel 106g shown in the seventh embodiment. In the following description, parts different from those of the seventh embodiment will be mainly described, and description of the same configuration will be omitted as appropriate.

Figure 35:
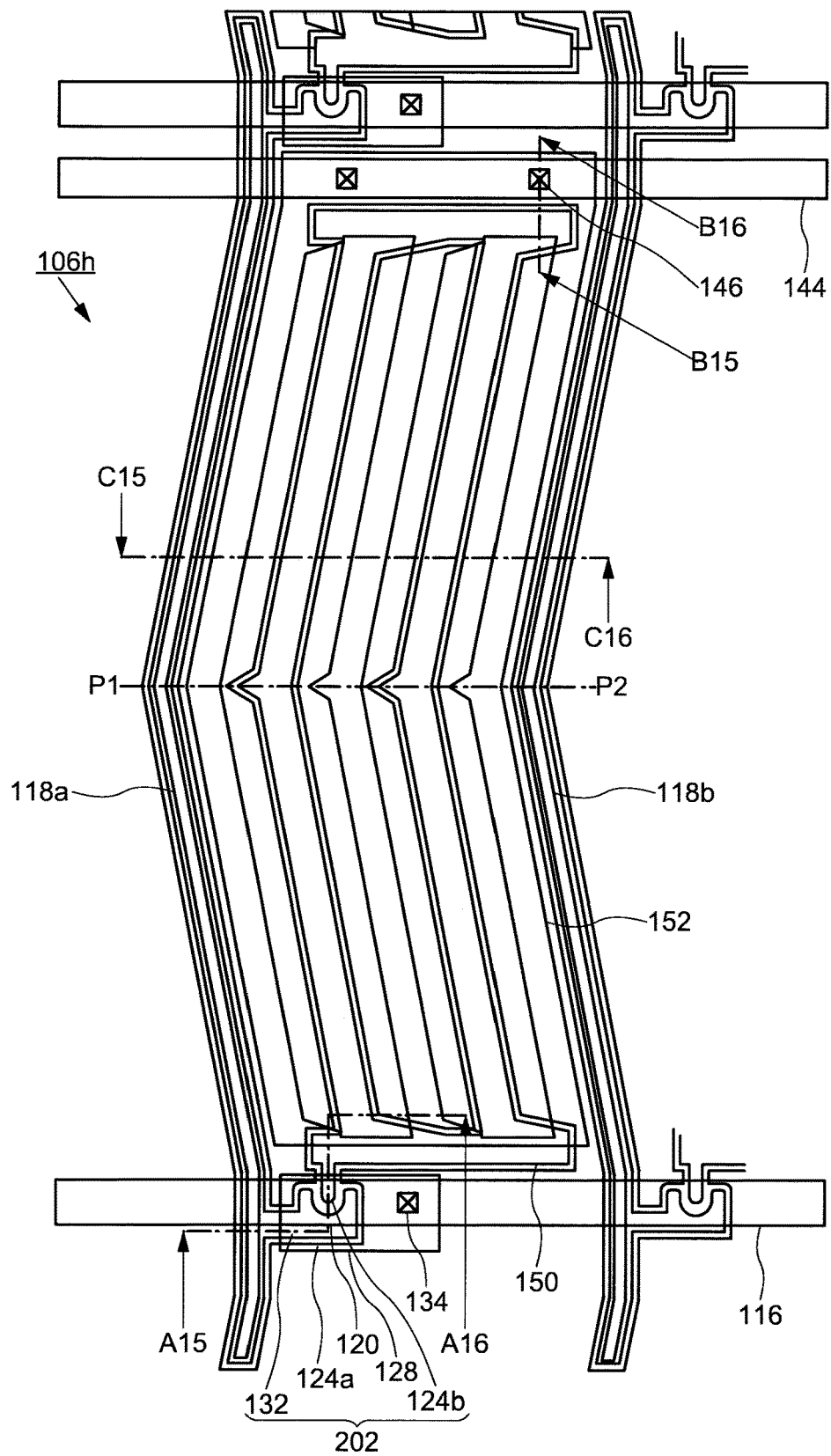
FIG. 35 is a plan view of pixel of a liquid crystal display device according to an embodiment of the present invention.

FIG. 35 is a schematic plan view of the pixel 106h in the liquid crystal display device 200a according to the present embodiment. The cross-sectional structure of FIG. 35 along lines A15-A16 and B15-B16 are shown in FIG. 36A, and the cross-sectional structure along line C15-C16 is shown in FIG. 36B.

As shown in FIG. 35, the pixel 106h includes a connection portion for connecting the common electrode 152 and the common wiring 144, and the connection portion is provided at a position away from the transistor 202. Specifically, the common wiring 144 is arranged adjacent to the scanning signal lines of adjacent pixels. The common electrode 152 is provided on a layer different from the pixel electrode 150 via an insulating layer.

Figure 36A:
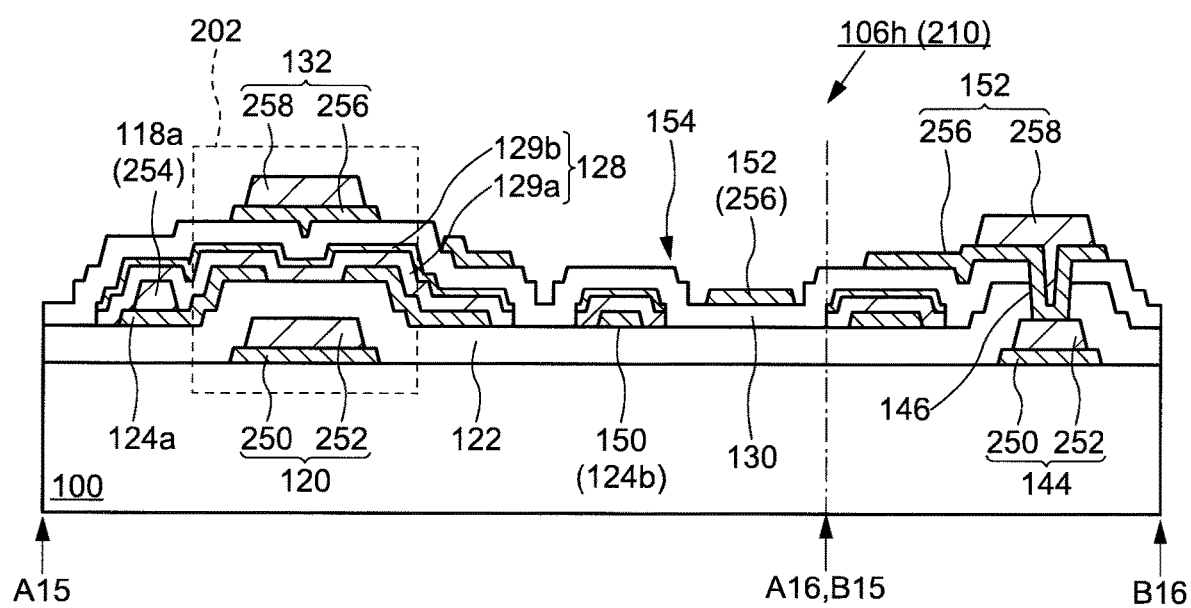
FIG. 36A shows a manufacturing method of a liquid crystal display device according to an embodiment of the present invention, and shows a cross-sectional view corresponding to the lines A15-A16 and B15-B16 shown in FIG. 25.

As shown in FIG. 36A, the pixel electrode 150 has a structure continuous from the second oxide conductive layer 124b of the transistor 202. In other words, the pixel electrode 150 is electrically connected to the transistor 202 without a contact hole. On the other hand, the common electrode 152 is electrically connected through the second contact hole 146 to the common wiring 144. The second insulating layer 130 is provided between the pixel electrode 150 and the common electrode 152.

Figure 36B:
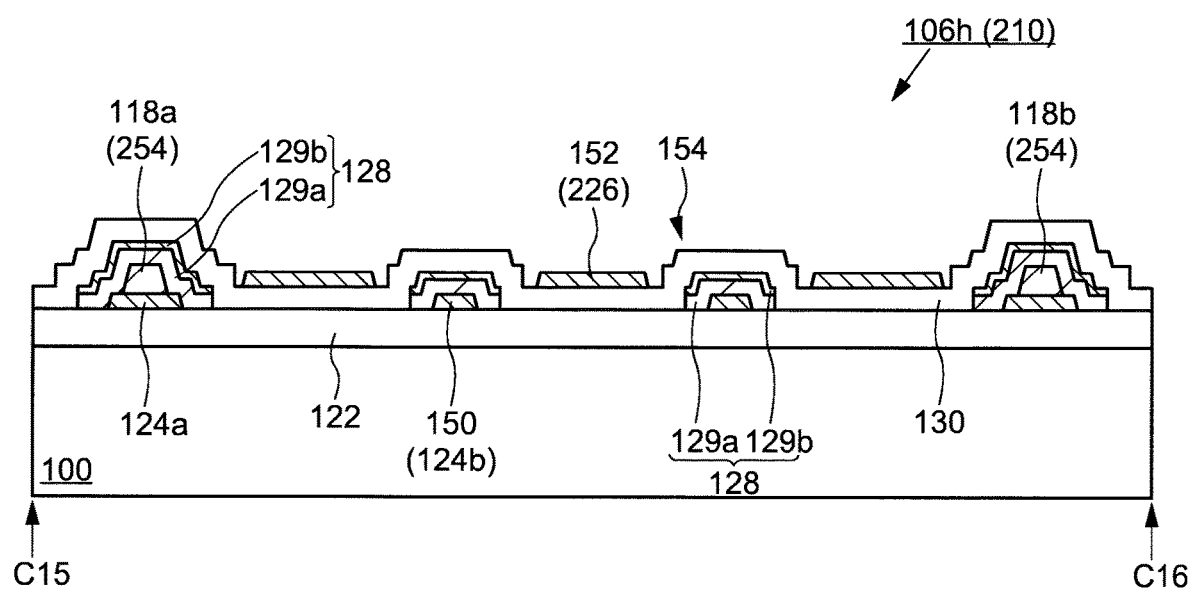
FIG. 36B shows a manufacturing method of a liquid crystal display device according to an embodiment of the present invention, and shows a cross-sectional view corresponding to the line C15-C16 shown in FIG. 35.

As shown in FIG. 36B, the pixel electrode 150 and the common electrode 152 are disposed with the second insulating layer 130 interposed therebetween. The gap 154 is provided between the pixel electrode 150 and the common electrode 152, and the pixel electrodes 150 and the common electrodes 152 are arranged alternately. Even if the width of the gap 154 is narrowed, a short circuit between the pixel electrode 150 and the common electrode 152 can be prevented by providing the second insulating layer 130 between the pixel electrode 150 and the common electrode 152. The electric field strength can be enhanced by narrowing the gap 154 between the pixel electrode 150 and the common electrode 152, and the driving voltage of the liquid crystal element can be lowered. Since the pixel electrode 150 has a structure electrically connected to the transistor 202 without a contact hole, the effective area of the pixel electrode can be increased by the amount of omission of the contact hole, and the aperture ratio can be increased. Since the pixel electrode 150 has a structure electrically connected to the transistor 202 without through a contact hole, the contact hole can be reduced to increase the effective area of the pixel electrode, and the aperture ratio can be increased.

The pixel 106h shown in this embodiment has the same configuration as the pixel 106g shown in the seventh embodiment except that the configuration of the pixel electrode 150 is different from that of the common electrode 152. Therefore, the liquid crystal display device 200a according to the present embodiment exhibits advantageous effects similar to those of the seventh embodiment in addition to the advantageous effects described above.

3-2-3. Ninth Embodiment

This embodiment shows an aspect in which the forms of the pixel electrode and the common electrode is different from that of the pixel 106g shown in the seventh embodiment. In the following description, parts different from those of the seventh embodiment will be mainly described, and description of the same configuration will be omitted as appropriate.

Figure 37:
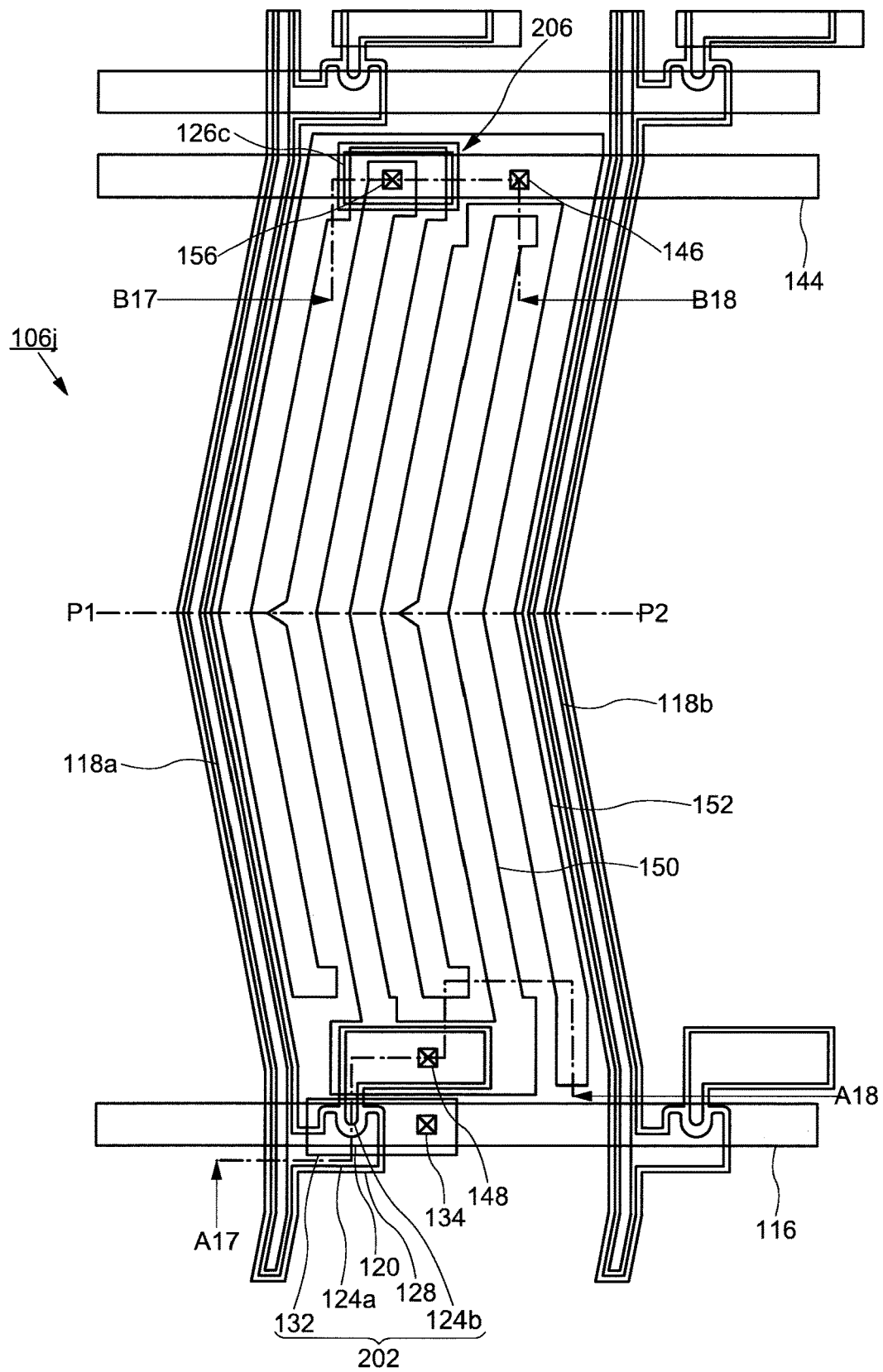
FIG. 37 is a plan view of pixel of a liquid crystal display device according to an embodiment of the present invention.

FIG. 37 is a schematic plan view of the pixel 106j in the liquid crystal display device 200a according to the present embodiment. The cross-sectional structure of FIG. 37 along line A17-A18 is shown in FIG. 38A, and the cross-sectional structure along line B17-B18 is shown in FIG. 38B.

As shown in FIG. 37, the pixel electrode 150 and the common electrode 152 of the pixel 106j are provided on the same insulating surface, similarly to the seventh embodiment. Since the pixel electrode and the common electrode are arranged close to each other in the IPS mode pixel, the capacitance generated between the pixel electrode and the common electrode is used as the retention capacitance. On the other hand, in the pixel 106*j* according to the present embodiment, an electrode formed of the fourth metal layer 126*d* (and the fourth oxide conductive layer 124*d*) is provided so as to overlap the common wiring 144. The pixel 106*j* has a structure in which the common wiring 144 and the fourth metal layer 126*d* form the retention capacitance element 206 in the pixel. The fourth metal layer 126*d* is electrically connected through a fourth contact hole 156 to the pixel electrode 150.

Figure 38A:
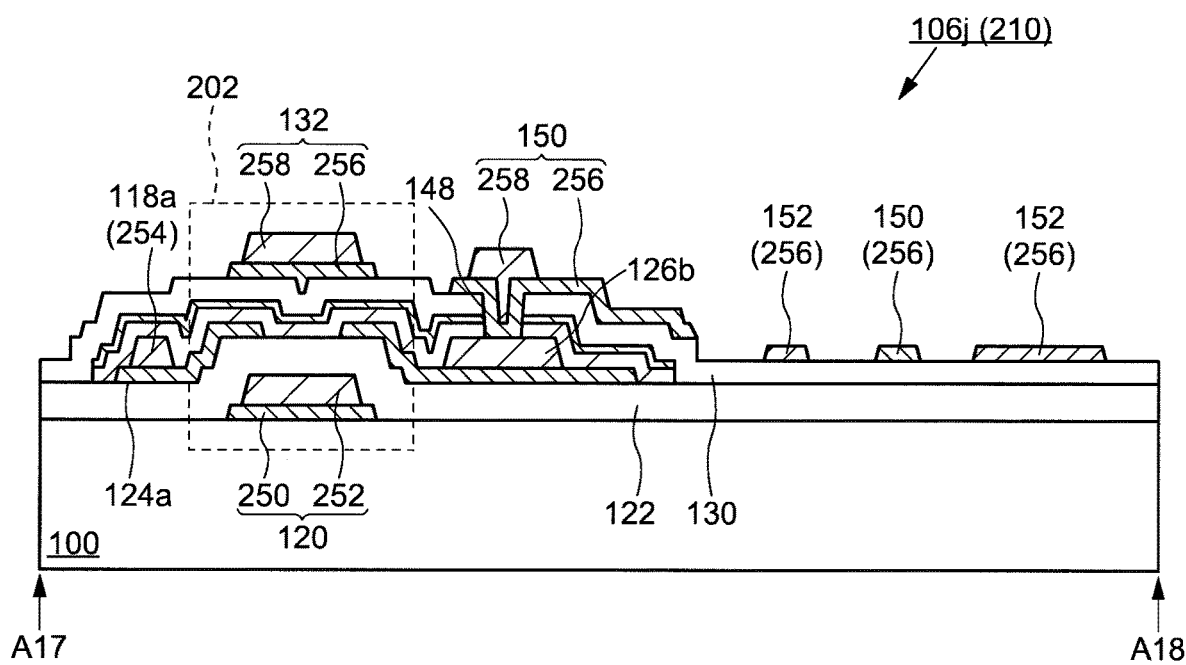
FIG. 38A shows the cross-sectional structure of the pixels corresponding to line A17-A18 shown in FIG. 37.
Figure 38B:
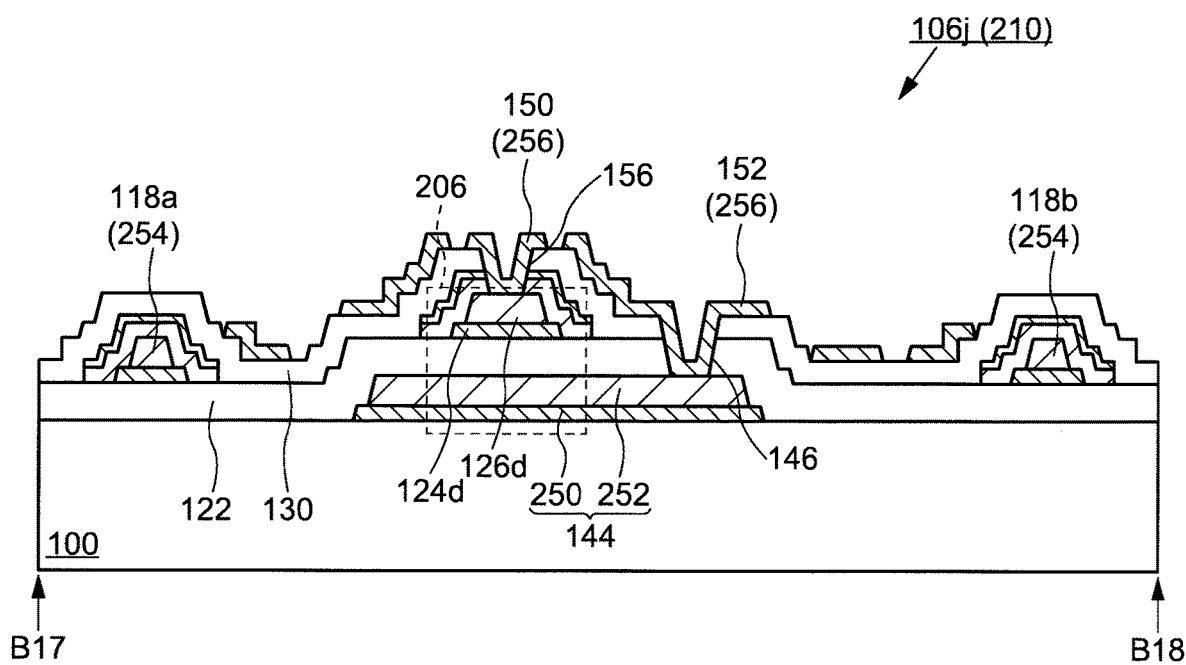
FIG. 38B shows the cross-sectional structure of the pixels corresponding to line B17-B18 shown in FIG. 37.

As shown in FIG. 38A, the connection structure between the pixel electrode 150 and the transistor 202 is the same as that of the seventh embodiment. The common wiring 144 is arranged adjacent to the scanning signal line of the adjacent pixel, and is electrically connected via the second contact hole 146 to the common electrode 152. As shown in FIG. 38B, in a region where the fourth metal layer 126*d* (and the fourth oxide conductive layer 124*d*) and the common wiring 144 overlap, the retention capacitance element 206 is formed. The retention capacitance element 206 is electrically connected through the fourth contact hole 156 to the pixel electrode 150. The fourth metal layer 126*d* (and the fourth oxide conductive layer 124*d*) is provided on the first insulating layer 122 along the longitudinal direction of the common wiring 144. The length of overlap between the fourth metal layer 126*d* (and the fourth oxide conductive layer 124*d*) and the common wiring 144 can be adjusted by the pixel design. The magnitude of the capacitance of the retention capacitance element 206 can be adjusted by the length in which the fourth metal layer 126*d* (and the fourth oxide conductive layer 124*d*) and the common wiring 144 overlap. Since the pixel 106*j* is provided with the retention capacitor element 206, the voltage of the pixel electrode 150 can be more stably kept constant.

The pixel 106*j* shown in this embodiment is substantially the same as the configuration according to the seventh embodiment except that the retention capacitance element 206 is intentionally provided. Therefore, the liquid crystal display device 200*a* according to the present embodiment exhibits advantageous effects similar to those of the seventh embodiment in addition to the advantageous effects described above.

3-3. PVSA Mode Liquid Crystal Display Device

As an example of a liquid crystal display device according to an embodiment of the present invention, a liquid crystal display device having pixels of the PSVA mode will be described.

3-3-1. Tenth Embodiment

The present embodiment shows a structure of the liquid crystal display device 200*b* having pixels of the PVSA mode in which transistors shown in any of FIGS. 7A and 7B, FIG. 8, FIG. 9, FIG. 10, and FIG. 11 can be applied.

3-3-1-1. Configuration of the Pixel

Figure 39:
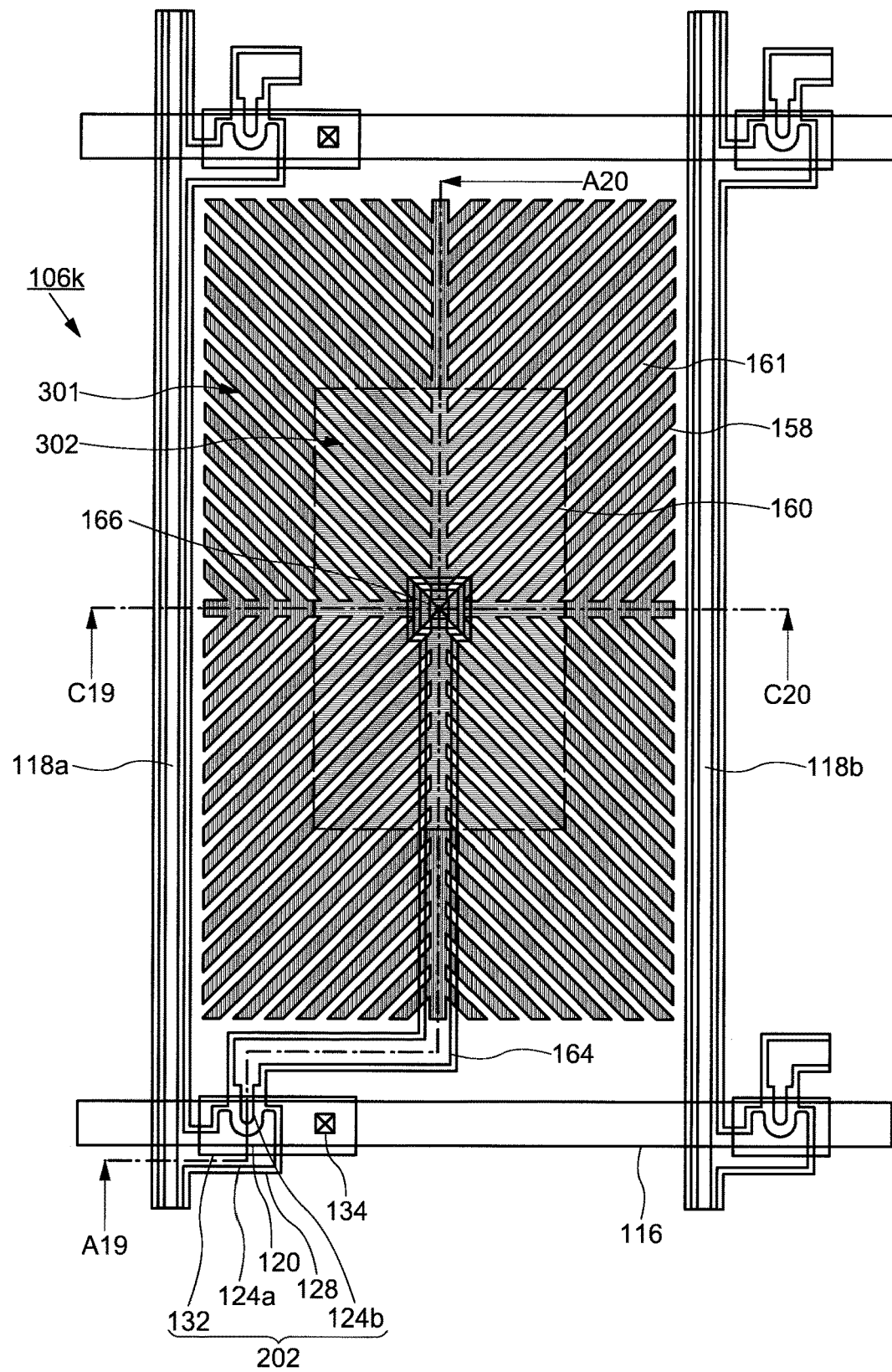
FIG. 39 is a plan view of pixel of a liquid crystal display device according to an embodiment of the present invention.
Figure 40A:
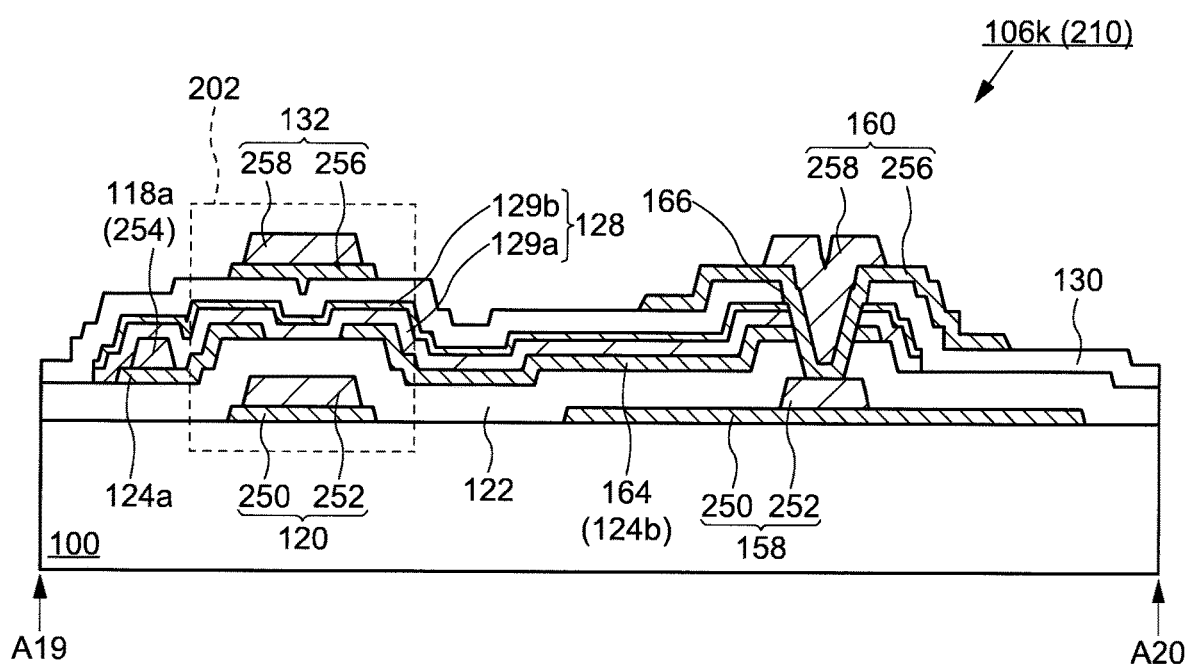
FIG. 40A shows the cross-sectional structure of the pixels corresponding to line A19-A20 shown in FIG. 39.
Figure 40B:
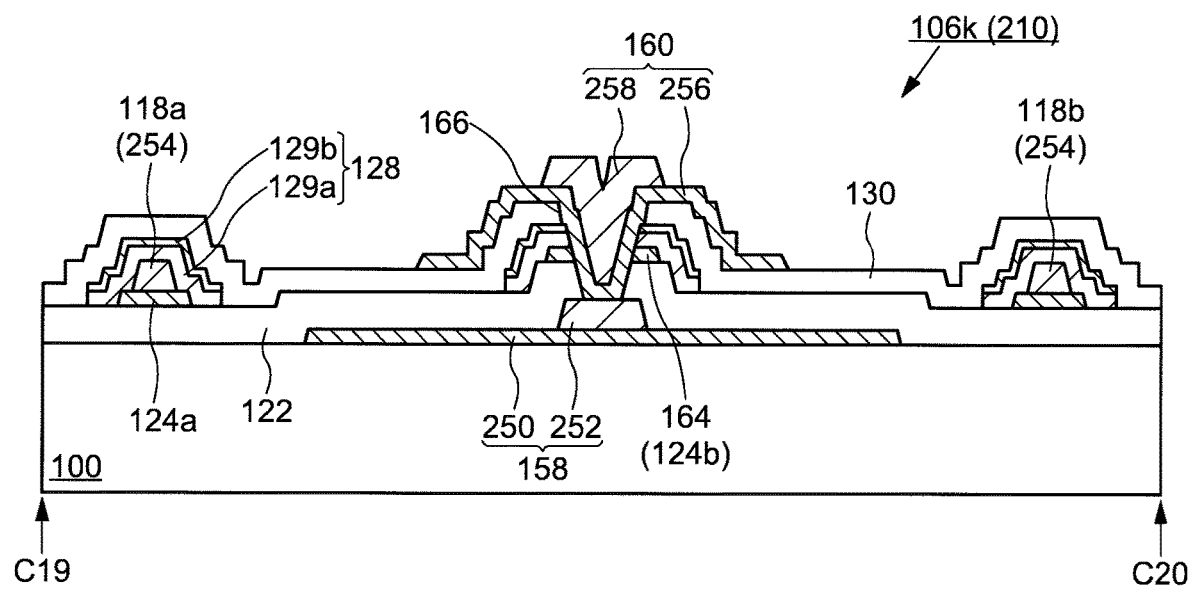
FIG. 40B shows the cross-sectional structure of the pixels corresponding to line C19-C20 shown in FIG. 39.

FIG. 39 is a schematic plan view of the pixel 106*k* in the liquid crystal display device 200*b* according to the present embodiment. The cross-sectional structure of FIG. 39 along line A19-A20 is shown in FIG. 40A, and the cross-sectional structure along line C19-C20 is shown in FIG. 40B.

As shown in FIG. 39, the pixel 106*k* includes the transistor 202, a first pixel electrode 158, and a second pixel electrode 160. Although not shown in FIG. 39, the second substrate 102 provided with the color filter layer or the like is provided with a opposite electrode (162). The first pixel electrode 158 and the second pixel electrode 160 are arranged so as to be overlapped with each other with their center positions being substantially the same. Since the size of the second pixel electrode 160 in plan view is smaller than the size of the first pixel electrode 158 in plan view, the second pixel electrode 160 is arranged inside the first pixel electrode 158.

The first pixel electrode 158 and the second pixel electrode 160 are provided with slits 161. The slits 161 has a fine structure having a width of about 3 μm and a pitch of about 6 μm, for example. The slits 161 are provided so as to be inclined in four directions in the first pixel electrode 158 and the second pixel electrode 160. In other words, the first pixel electrode 158 and the second pixel electrode 160 are provided with slits radiating from the center. When a voltage is applied to the pixel electrode, the liquid crystal molecules have the property of being inclined in the direction parallel to the slit, so that in the pixel 106 *k* shown in FIG. 39, four domains can be formed.

A wiring 164 electrically connects the first pixel electrode 158 and the second pixel electrode 160 to the transistor 202. The first pixel electrode 158 and the second pixel electrode 160 are electrically connected through the fifth contact hole 166 to the wiring 164. The same voltage is applied to the first pixel electrode 158 and the second pixel electrode 160 via the transistor 202.

As shown in FIGS. 40A and 40B, the first pixel electrode 158 is provided between the first substrate 100 and the first insulating layer 122, and the second pixel electrode 160 is provided on the second insulating layer 130. The first pixel electrode 158 and the second pixel electrode 160 are electrically connected to each other through the first insulating layer 122 and the second insulating layer 130 (further, it passes through the second oxide conductive layer 124*b* and the oxide semiconductor layer 128) in the fifth contact hole 166, and the parts where slits are provided are provided in different layers.

The second pixel electrode 160 is provided along the side surface of the fifth contact hole 166 and is in contact with the first pixel electrode 158 exposed at the bottom surface part. At the side surface portion of the fifth contact hole 166, the wiring 164 is exposed, and the second pixel electrode 160 is electrically connected to the wiring 164 at the exposed portion. As a result, the first pixel electrode 158 is also electrically connected to the wiring 164.

The first pixel electrode 158 is formed of the first conductive layer 250. At a part where the fifth contact hole 166 of the first pixel electrode 158 is disposed a conductive pattern by the second conductive layer 252. The second pixel electrode 160 is formed of the fourth conductive layer 256. At a portion where the fifth contact hole 166 in the second pixel electrode 160 is disposed a conductive pattern by the fifth conductive layer 258. The first conductive layer 250 and the fourth conductive layer 256 are transparent conductive films, and the second conductive layer 252 and the fifth conductive layer 258 are metal films. As shown in FIGS. 40A and 40B, when the fifth contact hole 166 is overlapped with the second conductive layer 252 and the fifth conductive layer 258, the first pixel electrode 158, the second pixel electrode 160, and the wiring 164 can be reliably electrically connected, and the contact resistance can be reduced.

Figure 41:
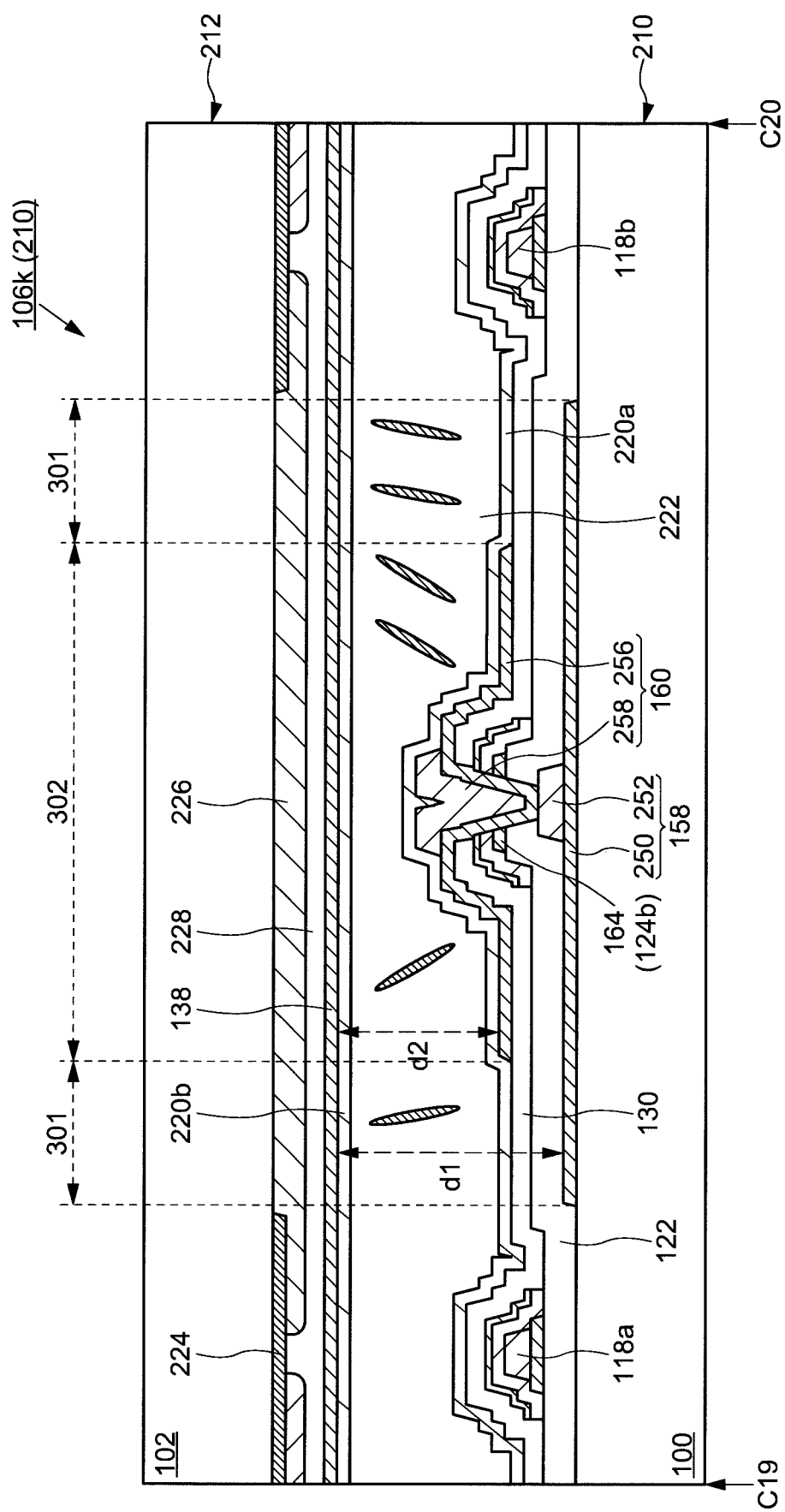
FIG. 41 is a cross-sectional view of a pixel of a liquid crystal display device according to an embodiment of the present invention, showing a structure in which an element substrate, a opposite substrate, and a liquid crystal layer are arranged.

FIG. 41 shows a cross-sectional structure of the pixel 106*k* along the line C15-C16 shown in FIG. 39. Specifically, FIG. 41 shows the structure of the pixel 106*k* provided with the opposite substrate 212 and the liquid crystal layer 222 in addition to the structure of the element substrate 210 shown in FIG. 40B.

The first pixel electrode 158 and the second pixel electrode 160 are disposed on the element substrate 210, and the common electrode 138 is disposed on the opposite substrate 212. The first pixel electrode 158 and the second pixel electrode 160 are disposed so as to face the common electrode 138. The first pixel electrode 158 and the second pixel electrode 160 are disposed so as to be different in height from the surface of the first substrate 100. Therefore, each distance between the first pixel electrode 158 and the second pixel electrode 160 and the common electrode 138 are different. When the distance between the first pixel electrode 158 and the common electrode 138 is denoted as d1 and the distance between the second pixel electrode 160 and the common electrode 138 is denoted as d2, the relation d1>d2 is obtained.

Voltage based on a video signal is applied to the first pixel electrode 158 and the second pixel electrode 160, and the common electrode 138 is held at a constant voltage. The same voltage is applied to the first pixel electrode 158 and the second pixel electrode 160. As a result, the intensity of the electric field E1 of a first region 301 of the pixel 106$k$ generated between the first pixel electrode 158 and the common electrode 138 is different from the intensity of the electric field E2 of a second region 302 of the pixel 106$k$ generated between the second pixel electrode 160 and the common electrode 138. In this case, the electric field intensity becomes E2>E1 from the relationship between the electrode intervals. As a result, in the liquid crystal layer 222, with respect to the liquid crystal molecules in the first region 301 of the pixel 106$k$, the liquid crystal molecules in the second region 302 of the pixel 106$k$ are subjected to the action of the electric field E2, and the angle of alignment largely changes.

Figure 42:
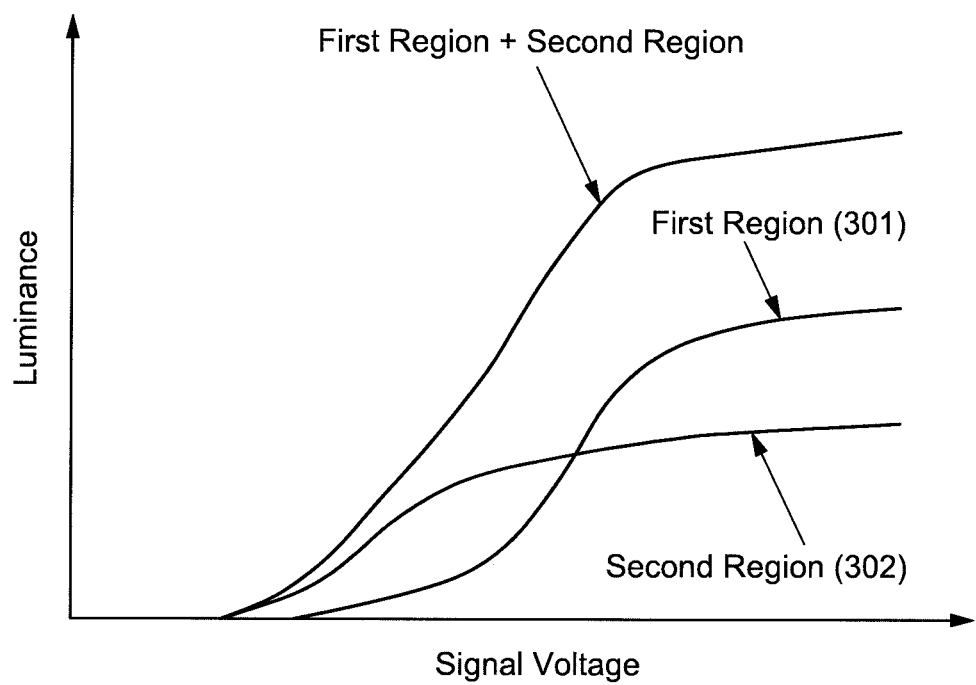
FIG. 42 is a graph schematically showing a relationship between luminance characteristics and applied signal voltages of pixels of a liquid crystal display device according to an embodiment of the present invention.

The area of the first region 301 is smaller than that of the second region 302. For example, the area ratio between the first region 301 and the second region 302 has a relationship of 2:1. FIG. 42 is a graph schematically showing the relationship of the luminance characteristic to the applied signal voltage when the area ratio of the first region 301 to the second region 302 in the pixel 106$k$ is in the above-described relationship. Since the area of the second region 302 and that of the first region 301 are relatively large, the applied signal voltage is high and the luminance in the saturated state in which the liquid crystal molecules are aligned becomes high. On the other hand, in the second region 302, since the electric field strength generated by the applied signal voltage is high, the luminance rises from the low applied signal voltage.

The dynamic range can be expanded as the image quality of the liquid crystal display device 200$b$ by providing two of pixel electrodes different from the common electrode 138 (the first pixel electrode 158, the second pixel electrode 160). In the pixel 106$k$, the first pixel electrode 158 and the second pixel electrode 160 are provided with slits 161 inclined in four directions, so that at least eight domains can be formed in the liquid crystal layer 222. The liquid crystal display device 200$b$ according to the present embodiment is provided with such pixels 106$k$, whereby the viewing angle can be widened. Further, in the pixel of the liquid crystal display device 200$b$, the portion where the pixel electrode overlaps with the contact hole is a cause of the alignment disturbance of the liquid crystal, so that it is necessary to shield the pixel from light. As shown in this embodiment, the contact holes for connecting the pixel electrodes are formed as one contact hole, so that the reduction of the aperture ratio can be suppressed.

Also, in this embodiment, the same wiring structure and sealing structure as in the first embodiment can be formed, and the manufacturing process of the liquid crystal display device 200$b$ can be simplified to enhance the reliability.

3-3-1-2. Manufacturing Method

The manufacturing method of the liquid crystal display device 200$b$ according to the present embodiment will be described in detail with reference to the drawings. As described below, the liquid crystal display device 200$b$ according to this embodiment can be manufactured by using five photomasks.

Figure 43A:
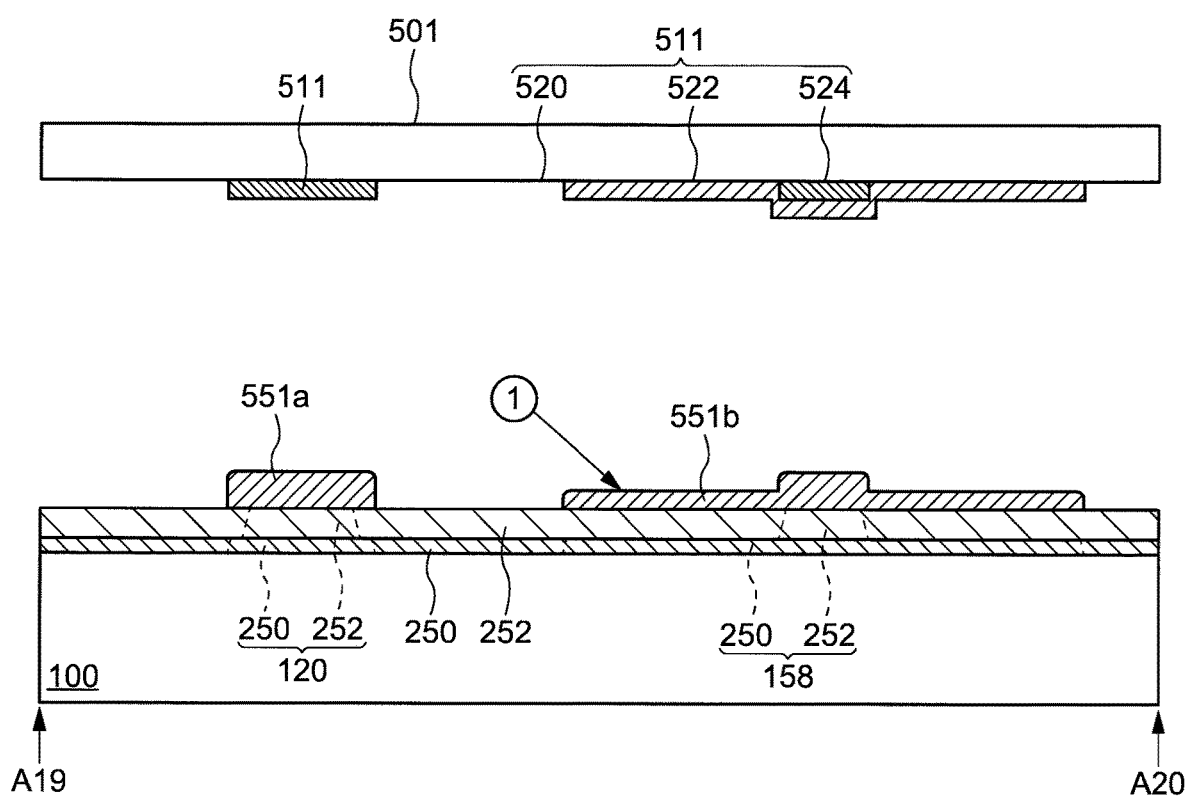
FIG. 43A shows a manufacturing method of a liquid crystal display device according to an embodiment of the present invention, and shows a cross-sectional view corresponding to the line A19-A20 shown in FIG. 39.
Figure 43B:
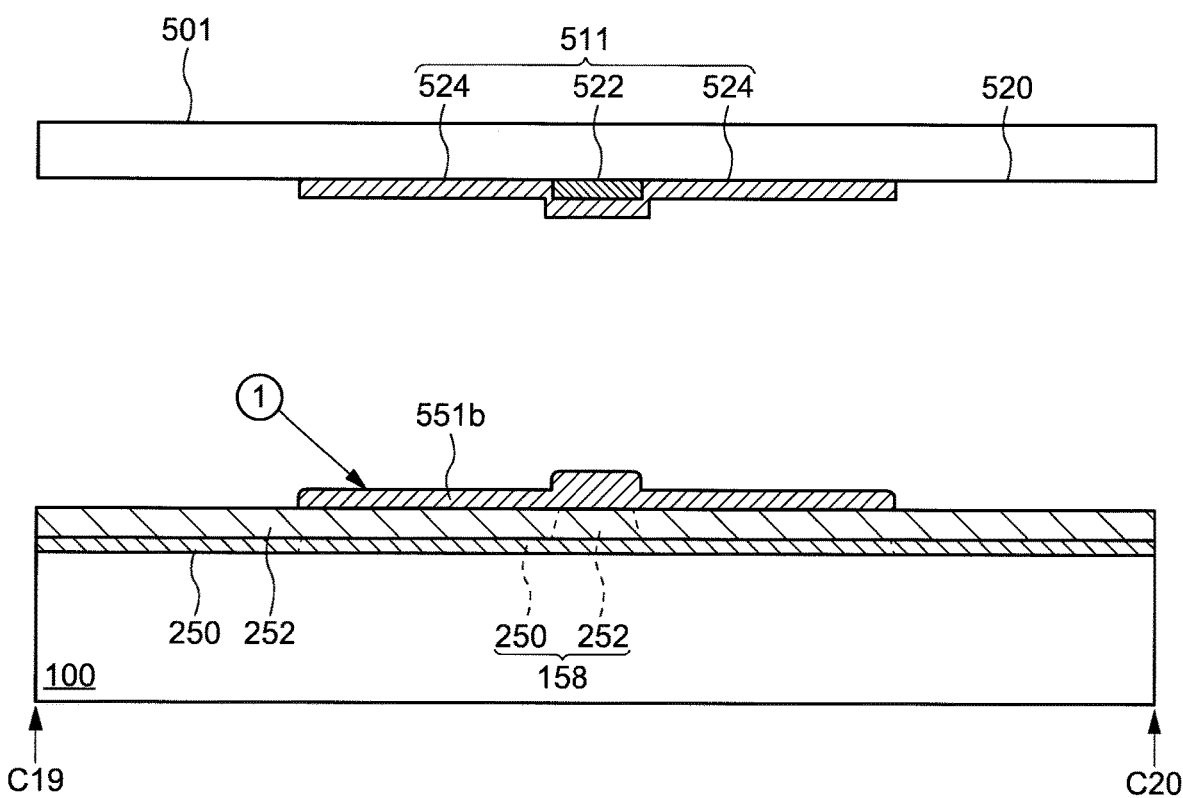
FIG. 43B shows a manufacturing method of a liquid crystal display device according to an embodiment of the present invention, and shows a cross-sectional view corresponding to the line C19-C20 shown in FIG. 39.

FIGS. 43A and 43B show the steps of forming the first gate electrode 120 and the first pixel electrode 158 on the first substrate 100. Although not shown, scanning signal lines are formed simultaneously with the first gate electrode 120 at this step.

As in the first embodiment, the first conductive layer 250 and the second conductive layer 252 are formed on the first substrate 100. Next, a first resist mask 551 is formed on the second conductive layer 252 with the first conductive layer 250 and the second conductive layer 252 formed on substantially the entire surface of the first substrate 100. The first resist mask 551 is formed by a first photomask 501. The first photomask 501 is a halftone mask. The first photomask 501 has a first mask pattern 511. The first mask pattern 511 includes a pattern for the first gate electrode 120, the first pixel electrode 158, and the pattern of the scanning signal line (116) where not shown. The first mask pattern 511 includes, in a pattern forming the first pixel electrode 158, a light shielding part 524 and a translucent part 522 for reducing the transmitted light quantity of light. FIGS. 43A and 43B show a case where a positive photoresist is used. FIG. 43B is a cross-sectional view of the vicinity of the center of the pixel 106$j$, showing a region where the first pixel electrode 158 is formed.

The circled numeral "1" shown in FIG. 43A indicates that the first resist mask 551 is formed by the first photomask 501. The first gate electrode 120, the first pixel electrode 158, and a scanning signal line (not shown (116)), are formed by using the first resist mask 551 to etch the first conductive layer 250 and the second conductive layer 252. The first pixel electrode 158 can be formed in a shape having a part where the slits 161 formed by the first conductive layer 250 is formed and a part where the second conductive layer 252 remains at a substantially central part by using the halftone mask.

Figure 44A:
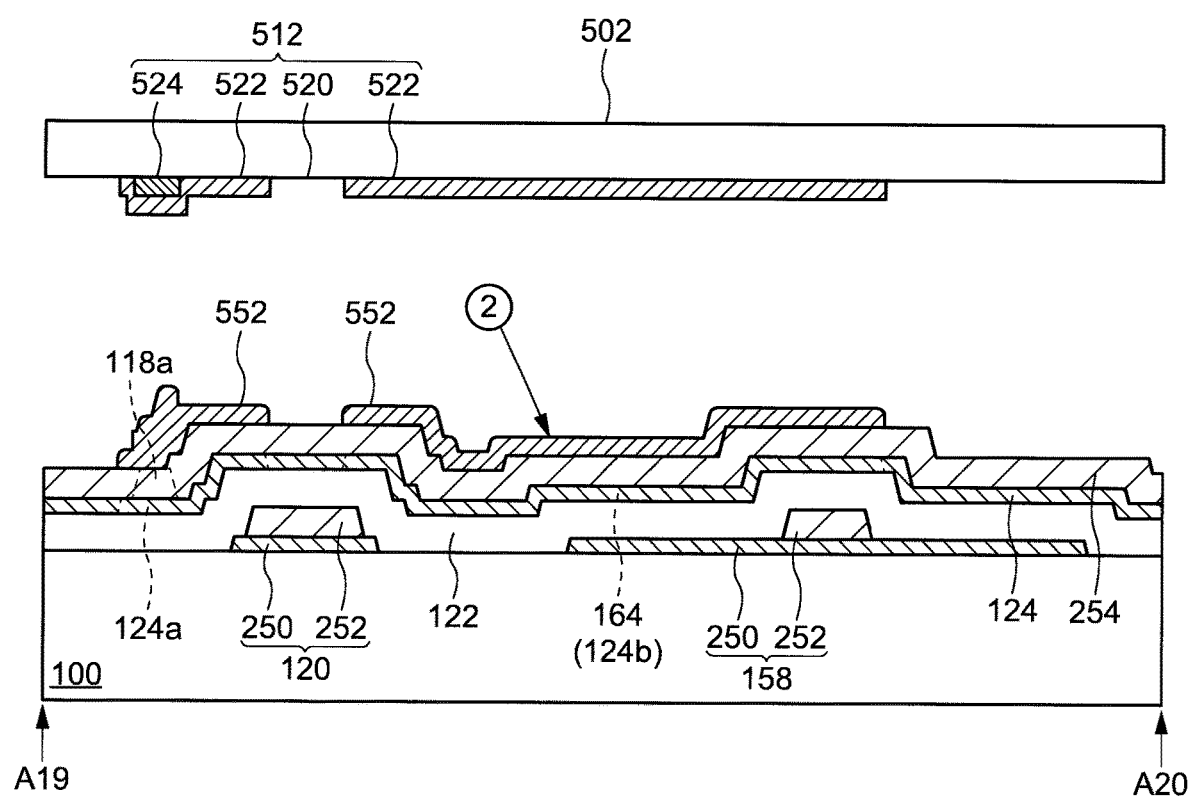
FIG. 44A shows a manufacturing method of a liquid crystal display device according to an embodiment of the present invention, and shows a cross-sectional view corresponding to the line A19-A20 shown in FIG. 39.
Figure 44B:
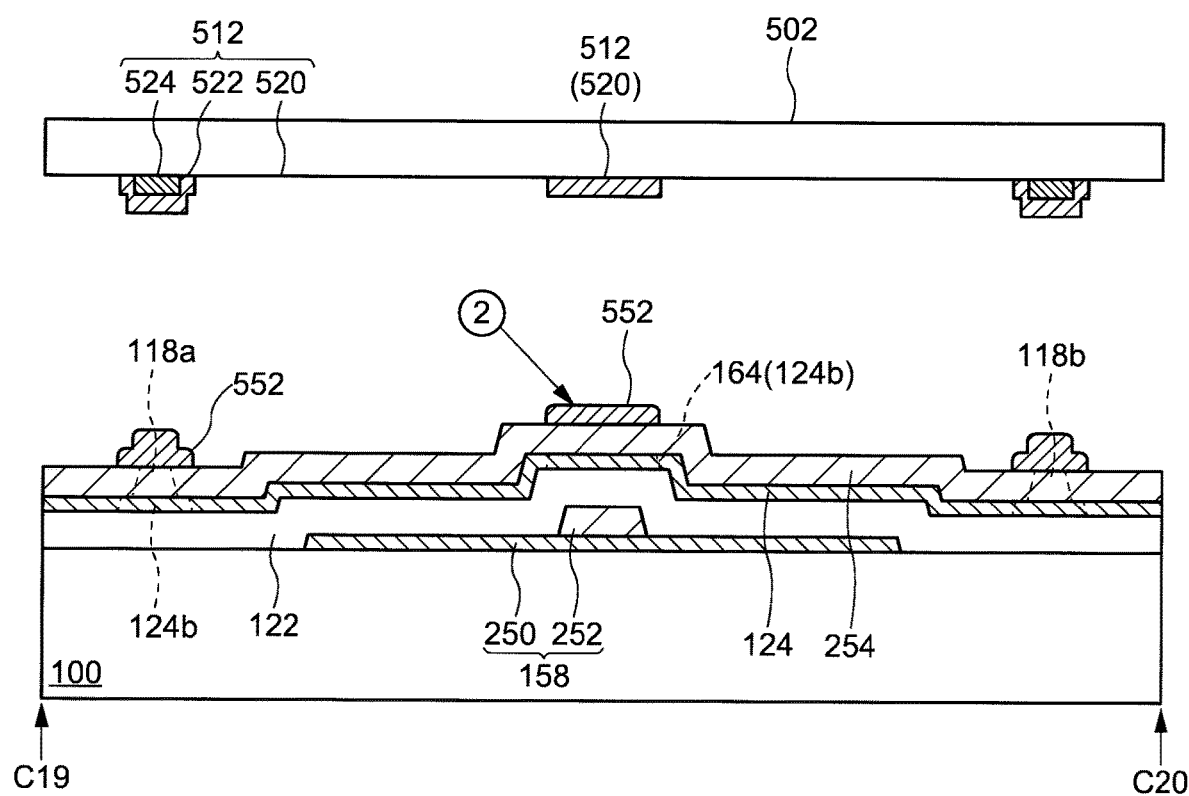
FIG. 44B shows a manufacturing method of a liquid crystal display device according to an embodiment of the present invention, and shows a cross-sectional view corresponding to the line C19-C20 shown in FIG. 39.

FIGS. 44A and 44B illustrate the steps of forming the first insulating layer 122, the oxide conductive layer 124, and the third conductive layer 254 on the first substrate 100 provided with the first gate electrode 120, the first pixel electrode 158, and a scanning signal line (116) where not shown, and forming the second resist mask 452 thereon.

The first insulating layer 122, the oxide conductive layer 124, and the third conductive layer 254 are formed in the same manner as in the first embodiment. A second resist mask 552 is formed on the upper surface of the third conductive layer 254. The second resist mask 552 is formed by using a second photomask 502. The second photomask 502 has a second mask pattern 512 including a semitransparent part 522 and the light shielding part 524 for reducing the quantity of transmitted light. The second photomask 502 is a halftone mask different from the binary mask (photomask that formed of transmission part and light shielding part). The second mask pattern 512 includes a light shielding part 524 for forming the data signal lines 118$a$, 118$b$, and a semitransparent part 522 for forming the first oxide conductive layer 124$a$ and the second oxide conductive layer 124$b$.

The second resist mask 552 is formed by exposing the photoresist film using the second photomask 502. The circled numeral "2" shown in FIGS. 44A and 44B indicates that the second resist mask 552 is formed by the second photomask 502.

As shown in FIGS. 44A and 44B, the second resist mask 552 has a pattern corresponding to the first oxide conductive layer 124a and the second oxide conductive layer 124b. The second resist mask 552 includes a thickened pattern corresponding to the data signal line 118a superimposed on that pattern.

As in the case of the first embodiment, in a state where the second resist mask 552 is formed, the third conductive layer 254 and the oxide conductive layer 124 are etched. The data signal lines 118a, 118b and the wiring 164 are formed by this etching.

Figure 45A:
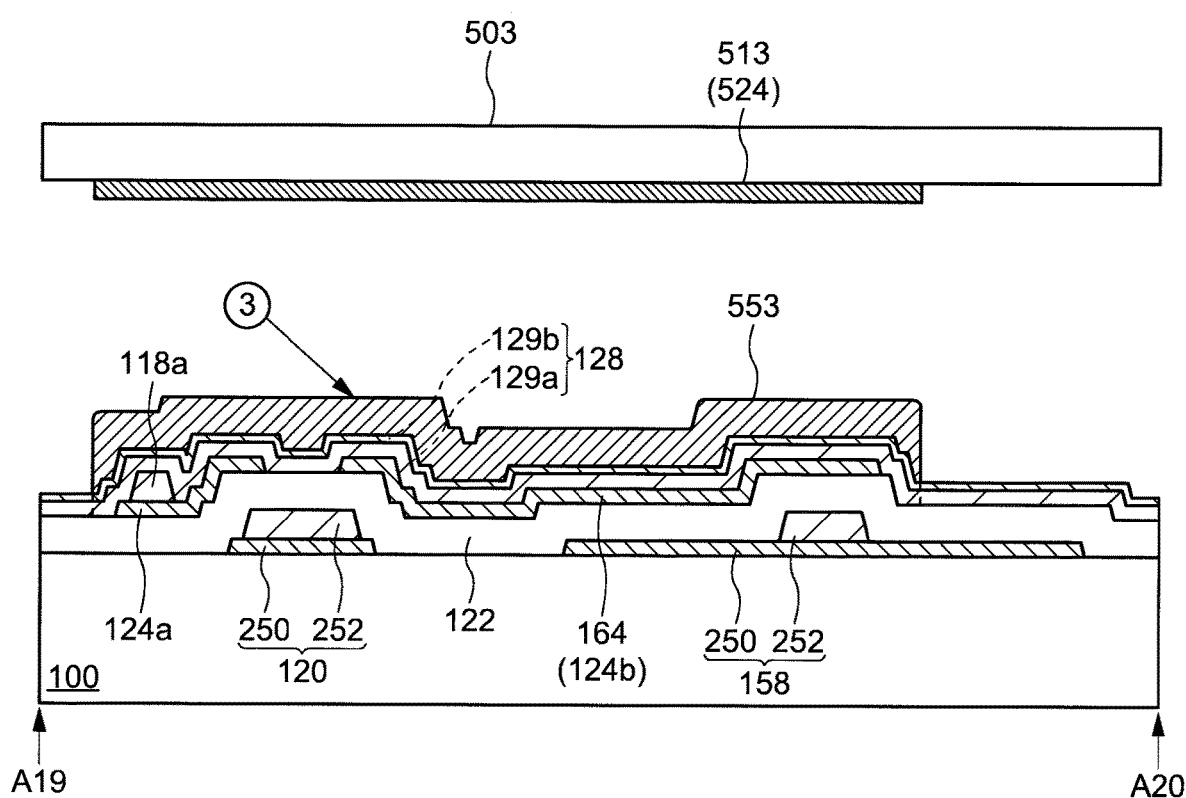
FIG. 45A shows a manufacturing method of a liquid crystal display device according to an embodiment of the present invention, and shows a cross-sectional view corresponding to the line A19-A20 shown in FIG. 39.
Figure 45B:
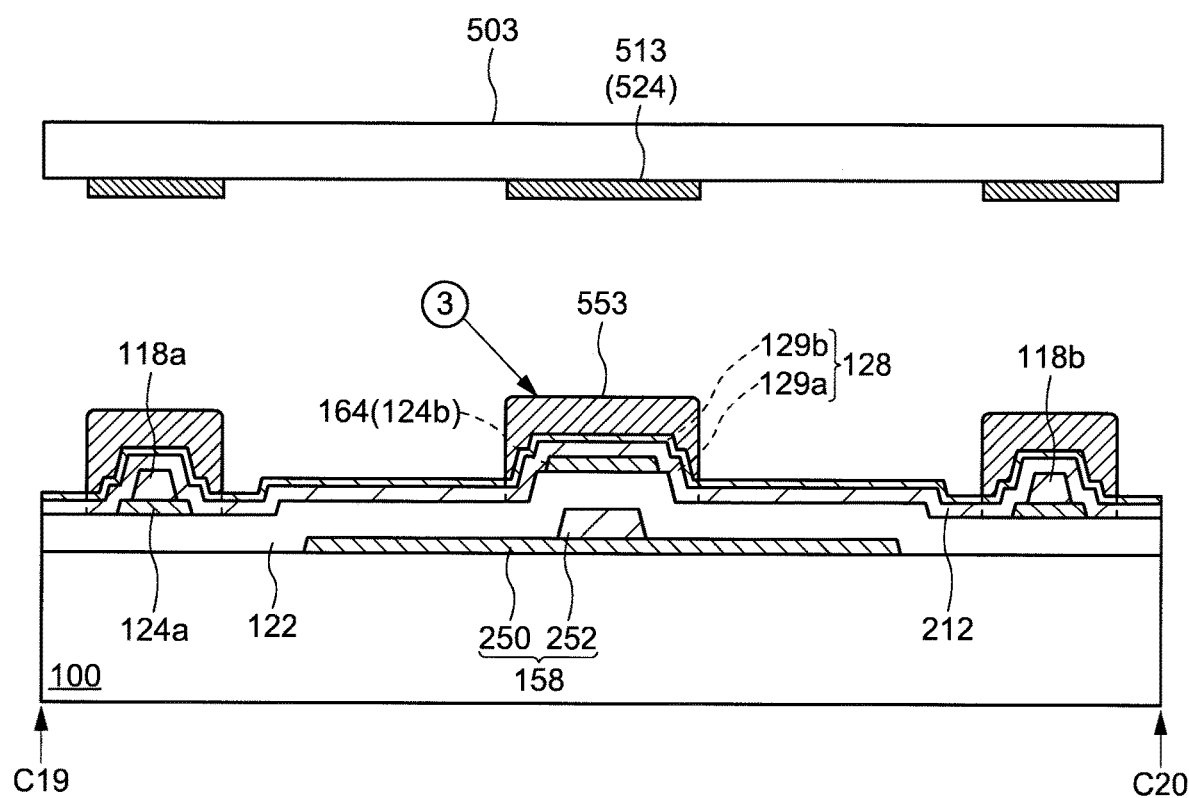
FIG. 45B shows a manufacturing method of a liquid crystal display device according to an embodiment of the present invention, and shows a cross-sectional view corresponding to the line C19-C20 shown in FIG. 39.

FIGS. 45A and 45B show steps in which the oxide semiconductor layer 128 is formed on the upper side of the first oxide conductive layer 124a, the second oxide conductive layer 124b, the data signal lines 118a, 118b, and the wiring 164, and a third resist mask 553 is formed on the oxide semiconductor layer 128. The oxide semiconductor layer 128 is formed in the same manner as in the first embodiment. A third photomask 503 having a third mask pattern 513 is used for forming the third resist mask 553. The circled numeral "3" shown in FIGS. 45A and 45B indicates that the third resist mask 553 is formed of the third photomask 503. Patterns corresponding to the arrangement of the transistor, the pixel electrode, and the data signal line is formed by etching the oxide semiconductor layer 128 using the third resist mask 553.

Figure 46A:
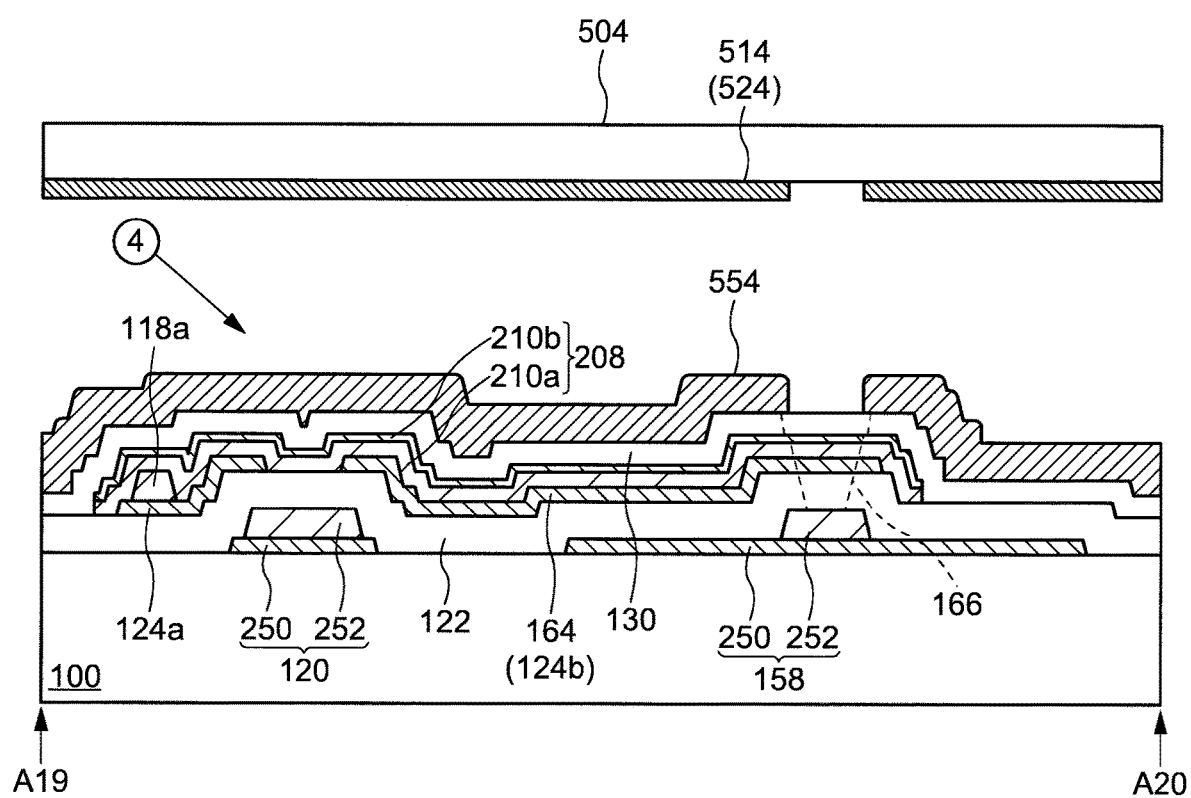
FIG. 46A shows a manufacturing method of a liquid crystal display device according to an embodiment of the present invention, and shows a cross-sectional view corresponding to the line A19-A20 shown in FIG. 39.
Figure 46B:
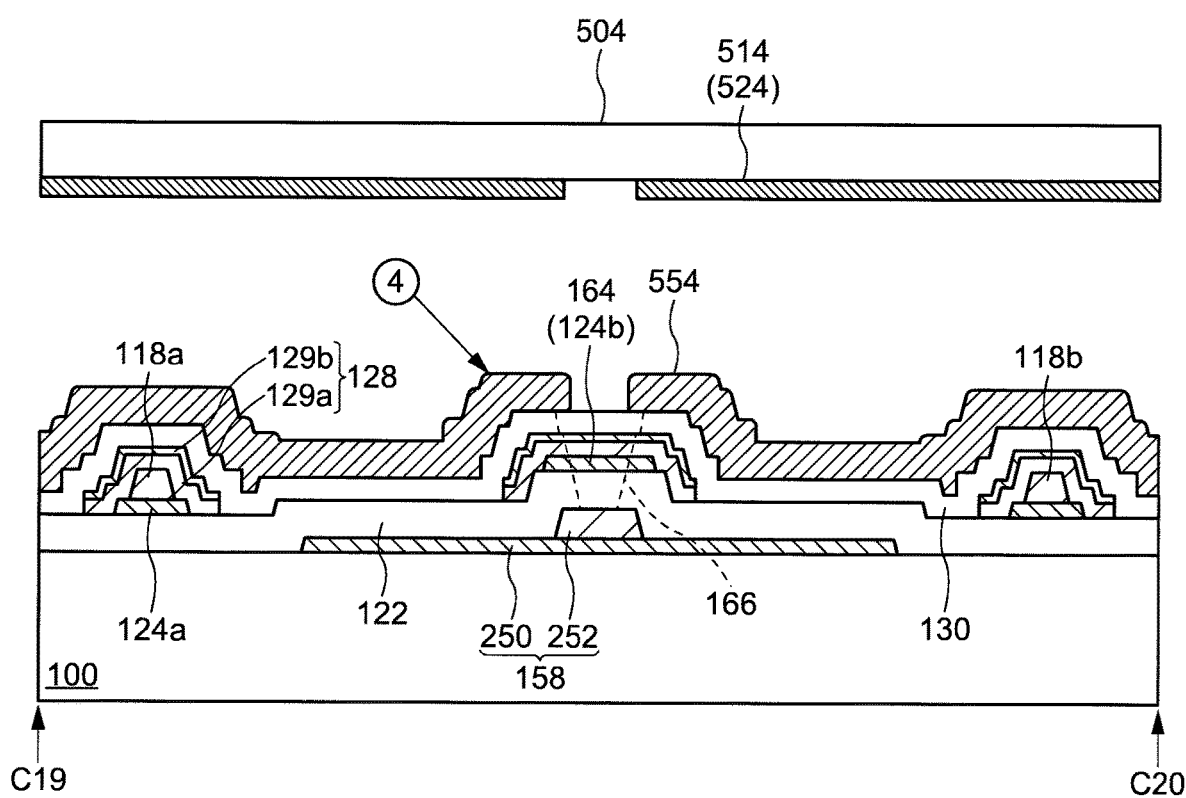
FIG. 46B shows a manufacturing method of a liquid crystal display device according to an embodiment of the present invention, and shows a cross-sectional view corresponding to the line C19-C20 shown in FIG. 39.

FIGS. 46A and 46B show the steps of forming the second insulating layer 130 over the oxide semiconductor layer 128, and forming a fourth resist mask 554 for forming the contact hole.

The second insulating layer 130 is formed in the same manner as in the first embodiment. The fourth resist mask 554 is formed by a fourth photomask 504 on the second insulating layer 130. The fourth photomask 504 is a binary mask. The fourth photomask 504 has a fourth mask pattern 514. The fourth mask pattern 514 includes a pattern for forming a first contact hole (134) which are not shown and a fifth contact hole 166. In this step, a positive photoresist is used. FIGS. 46A and 46B show an example in which the fourth mask pattern 514 is formed by a light shielding portion. The circled numeral "4" shown in FIG. 46A indicates that the fourth resist mask 554 is formed by the fourth photomask 504. The fifth contact hole 166 is formed by etching the second insulating layer 130, the oxide semiconductor layer 128, the second oxide conductive layer 124b, and the first insulating layer 122 using the fourth resist mask 554. The fifth contact hole 166 is preferably formed by tapered etching, and the second oxide conductive layer 124b is preferably exposed on the inner wall surface.

Figure 47A:
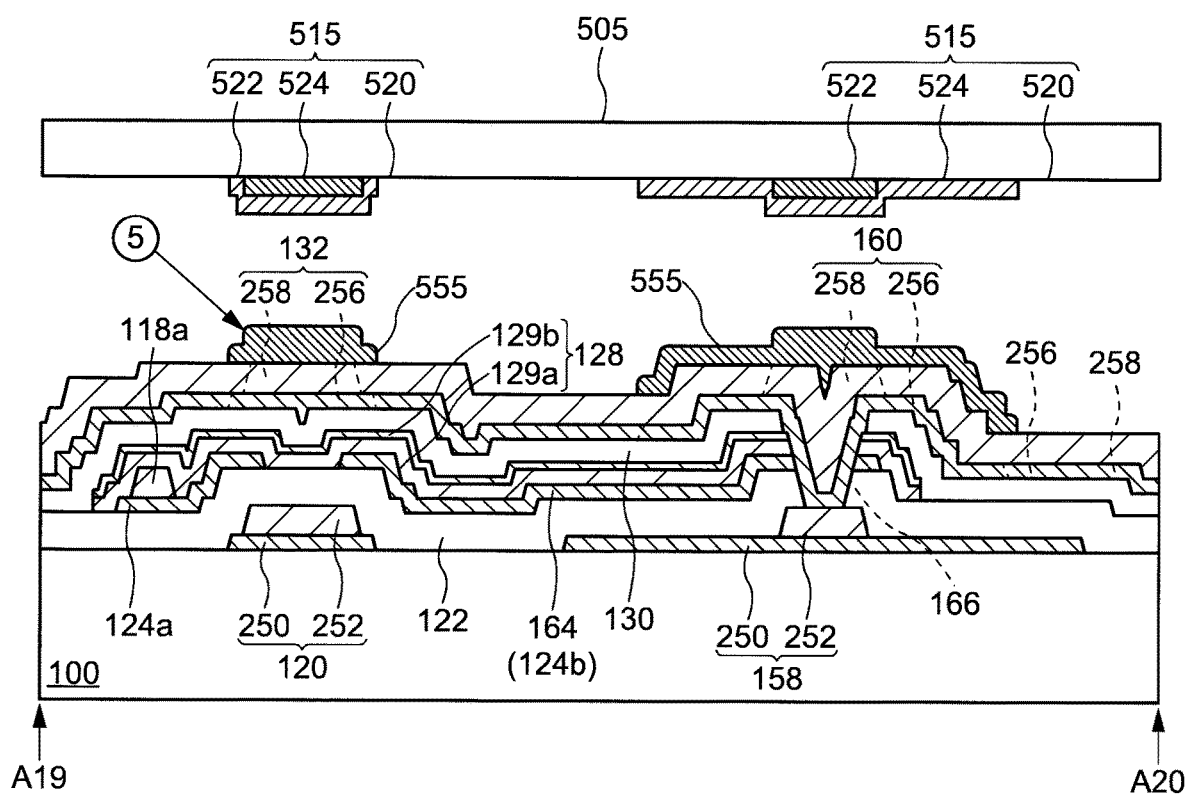
FIG. 47A shows a manufacturing method of a liquid crystal display device according to an embodiment of the present invention, and shows a cross-sectional view corresponding to the line A19-A20 shown in FIG. 39.
Figure 47B:
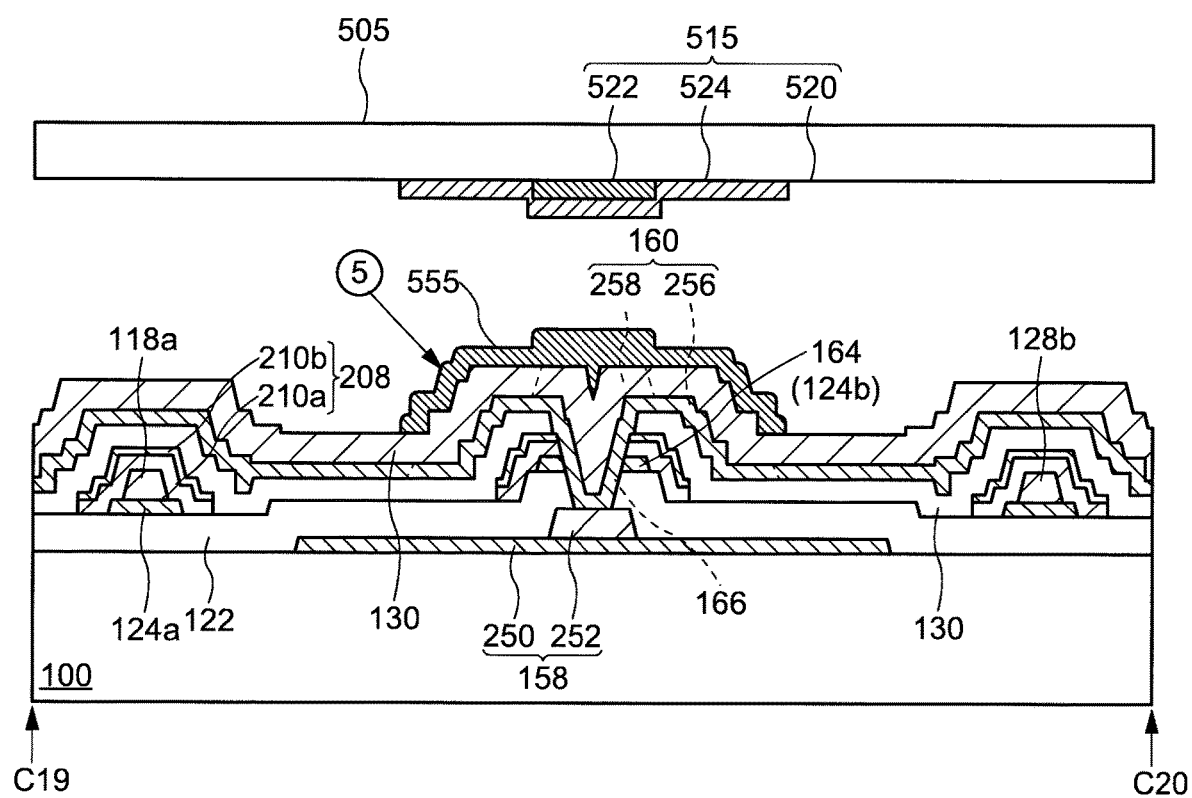
FIG. 47B shows a manufacturing method of a liquid crystal display device according to an embodiment of the present invention, and shows a cross-sectional view corresponding to the line C19-C20 shown in FIG. 39.

FIGS. 47A and 47B show the steps of forming the fourth conductive layer 256 and the fifth conductive layer 258 and forming a fifth resist mask 555 thereon, after forming the fifth contact hole 166.

The fourth conductive layer 256 and the fifth conductive layer 258 are formed in the same manner as in the first embodiment. The fifth resist mask 555 is formed by using a fifth photomask 505. The fifth photomask 505 is a halftone mask. The fifth photomask 505 has a fifth mask pattern 515. The fifth mask pattern 515 includes a light shielding part 524, and a semitransparent part 522 for reducing the amount of transmitted light and transmitting the light, in a transmissive part 520. The fifth photomask 505 forms the fifth resist mask 555 in which a part corresponding to the patterns of the second gate electrode 132 and the second pixel electrode 160 is thickened. The circled numeral "5" shown in FIGS. 47A and 47B indicates that the fifth resist mask 555 is formed by the fifth photomask 505.

As shown in FIGS. 47A and 47B, the fifth resist mask 555 has a shape corresponding to the second gate electrode 132 and the second pixel electrode 160, and a part corresponding to the fifth conductive layer 258 is thickened. The fifth conductive layer 258 and the fourth conductive layer 256 are etched with the fifth resist mask 555 formed, in the same manner as in the first embodiment. The second gate electrode 132 and a second pixel electrode 160 are formed by this etching process. The second pixel electrode 160 is connected to the wiring 164 and the first pixel electrode 158 at the part of the fifth contact hole 166. Although not shown, the second gate electrode 132 is connected to the first gate electrode 120 by a first contact hole (134).

A part where the slits 161 is formed in the fourth conductive layer 256 and a part where the fifth conductive layer 258 overlaps the fifth contact hole 166 can be formed by using the halftone mask in this step.

Through the steps described above, the element substrate 210 of the liquid crystal display device 200b having the structure shown in FIGS. 40A and 40B can be manufactured by five photomasks. The first pixel electrode 158 and the second pixel electrode 160 can be respectively manufactured by one photomask in this manufacturing process, by using a halftone mask, and the number of photomasks can be reduced.

3-3-2. Eleventh Embodiment

This embodiment shows an aspect in which a structure of the pixel is different from that of the tenth embodiment. In the following description, the differences from the tenth embodiment will be mainly described.

Figure 48:
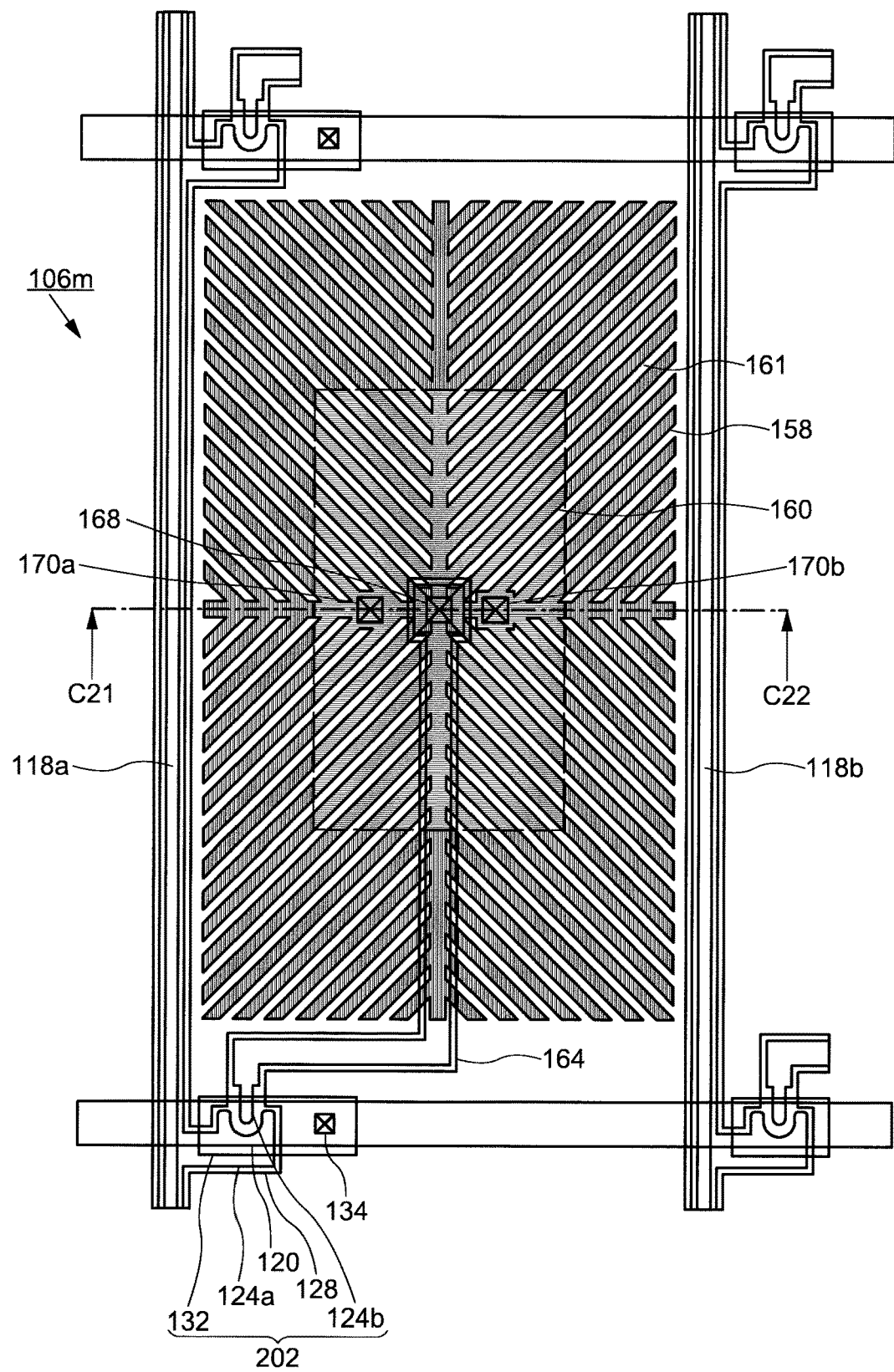
FIG. 48 is a plan view of pixel of a liquid crystal display device according to an embodiment of the present invention.

FIG. 48 is a schematic plan view of a pixel 106m in the liquid crystal display device 200b according to the present embodiment. The cross-sectional structure of FIG. 48 along the line C21-C22 is shown in FIG. 49.

As shown in FIG. 48, the second pixel electrode 160 is electrically connected in the sixth contact hole 168 to the wiring 164 extending from the transistor 202. The first pixel electrode 158 is electrically connected at the seventh contact holes 170a, 170b to the second pixel electrode 160. The sixth contact hole 168 is provided in a substantially central portion of the pixel 106m, whereas the seventh contact holes 170a, 170b are provided in a region outside the sixth contact hole 168. FIG. 48 shows an aspect in which the seventh contact hole 170a, 170b are provided at two places outside the sixth contact hole 168. However, this embodiment is an example, and at least one contact hole for connecting the first pixel electrode 158 and the second pixel electrode 160 may be provided, or two or more contact holes may be provided. For example, the contact holes corresponding to the seventh contact hole may be provided at four positions so as to surround the sixth contact hole 168.

Figure 49:
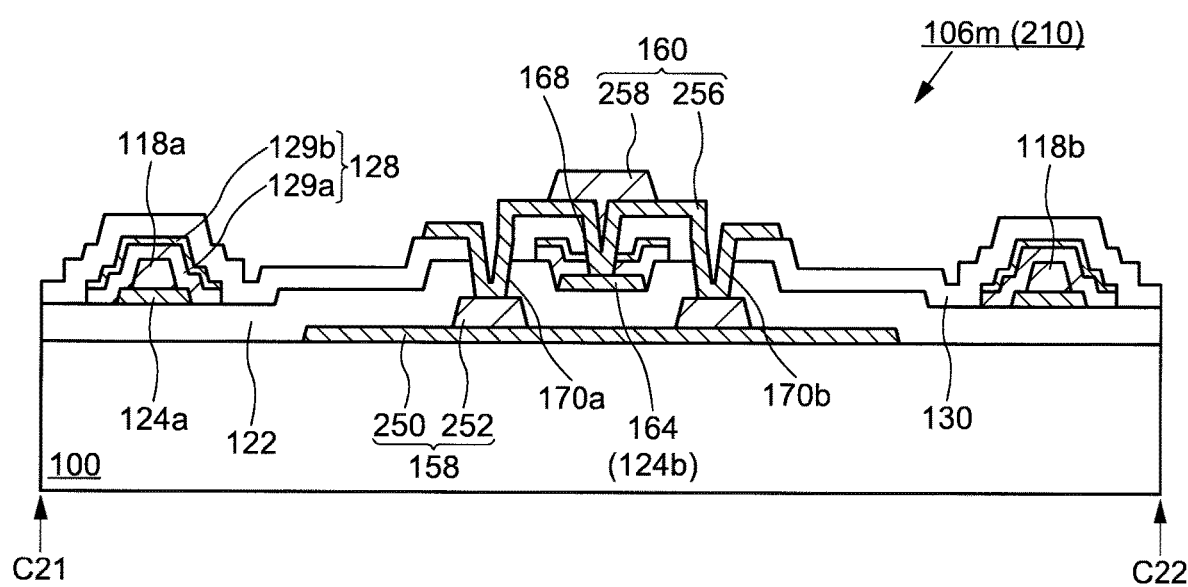
FIG. 49 shows the cross-sectional structure of the pixels corresponding to line C21-C22 shown in FIG. 48.

As shown in FIG. 49, the second pixel electrode 160 is electrically connected to the wiring 164 by the sixth contact hole 168. The second pixel electrode 160 is electrically connected to the first pixel electrode 158 by the seventh contact holes 170a, 170b. The first pixel electrode 158 is provided with a metal layer formed of the second conductive layer 252 in a region overlapping the seventh contact holes 170a, 170b. The metal layer (252) contacts the second pixel electrode 160, and the first pixel electrode 158 and the second pixel electrode 160 are electrically connected. The first pixel electrode 158 is electrically connected via the second pixel electrode 160 to the wiring 164.

According to the connection structure between the pixel electrode and the wiring in the present embodiment, the depth of each contact hole can be made shallow by providing the sixth contact hole 168 and the seventh contact holes 170a, 170b. In the configuration according to the tenth embodiment, the sixth contact hole 168 through the second insulating layer 130, the oxide semiconductor layer 128, the second oxide conductive layer 124b, and the first insulating layer 122. On the other hand, in this embodiment, the sixth contact hole 168 through the second insulating layer 130 and the oxide semiconductor layer 128, and the seventh contact holes 170a, 170b only through the first insulating layer 122 and the second insulating layer 130. Thus, since the contact hole connecting the pixel electrode and the wiring is shallow in the pixel 106m, disconnection in the contact hole can be prevented.

The pixel 106m has the same structure as that of the tenth embodiment except that the form of the contact hole for electrically connecting the first pixel electrode 158 and the second pixel electrode 160 to the wiring is different, and exhibits the same advantageous effect.

3-3-3. Twelfth Embodiment

This embodiment shows a structure of a pixel of the liquid crystal display device 200b of the PSVA mode different from that of the liquid crystal display device of the tenth embodiment. In the following description, the differences from the tenth embodiment will be mainly described.

Figure 50:
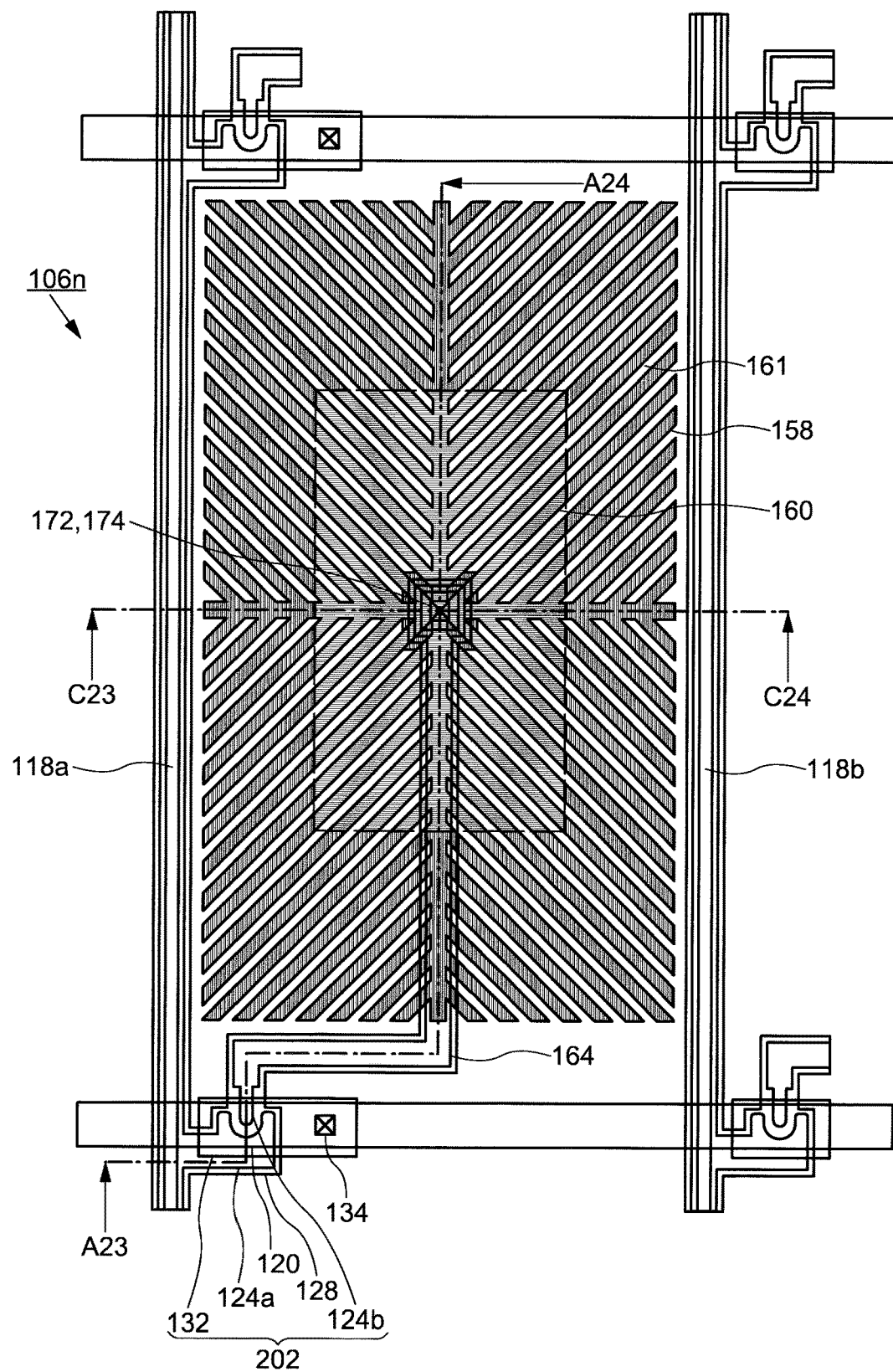
FIG. 50 is a plan view of pixel of a liquid crystal display device according to an embodiment of the present invention.

FIG. 50 is a schematic plan view of the pixel 106n in the liquid crystal display device 200b according to the present embodiment. The cross-sectional structure of FIG. 50 along line A23-A24 is shown in FIG. 51A, and the cross-sectional structure along line C23-C24 is shown in FIG. 51B.

As shown in FIG. 50, the pixel 106n has a structure in which the first pixel electrode 158 and the second pixel electrode 160 are electrically connected to the wiring 164 extending from the transistor 202 through the eighth contact hole 172 and the ninth contact hole 174. The eighth contact hole 172 and the ninth contact hole 174 are provided substantially at the center of the pixel 106n and are superposed.

Figure 51A:
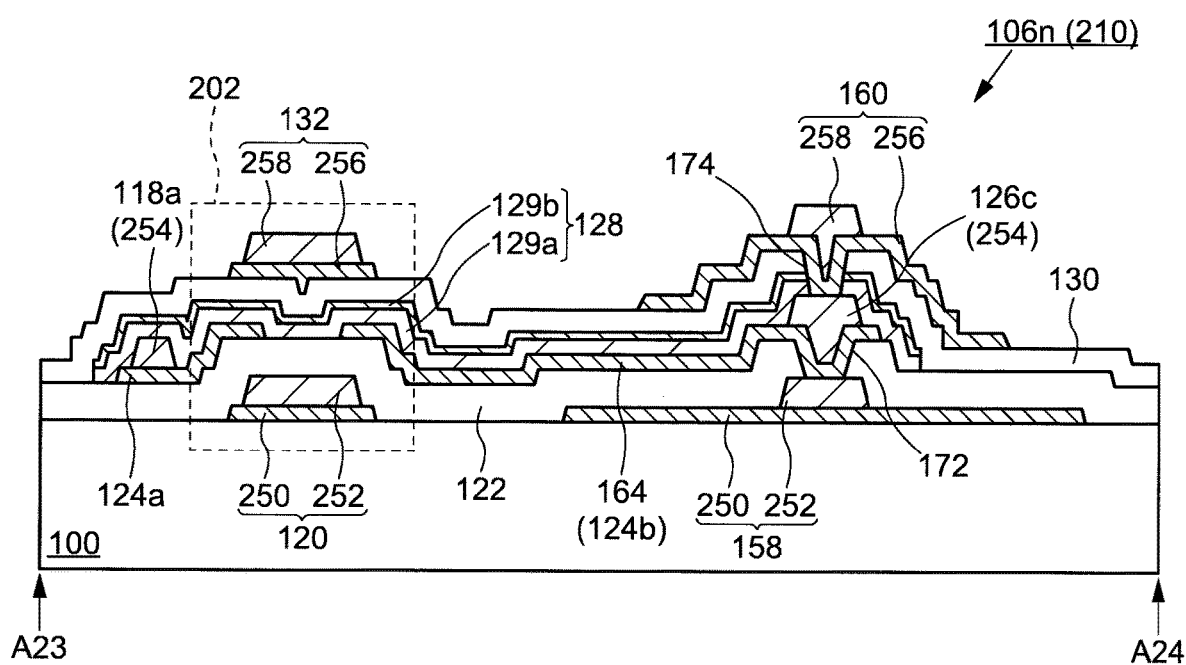
FIG. 51A shows the cross-sectional structure of the pixels corresponding to line A23-A24 shown in FIG. 50.
Figure 51B:
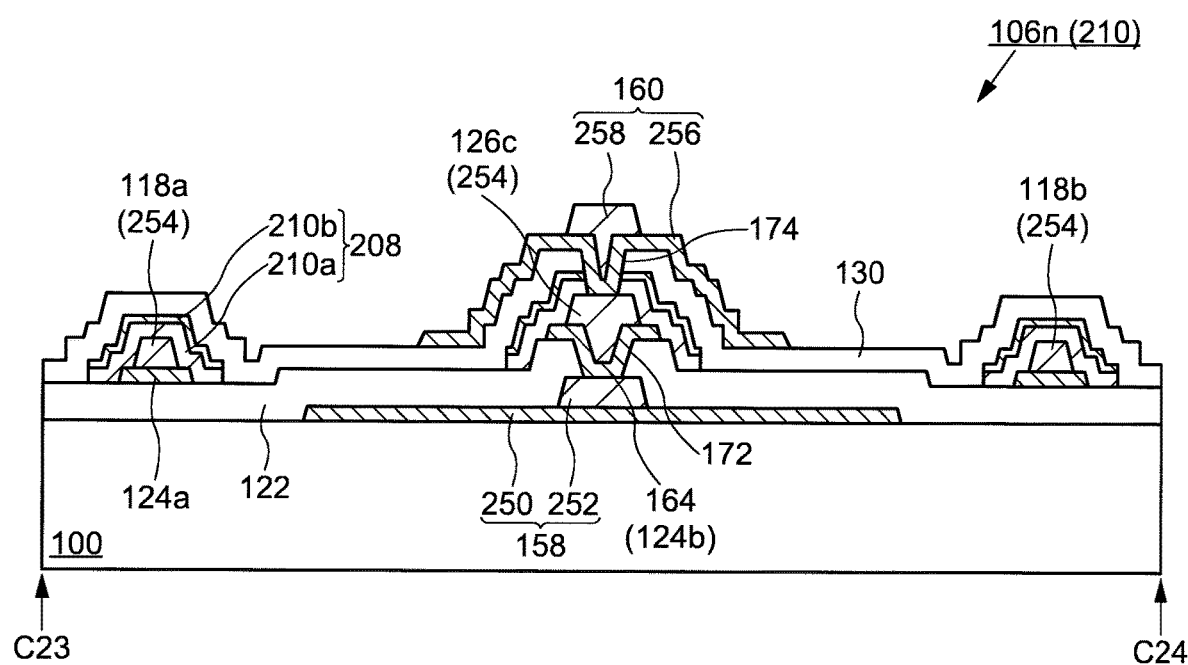
FIG. 51B shows the cross-sectional structure of the pixels corresponding to line C23-C24 shown in FIG. 50.

As shown in FIGS. 51A and 51B, the eighth contact hole 172 is through the first insulating layer 122, and the ninth contact hole 174 is through the second insulating layer 130 and the oxide semiconductor layer 128. The wiring 164 (the second oxide conductive layer 124b) extending from the transistor 202 is provided on the first insulating layer 122. The wiring 164 is electrically connected at the portion of the eighth contact hole 172 to the first pixel electrode 158. A metal layer formed of the second conductive layer 252 is provided on the first pixel electrode 158. The metal layer (252) is provided in a region overlapping the eighth contact hole 172. The wiring 164 (the second oxide conductive layer 124b) is provided in contact with the metal layer (252). A metal layer 126b is provided on the wiring 164 (the second oxide conductive layer 124b). The metal layer 126b is connected to the wiring 164 by the eighth contact hole 172. With this structure, the first pixel electrode 158 and the wiring 164 are electrically connected.

The second pixel electrode 160 is electrically connected to the wiring 164 by the ninth contact hole 174. The ninth contact hole 174 is provided at a position overlapping the wiring 164. The ninth contact hole 174 is preferably provided at a position overlapping the metal layer 126c. Since the metal layer 126c functions as an etching stopper when the ninth contact hole 174 is formed, the depth of the contact hole can be easily controlled. The fourth conductive layer 256 which forming the second pixel electrode 160 and the metal layer 126c is made good electrical connection by the ninth contact hole 174 which exposing the upper surface of the metal layer 126c. In a structure in which the first pixel electrode 158 and the second pixel electrode 160 are connected to the wiring 164, the depth of each contact hole can be made shallow by overlapping two contact holes. These contact holes prevent connection failure between the first pixel electrode 158 and the second pixel electrode 160. Since the portion where the pixel electrode overlaps with the contact hole causes the alignment disorder of the liquid crystal, a light shielding film is provided in the liquid crystal display device. As shown in the present embodiment, the contact holes for connecting the first pixel electrode and second pixel electrodes are provided overlapping, so that the liquid crystal display device 200b can achieve a high aperture ratio.

The pixel 106n has the same configuration as that of the tenth embodiment except that the form of the contact hole for electrically connecting the first pixel electrode 158 and the second pixel electrode 160 to the wiring is different, and exhibits the same advantageous effect.

What is claimed is:

1. A thin film transistor, comprising:
 a first gate electrode;
 a second gate electrode overlapping the first gate electrode;
 an oxide semiconductor layer between the first gate electrode and the second gate electrode;
 a first insulating layer between the first gate electrode and the oxide semiconductor layer;
 a second insulating layer between the oxide semiconductor layer and the second gate electrode; and
 a conductive layer separated from the first gate electrode and the second gate electrode and sandwiched between the first insulating layer and the oxide semiconductor layer,
 wherein the oxide semiconductor layer comprises:
  a channel region overlapping the second gate electrode, and
  at least one low resistance region adjacent to the channel region and in contact with the conductive layer,
 wherein the at least one low resistance region includes an offset region between the channel region and region in contact with the conductive layer,
 wherein the at least one low resistance region is formed self-aligned by irradiating a laser beam or an ion beam from second gate electrode side.

2. The thin film transistor according to claim 1, wherein a width of the offset region is 0.5 µm to 2.0 µm.

3. The thin film transistor according to claim 1, wherein a width of the second gate electrode is wider than a width of the first gate electrode.

4. The thin film transistor according to claim 3, wherein the first gate electrode and the second gate electrode are electrically connected.

5. The thin film transistor according to claim 1, wherein the oxide semiconductor layer covers the top and sides of the conductive layer.

6. The thin film transistor according to claim 1, wherein the conductive layer comprises an oxide conductive layer on the first insulating layer side and a metal layer on the oxide semiconductor layer side.

7. The thin film transistor according to claim 1, wherein the oxide semiconductor layer comprises a first region on the first insulating layer side and a second region on the second insulating layer side,
wherein a crystallinity of the first region and a crystallinity of the second region are different.

8. The thin film transistor according to claim 7, wherein the first region is amorphous, and the second region is crystalline.

9. The thin film transistor according to claim 7, wherein a thickness of the second region is thinner than a thickness of the first region.

10. The thin film transistor according to claim 7, wherein a carrier concentration of the second region is lower than a carrier concentration of the first region, in the channel region.

11. The thin film transistor according to claim 7, wherein a band gap of the second region is wider than a band gap of the first region.

12. The thin film transistor according to claim 11, wherein the band gap of the first region is in a range of 2.8 eV to 3.9 eV, the band gap of the second region is 4.0 eV or higher.

13. The thin film transistor according to claim 12, wherein an energy level of bottom of the conduction band in the second region is higher than an energy level of bottom of the conduction band in the first region.

14. The thin film transistor according to claim 13, wherein the energy level of bottom of the conduction band in the second region is more than 0.3 eV higher than the energy level of bottom of the conduction band in the first region.

15. The thin film transistor according to claim 7, wherein:
the first region is formed of $In_2O_3$-$Ga_2O_3$-$SnO_2$-$ZnO$ based oxide material, $In_2O_3$-$Ga_2O_3$-$SnO_2$ based oxide material, or $In_2O_3$-$Ga_2O_3$-$ZnO$ based oxide material, and
the second region is formed of $Ga_2O_3$ based oxide material, $GaSnO_x$ based oxide material, or $GaSiO_x$ based oxide material.

16. The thin film transistor according to claim 7, wherein the first region is formed of $InGaZnO_x$ or $InGaSnO_x$, and the second region is formed of $Ga_2O_3$.

* * * * *